United States Patent
Kim

(10) Patent No.: US 11,495,286 B2
(45) Date of Patent: Nov. 8, 2022

(54) SEMICONDUCTOR DEVICES

(71) Applicant: SK hynix Inc., Icheon-si (KR)

(72) Inventor: Woongrae Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 24 days.

(21) Appl. No.: 17/353,267

(22) Filed: Jun. 21, 2021

(65) Prior Publication Data

US 2021/0312974 A1    Oct. 7, 2021

Related U.S. Application Data

(63) Continuation-in-part of application No. 16/817,409, filed on Mar. 12, 2020, now Pat. No. 11,133,054, which is a continuation-in-part of application No. 16/049,424, filed on Jul. 30, 2018, now Pat. No. 10,629,248.

(30) Foreign Application Priority Data

Mar. 12, 2018 (KR) .................. 10-2018-0028439

(51) Int. Cl.
G11C 11/4096 (2006.01)
G11C 11/408 (2006.01)
G11C 11/4093 (2006.01)

(52) U.S. Cl.
CPC ........ G11C 11/4096 (2013.01); G11C 11/408 (2013.01); G11C 11/4093 (2013.01)

(58) Field of Classification Search
CPC .............. G11C 11/4096; G11C 11/408; G11C 11/4093; G11C 11/4076; G11C 11/4087; G11C 8/12; G11C 7/1087; G11C 7/1093
See application file for complete search history.

(56) References Cited

U.S. PATENT DOCUMENTS

| 5,953,280 A | 9/1999 | Matsui |
| 2015/0043297 A1 | 2/2015 | Hong |
| 2015/0213859 A1 | 7/2015 | Jang |
| 2015/0310904 A1 | 10/2015 | Kim et al. |
| 2016/0342539 A1 | 11/2016 | Bains |
| 2019/0138245 A1 | 5/2019 | Shin et al. |

FOREIGN PATENT DOCUMENTS

| KR | 1020100030510 A | 3/2010 |
| KR | 1020140002108 A | 1/2014 |
| KR | 1020150007507 A | 1/2015 |
| KR | 1020160144698 A | 12/2016 |
| KR | 101735091 B1 | 5/2017 |
| KR | 1020180022016 A | 3/2018 |

*Primary Examiner* — Jerome Leboeuf

(74) *Attorney, Agent, or Firm* — William Park & Associates Ltd.

(57) ABSTRACT

A semiconductor device includes a read write control circuit configured to generate first and second write command pulses from an external control signal for performing a write operation; a flag generation circuit configured to generate a write flag, a write shifting flag, an internal write flag and an internal write shifting flag based on the second write command pulse, a bank mode signal and a bank group mode signal; and a bank group selection signal generation circuit configured to store a bank address based on an write input control pulse generated from the second write command pulse in a bank mode, and output the stored bank address as a bank group selection signal based on a write output control pulse generated from the write flag.

20 Claims, 50 Drawing Sheets

FIG. 2

| OPERATION | ICLK EDGE | CA<1> | CA<2> | CA<3> | CA<4> |
|---|---|---|---|---|---|
| WRITE | rising | L | H | H | X (A) |
| | falling | IBA<1> | IBA<2> | IBA<3> | IBA<4> |
| READ | rising | H | L | X | X (B) |
| | falling | IBA<1> | IBA<2> | IBA<3> | IBA<4> |

FIG. 11

| LBA<4> | LBA<3> | |
|---|---|---|
| L | L | BG<1> = "H" |
| L | H | BG<2> = "H" |
| H | L | BG<3> = "H" |
| H | H | BG<4> = "H" |

FIG. 18

| OPERATION | ICLK EDGE | CA<1> | CA<2> | CA<3> | CA<4> | IBA<1> | IBA<2> | IBA<3> | IBA<4> | RIBA<1> | RIBA<2> | RIBA<3> | RIBA<4> |
|---|---|---|---|---|---|---|---|---|---|---|---|---|---|
| WRITE | rising | L | H | H | A | | | | | | | | |
| | falling | | | | | H | L | | | | | | |
| READ | rising | | | | | H | L | | B | | | | |
| | falling | | | | | | | | | | | | |

FIG. 25

| RBA<4> | RBA<3> |              |
|--------|--------|--------------|
| L      | L      | RBG<1> = "H" |
| L      | H      | RBG<2> = "H" |
| H      | L      | RBG<3> = "H" |
| H      | H      | RBG<4> = "H" |

FIG. 37

| OPERATION | ICLK EDGE | CA<1> | CA<2> | CA<3> | CA<4> |
|---|---|---|---|---|---|
| WRITE | rising | L | H | H | A |
|  | falling | IBA<1> | IBA<2> | IBA<3> | IBA<4> |
| READ | rising | H | L | B | |
|  | falling | RBG<1> | RBG<2> | RBG<3> | RBG<4> |

SEMICONDUCTOR DEVICES

CROSS-REFERENCE TO RELATED APPLICATIONS

This application is a continuation-in-part of U.S. patent application Ser. No. 16/817,409, filed on Mar. 12, 2020, which is a continuation-in-part of U.S. patent application Ser. No. 16/049,424, which issued Apr. 21, 2020 as U.S. Pat. No. 10,629,248, which claims the priority of Korean Application No. 10-2018-0028439, filed on Mar. 12, 2018, which are incorporated herein by reference in their entirety.

BACKGROUND

1. Technical Field

Embodiments of the present disclosure generally relate to semiconductor devices, and more particularly, to semiconductor devices configured for performing a column operation.

2. Related Art

In general, each of the semiconductor devices such as dynamic random access memory (DRAM) devices may include a plurality of bank groups comprised of cell arrays which are selected by addresses. Each of the bank groups may be realized to include a plurality of banks. The semiconductor devices may perform a column operation that selects any one of the plurality of bank groups and outputs data stored in the cell array included in the selected bank group through input/output (I/O) lines.

SUMMARY

In an embodiment, a semiconductor device may include: a read write control circuit configured to generate first and second write command pulses from an external control signal for performing a write operation; a flag generation circuit configured to generate a write flag, a write shifting flag, an internal write flag and an internal write shifting flag based on the second write command pulse, a bank mode signal and a bank group mode signal; and a bank group selection signal generation circuit configured to store a bank address based on an write input control pulse generated from the second write command pulse in a bank mode, and output the stored bank address as a bank group selection signal based on a write output control pulse generated from the write flag.

In an embodiment, a semiconductor device may include: a column control pulse generation circuit configured to generate a write column control pulse and an internal write column control pulse which are sequentially enabled based on a first write command pulse; a bank group selection signal generation circuit configured to store a bank address based on a write input control pulse generated from a second write command pulse, and output the stored bank address as a bank group selection signal based on a write output control pulse generated from the second write command pulse, a write flag and an internal write flag; and a bank group address generation circuit configured to generate a bank group address and an internal bank group address for performing a column operation on a cell array included in a bank group selected based on the bank group selection signal.

BRIEF DESCRIPTION OF THE DRAWINGS

FIG. 2 is a table illustrating various logic level combinations of an external control signal for generating a command pulse and an address used in the semiconductor device of FIG. 1.

FIG. 11 is a table illustrating an operation of the bank decoder shown in FIG. 10.

FIG. 18 is a table illustrating logic level combinations of an external control signal for generating a command pulse and a bank address in the semiconductor device illustrated in FIG. 16.

FIG. 25 is a table illustrating an operation of the first bank decoder illustrated in FIG. 24.

FIG. 37 is a table showing logic level combinations of external control signals for generating a command pulse and an address in the semiconductor device illustrated in FIG. 36.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Double data rate 5 synchronous dynamic random access memory (DDR5 SDRAM) devices may provide a bank group mode, an 8 bank mode and a 16 bank mode. A bank group may include a plurality of banks. For example, the bank group may include four banks. In the bank group mode, a column operation for one bank included in the bank group may be performed by one command. In the 8 bank mode, column operations for two banks respectively included in separate bank groups are sequentially performed by one command. In the 16 bank mode, column operations for four banks respectively included in separate bank groups are sequentially performed by one command.

Figure 1:
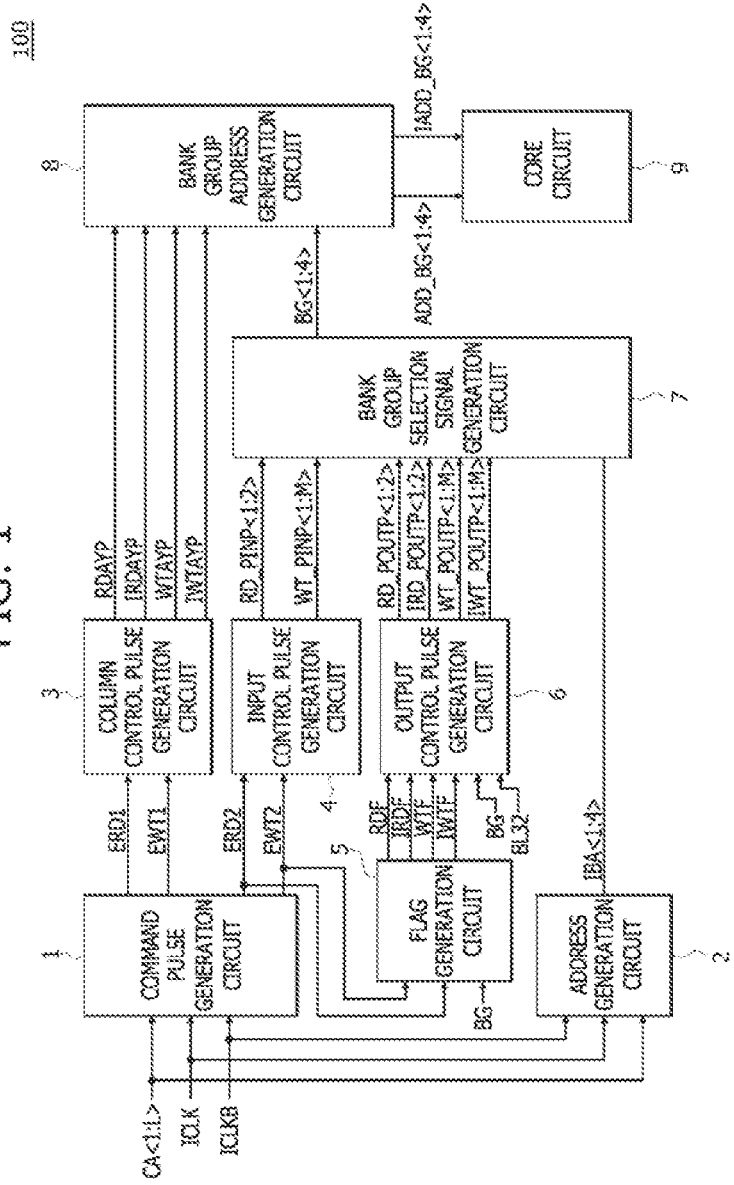
FIG. 1 is a block diagram illustrating a configuration of a semiconductor device according to an embodiment of the present disclosure.

Referring to FIG. 1, a semiconductor device according to an embodiment may include a command pulse generation circuit 1, an address generation circuit 2, a column control pulse generation circuit 3, an input control pulse generation circuit 4, a flag generation circuit 5, an output control pulse generation circuit 6, a bank group selection signal generation circuit 7, a bank group address generation circuit 8 and a core circuit 9.

The command pulse generation circuit 1 may generate a first read command pulse ERD1 (i.e., command pulse), a first write command pulse EWT1 (i.e., command pulse), a second read command pulse ERD2 (i.e., command pulse) and a second write command pulse EWT2 (i.e., command pulse) in response to first to $L^{th}$ external control signals CA<1:L>, an internal clock signal ICLK and an inverted internal clock signal ICLKB. The first to $L^{th}$ external control signals CA<1:L> may include a command and an address that are provided by an external device. The internal clock signal ICLK may be toggled in synchronization with a rising edge of a clock signal (not illustrated) that is provided by the external device or another external device. The inverted internal clock signal ICLKB may be toggled in synchronization with a falling edge of the clock signal (not illustrated). The number 'L' of bits included in the first to $L^{th}$ external control signals CA<1:L> may be set to be different according to the embodiments.

The command pulse generation circuit 1 may decode the first to $L^{th}$ external control signals CA<1:L> in synchronization with the internal clock signal ICLK or the inverted internal clock signal ICLKB to generate the first read command pulse ERD1 and the second read command pulse ERD2 for execution of a read operation. In an embodiment, the command pulse generation circuit 1 may decode the first to $L^{th}$ external control signals CA<1:L> in synchronization with the internal clock signal ICLK to generate the first read command pulse ERD1 and may shift the first read command pulse ERD1 in synchronization with the inverted internal clock signal ICLKB to generate the second read command pulse ERD2, in order to perform the read operation. A point of time that the first read command pulse ERD1 is generated for the read operation may be determined as a point of time that the first to $L^{th}$ external control signals CA<1:L> having a first predetermined logic level combination is input to the command pulse generation circuit 1 in synchronization with a rising edge of the internal clock signal ICLK. The word "predetermined" as used herein with respect to a parameter, such as a predetermined logic level or predetermined period, means that a value for the parameter is determined prior to the parameter being used in a process or algorithm. For some embodiments, the value for the parameter is determined before the process or algorithm to begins. In other embodiments, the value for the parameter is determined during the process or algorithm but before the parameter is used in the process or algorithm.

The command pulse generation circuit 1 may decode the first to $L^{th}$ external control signals CA<1:L> in synchronization with the internal clock signal ICLK or the inverted internal clock signal ICLKB to generate the first write command pulse EWT1 and the second write command pulse EWT2 for execution of a write operation. In an embodiment, the command pulse generation circuit 1 may decode the first to $L^{th}$ external control signals CA<1:L> in synchronization with the internal clock signal ICLK to generate the first write command pulse EWT1 and may shift the first write command pulse EWT1 in synchronization with the inverted internal clock signal ICLKB to generate the second write command pulse EWT2, in order to perform the write operation. A point of time that the first write command pulse EWT1 is generated for the write operation may be determined as a point of time that the first to $L^{th}$ external control signals CA<1:L> having a second predetermined logic level combination is input to the command pulse generation circuit 1 in synchronization with a rising edge of the internal clock signal ICLK.

The address generation circuit 2 may generate first to fourth bank addresses IBA<1:4> in response to the first to $L^{th}$ external control signals CA<1:L>, the internal clock signal ICLK and the inverted internal clock signal ICLKB. The address generation circuit 2 may decode the first to $L^{th}$ external control signals CA<1:L> in synchronization with the internal clock signal ICLK or the inverted internal clock signal ICLKB to generate the first to fourth bank addresses IBA<1:4>. A logic level combination of the first to fourth bank addresses IBA<1:4> may be determined as a logic level combination of some signals among the first to $L^{th}$ external control signals CA<1:L> that is input to the address generation circuit 2 in synchronization with a rising edge of the internal clock signal ICLK or the inverted internal clock signal ICLKB.

The column control pulse generation circuit 3 may generate a read column control pulse RDAYP, an internal read column control pulse IRDAYP, a write column control pulse WTAYP and an internal write column control pulse IWTAYP in response to the first read command pulse ERD1 and the first write command pulse EWT1.

The column control pulse generation circuit 3 may generate the read column control pulse RDAYP and the internal read column control pulse IRDAYP in response to the first read command pulse ERD1. The column control pulse generation circuit 3 may sequentially generate the read column control pulse RDAYP and the internal read column control pulse IRDAYP after a third predetermined period elapses from a point of time that the first read command pulse ERD1 occurs. The column control pulse generation circuit 3 may shift the first read command pulse ERD1 by the third predetermined period to generate the read column control pulse RDAYP. The first predetermined period by which the first read command pulse ERD1 is shifted may be set according to a read latency. The first predetermined period by which the first read command pulse ERD1 is shifted may be set to be different according to the embodiments. The column control pulse generation circuit 3 may shift the read column control pulse RDAYP by a fourth predetermined period to generate the internal read column control pulse IRDAYP. The fourth predetermined period by which the read column control pulse RDAYP is shifted may be a period which is set to perform a column operation according to a burst length. The fourth predetermined period by which the read column control pulse RDAYP is shifted may be set to be different according to the embodiments.

The column control pulse generation circuit 3 may generate the write column control pulse WTAYP and the internal write column control pulse IWTAYP in response to the first write command pulse EWT1. The column control pulse generation circuit 3 may sequentially generate the write column control pulse WTAYP and the internal write column control pulse IWTAYP after a fifth predetermined period elapses from a point of time that the first write command pulse EWT1 occurs. The column control pulse generation circuit 3 may shift the first write command pulse EWT1 by the fifth predetermined period to generate the write column control pulse WTAYP. The fifth predetermined period by which the first write command pulse EWT1 is shifted may be set according to a write latency. The fifth predetermined period by which the first write command pulse EWT1 is shifted may be set to be different according to the embodiments. The column control pulse generation circuit 3 may shift the write column control pulse WTAYP by a sixth predetermined period to generate the internal write column control pulse IWTAYP. The sixth predetermined period by which the write column control pulse WTAYP is shifted may be a period which is set to perform the column operation according to the burst length. The sixth predetermined period by which the write column control pulse WTAYP is shifted may be set to be different according to the embodiments. In some other embodiments, the column control pulse generation circuit 3 may be configured to generate the read column control pulse RDAYP, the internal read column control pulse IRDAYP, the write column control pulse WTAYP and the internal write column control pulse IWTAYP in response to the second read command pulse ERD2 and the second write command pulse EWT2.

The input control pulse generation circuit 4 may generate first and second read input control pulses RD_PINP<1:2> and first to $M^{th}$ write input control pulses WT_PINP<1:M> in response to the second read command pulse ERD2 and the second write command pulse EWT2.

The input control pulse generation circuit 4 may alternately generate the first and second read input control pulses RD_PINP<1:2> whenever the second read command pulse ERD2 occurs. For example, the input control pulse generation circuit 4 may generate the first read input control pulse RD_PINP<1> if the second read command pulse ERD2 occurs first, may generate the second read input control pulse RD_PINP<2> if the second read command pulse ERD2 occurs second, and may generate the first read input control pulse RD_PINP<1> if the second read command pulse ERD2 occurs third.

The input control pulse generation circuit 4 may sequentially and repeatedly generate the first to $M^{th}$ write input control pulses WT_PINP<1:M> whenever the second write command pulse EWT2 occurs. For example, the input control pulse generation circuit 4 may generate the first write input control pulse WT_PINP<1> if the second write command pulse EWT2 occurs first, may generate the second write input control pulse WT_PINP<2> if the second write command pulse EWT2 occurs second, may generate the $M^{th}$ write input control pulse WT_PINP<M> if the second write command pulse EWT2 'occurs 'M'th, and may generate the first write input control pulse WT_PINP<1> again if the second write command pulse EWT2 occurs '(M+1)'th. In some other embodiments, the input control pulse generation circuit 4 may be configured to generate the first and second read input control pulses RD_PINP<1:2> and the first to $M^m$ write input control pulses WT_PINP<1:M> in response to the first read command pulse ERD1 and the first write command pulse EWT1.

The flag generation circuit 5 may generate a read flag RDF (i.e., flag), an internal read flag IRDF (i.e., internal flag), a write flag WTF (i.e., flag) and an internal write flag IWTF (i.e., internal flag) in response to the second read command pulse ERD2 and the second write command pulse EWT2 and a mode signal BG. The mode signal BG may be enabled in the bank group mode.

The flag generation circuit 5 may generate the read flag RDF and the internal read flag IRDF in response to the second read command pulse ERD2 and the mode signal BG. The flag generation circuit 5 may generate the read flag RDF after a seventh predetermined period elapses from a point of time that the second read command pulse ERD2 occurs. The flag generation circuit 5 may shift the second read command pulse ERD2 by the seventh predetermined period to generate the read flag RDF. The seventh predetermined period by which the second read command pulse ERD2 is shifted may be set according to the read latency. The seventh predetermined period by which the second read command pulse ERD2 is shifted may be set to be different according to the embodiments. The flag generation circuit 5 may shift the read flag RDF by an eighth predetermined period to generate the internal read flag IRDF while the mode signal BG is enabled. The eighth predetermined period by which the read flag RDF is shifted may be a period which is set to perform the column operation according to the burst length. The eighth predetermined period by which the read flag RDF is shifted may be set to be different according to the embodiments.

The flag generation circuit 5 may generate the write flag WTF and the internal write flag IWTF in response to the second write command pulse EWT2 and the mode signal BG. The flag generation circuit 5 may generate the write flag WTF after a ninth predetermined period elapses from a point of time that the second write command pulse EWT2 occurs. The flag generation circuit 5 may shift the second write command pulse EWT2 by the ninth predetermined period to generate the write flag WTF. The ninth predetermined period by which the second write command pulse EWT2 is shifted may be set according to the write latency. The ninth predetermined period by which the second write command pulse EWT2 is shifted may be set to be different according to the embodiments. The flag generation circuit 5 may shift the write flag WTF by a tenth predetermined period to generate the internal write flag IWTF while the mode signal BG is enabled. The tenth predetermined period by which the write flag WTF is shifted may be a period which is set to perform the column operation according to the burst length. The tenth predetermined period by which the write flag WTF is shifted may be set to be different according to the embodiments.

The output control pulse generation circuit 6 may generate first and second read output control pulses RD_POUTP<1:2> (i.e., output control pulses), first and second intern& read output control pulses IRD_POUTP<1:2> (i.e., internal output control pulses), first to $M^{th}$ write output control pulses WT_POUTP<1:M> (i.e., output control pulses) and first to $M^{th}$ internal write output control pulses IWT_POUTP<1:M> (i.e., internal output control pulses) in response to the read flag RDF, the internal read flag IRDF, the write flag WTF, the internal write flag IWTF, the mode signal BG and a burst length signal BL32. The burst length signal BL32 may be enabled if the burst length is set to be '32'.

The output control pulse generation circuit 6 may alternately generate the first and second read output control pulses RD_POUTP<1:2> whenever the read flag RDF occurs. For example, the output control pulse generation circuit 6 may generate the first read output control pulse RD_POUTP<1> if the read flag RDF occurs first, may generate the second read output control pulse RD_POUTP<2> if the read flag RDF occurs second, and may generate the first read output control pulse RD_POUTP<1> again if the read flag RDF occurs third.

The output control pulse generation circuit 6 may alternately generate the first and second internal read output control pulses IRD_POUTP<1:2> whenever the read flag RDF or the internal read flag IRDF occurs. For example, the output control pulse generation circuit 6 may generate the first internal read output control pulse IRD_POUTP<1> if the read flag RDF or the internal read flag IRDF occurs first, may generate the second internal read output control pulse IRD_POUTP<2> if the read flag RDF or the internal read flag IRDF occurs second, and may generate the first internal read output control pulse IRD_POUTP<1> again if the read flag RDF or the internal read flag IRDF occurs third. The output control pulse generation circuit 6 may control generation of the first and second internal read output control pulses IRD_POUTP<1:2> according to the burst length in the bank group mode. For example, the output control pulse generation circuit 6 may sequentially generate the first and second internal read output control pulses IRD_POUTP<1:2> according to the internal read flag IRDF if the burst length is set to be '32' in the bank group mode and may terminate the generation of the first and second internal read output control pulses IRD_POUTP<1:2> if the semiconductor device is out of the bank group mode or the burst length is not set to be '32'.

The output control pulse generation circuit 6 may sequentially and repeatedly generate the first to $M^{th}$ write output control pulses WT_POUTP<1:M> whenever the write flag WTF occurs. For example, the output control pulse generation circuit 6 may generate the first write output control pulse WT_POUTP<1> if the write flag WTF occurs first, may generate the second write output control pulse WT_POUTP<2> if the write flag WTF occurs second, may generate the $M^{th}$ write output control pulse WT_POUTP<M> if the write flag WTF occurs 'M'th, and may generate the first write output control pulse WT_POUTP<1> again if the write flag WTF occurs '(M+1)'th.

The output control pulse generation circuit 6 may sequentially and repeatedly generate the first to $M^{th}$ internal write output control pulses IWT_POUTP<1:M> whenever the write flag WTF or the internal write flag IWTF occurs. For example, the output control pulse generation circuit 6 may generate the first internal write output control pulse IWT_POUTP<1> if the write flag WTF or the internal write flag IWTF occurs first, may generate the second internal write output control pulse IWT_POUTP<2> if the write flag WTF or the internal write flag IWTF occurs second, may generate the $M^{th}$ internal write output control pulse IWT_POUTP<M> if the write flag WTF or the internal write flag IWTF occurs 'M'th, and may generate the first internal write output control pulse IWT_POUTP<1> again if the write flag WTF or the internal write flag IWTF occurs '(M+1)'th. The output control pulse generation circuit 6 may control generation of the first to $M^{th}$ internal write output control pulses IWT_POUTP<1:M> according to the burst length in the bank group mode. For example, output control pulse generation circuit 6 may sequentially generate the first and $M^{th}$ internal write output control pulses IWT_POUTP<1:M> according to the internal write flag IWTF if the burst length is set to be '32' in the bank group mode and may to terminate the generation of the first and $M^{th}$ internal write output control pulses IWT_POUTP<1:M> if the semiconductor device is out of the bank group mode or the burst length is not set to be '32'.

The bank group selection signal generation circuit 7 may generate first to fourth bank group selection signals BG<1:4> in response to the first and second read input control pulses RD_PINP<1:2>, the first to $M^{th}$ write input control pulses RD_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the first to fourth bank addresses IBA<1:4>. The bank group selection signal generation circuit 7 may store the first to fourth bank addresses IBA<1:4> in response to the first and second read input control pulses RD_PINP<1:2> during the read operation. The bank group selection signal generation circuit 7 may output the first to fourth bank addresses IBA<1:4> as the first to fourth bank group selection signals BG<1:4> in response to the first and second read output control pulses RD_POUTP<1:2> and the first and second internal read output control pulses IRD_POUTP<1:2>. The bank group selection signal generation circuit 7 may store the first to fourth bank addresses IBA<1:4> in response to the first to $M^{th}$ write input control pulses WT_PINP<1:M> during the write operation. The bank group selection signal generation circuit 7 may output the first to fourth bank addresses IBA<1:4> as the first to fourth bank group selection signals BG<1:4> in response to the first to $M^{th}$ write output control pulses WT_POUTP<1:M> and the first to $M^{th}$ internal write output control pulses IWT_POUTP<1:M>.

The bank group address generation circuit 8 may generate first to fourth bank group addresses ADD_BG<1:4> and first to fourth internal bank group addresses IADD_BG<1:4> in response to the read column control pulse RDAYP, the internal read column control pulse IRDAYP, the write column control pulse WTAYP, the internal write column control pulse IWTAYP and the first to fourth bank group selection signals BG<1:4>. The bank group address generation circuit 8 may generate the first to fourth bank group addresses ADD_BG<1:4> and the first to fourth internal bank group addresses IADD_BG<1:4> having logic level combinations according to a bank group performing the column operation in response to the read column control pulse RDAYP, the internal read column control pulse IRDAYP and the first to fourth bank group selection signals BG<1:4> if the read operation is performed. The bank group address generation circuit 8 may generate the first to fourth bank group addresses ADD_BG<1:4> and the first to fourth internal bank group addresses IADD_BG<1:4> having logic level combinations according to a bank group performing the column operation in response to the write column control pulse WTAYP, the internal write column control pulse IWTAYP and the first to fourth bank group selection signals BG<1:4> if the write operation is performed.

The core circuit 9 may receive the first to fourth bank group addresses ADD_BG<1:4> and the first to fourth internal bank group addresses IADD_BG<1:4> to perform the column operation for each of the bank groups. The core circuit 9 may separately perform the column operations for cell arrays selected by the first to fourth bank group addresses ADD_BG<1:4> and the first to fourth internal bank group addresses IADD_BG<1:4> in one bank group. For example, if the read operation or the write operation is performed while the burst length is set to be '32', the column operation for a cell array included in a bank group selected by the first to fourth bank group selection signals BG<1:4> may be divided into two column operations which are separately performed for sixteen-bit data selected by the first to fourth bank group addresses ADD_BG<1:4> and for sixteen-bit data selected by the first to fourth internal bank group addresses IADD_BG<1:4>. In the burst length, '32' means that 32 data are successively read or written whenever the read operation or the write operation is performed once during the column operation.

Referring to FIG. 2, a command pulse and an address generated according to a logic level combination of first to fourth external control signals CA<1:4> are listed. If the first to fourth external control signals CA<1:4> are set to have a logic level combination of 'A' in synchronization with a rising edge of the internal clock signal ICLK, a command pulse for performing the write operation may be generated. In the first to fourth external control signals CA<1:4>, the logic level combination of 'A' means that a first external control signal CA<1> has a logic "low(L)" level and second and third external control signals CA<2:3> have a logic "high(H)" level. In such a case, a fourth external control signal CA<4> may have a don't care condition. After the command pulse for the write operation is generated, the first to fourth external control signals CA<1:4> input to the semiconductor device in synchronization with a falling edge of the internal clock signal ICLK may be generated as the first to fourth bank addresses IBA<1:4> for the write operation. If the first to fourth external control signals CA<1:4> are set to have a logic level combination of 'B' in synchronization with a rising edge of the internal clock signal ICLK, a command pulse for performing the read operation may be generated. In the first to fourth external control signals CA<1:4>, the logic level combination of 'B' means that the first external control signal CA<1> has a logic "high(H)" level and the second external control signals CA<2> has a logic "low(L)" level. In such a case, the third and fourth external control signals CA<3:4> may have a don't care condition. After the command pulse for the read operation is generated, the first to fourth external control signals CA<1:4> input to the semiconductor device in synchronization with a falling edge of the internal clock signal ICLK may be generated as the first to fourth bank addresses IBA<1:4> for the read operation.

Figure 3:
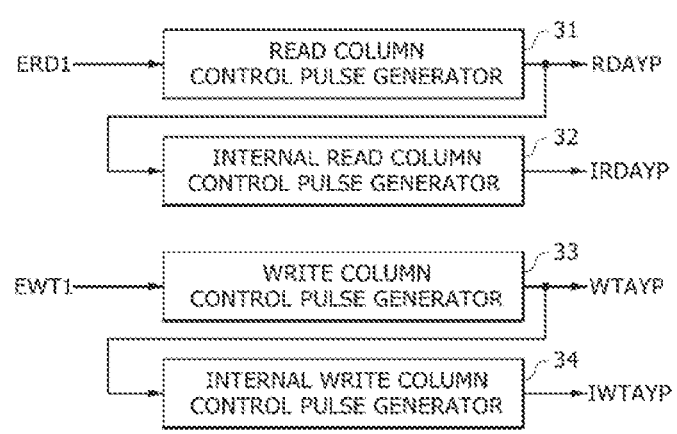
FIG. 3 is a block diagram illustrating a configuration of an example of a column control pulse generation circuit included in the semiconductor device of FIG. 1.

Referring to FIG. 3, the column control pulse generation circuit 3 may include a read column control pulse generator 31, an internal read column control pulse generator 32, a write column control pulse generator 33 and an internal write column control pulse generator 34.

The read column control pulse generator 31 may shift the first read command pulse ERD1 by the third predetermined period to generate the read column control pulse RDAYP (i.e., column control pulse). The read column control pulse generator 31 may be configured to shift the first read command pulse ERD1 by the third predetermined period which is set according to the read latency. The internal read column control pulse generator 32 may shift the read column control pulse RDAYP by the fourth predetermined period to generate the internal read column control pulse IRDAYP (i.e., internal column control pulse). The internal read column control pulse generator 32 may be configured to shift the read column control pulse RDAYP by the fourth predetermined period which is set to perform the column operation according to the burst length during the read operation.

The write column control pulse generator 33 may shift the first write command pulse EWT1 by the fifth predetermined period to generate the write column control pulse WTAYP (i.e., column control pulse). The write column control pulse generator 33 may be configured to shift the first write command pulse EWT1 by the fifth predetermined period which is set according to the write latency. The internal write column control pulse generator 34 may shift the write column control pulse WTAYP by the sixth predetermined period to generate the internal write column control pulse IWTAYP (i.e., internal column control pulse). The internal write column control pulse generator 34 may be configured to shift the write column control pulse WTAYP by the sixth predetermined period which is set to perform the column operation according to the burst length during the write operation. The read column control pulse generator 31, the internal read column control pulse generator 32, the write column control pulse generator 33 and the internal write column control pulse generator 34 may be realized using shift registers or delay circuits according to the embodiments.

Figure 4:
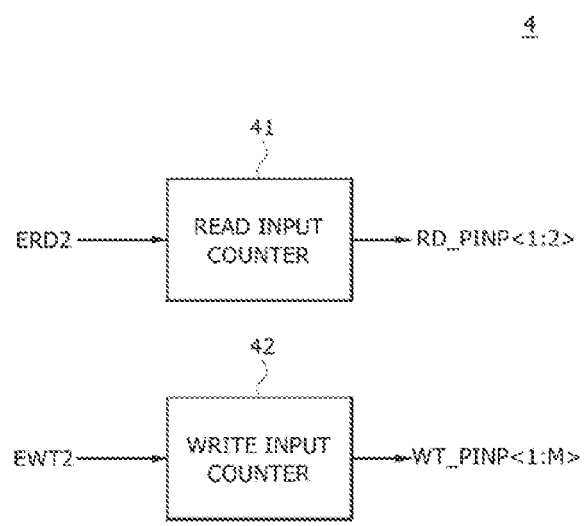
FIG. 4 is a block diagram illustrating a configuration of an example of an input control pulse generation circuit included in the semiconductor device of FIG. 1.

Referring to FIG. 4, the input control pulse generation circuit 4 may include a read input counter 41 and a write input counter 42.

The read input counter 41 may alternately generate the first and second read input control pulses RD_PINP<1:2> whenever the second read command pulse ERD2 occurs. For example, the read input counter 41 may generate the first read input control pulse RD_PINP<1> if the second read command pulse ERD2 occurs first, may generate the second read input control pulse RD_PINP<2> if the second read command pulse ERD2 occurs second, and may generate the first read input control pulse RD_PINP<1> again if the second read command pulse ERD2 occurs third.

The write input counter 42 may alternately and repeatedly generate the first to $M^{th}$ write input control pulses WT_PINP<1:M> whenever the second write command pulse EWT2 occurs. For example, the write input counter 42 may generate the first write input control pulse WT_PINP<1> if the second write command pulse EWT2 occurs first, may generate the second write input control pulse WT_PINP<2> if the second write command pulse EWT2 occurs second, may generate the $M^{th}$ write input control pulse WT_PINP<M> if the second write command pulse EWT2 occurs 'M'th, and may generate the first write input control pulse WT_PINP<1> again if the second write command pulse EWT2 occurs '(M+1)th.

Figure 5:
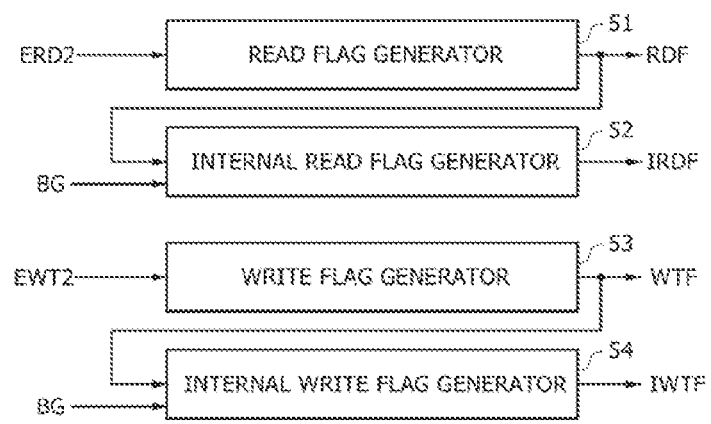
FIG. 5 is a block diagram illustrating a configuration of an example of a flag generation circuit included in the semiconductor device of FIG. 1.

Referring to FIG. 5, the flag generation circuit 5 may include a read flag generator 51, an internal read flag generator 52, a write flag generator 53 and an internal write flag generator 54.

The read flag generator 51 may shift the second read command pulse ERD2 by the seventh predetermined period to generate the read flag RDF. The read flag generator 51 may be configured to shift the second read command pulse ERD2 by the seventh predetermined period which is set according to the read latency. The internal read flag generator 52 may shift the read flag RDF by the eighth predetermined period to generate the internal read flag IRDF if the mode signal BG is enabled in the bank group mode. The internal read flag generator 52 may be configured to shift the read flag RDF by the eighth predetermined period which is set to perform the column operation according to the burst length during the read operation.

The write flag generator 53 may shift the second write command pulse EWT2 by the ninth predetermined period to generate the write flag WTF. The write flag generator 53 may be configured to shift the second write command pulse EWT2 by the ninth predetermined period which is set according to the write latency. The internal write flag generator 54 may shift the write flag WTF by the tenth predetermined period to generate the internal write flag IWTF if the mode signal BG is enabled in the bank group mode. The internal write flag generator 54 may be configured to shift the write flag RDF by the tenth predetermined period which is set to perform the column operation according to the burst length during the write operation. The read flag generator 51, the internal read flag generator 52, the write flag generator 53 and the internal write flag generator 54 may be realized using shift registers or delay circuits according to the embodiments.

Figure 6:
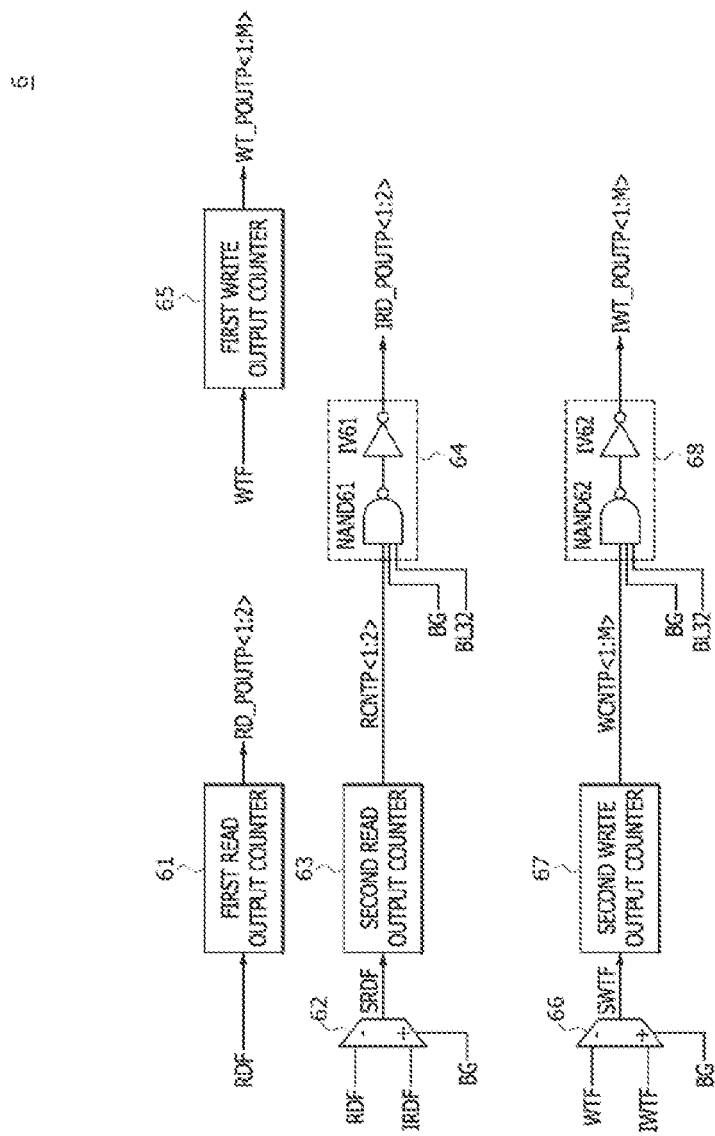
FIG. 6 is a block diagram illustrating a configuration of an example of an output control pulse generation circuit included in the semiconductor device of FIG. 1.

Referring to FIG. 6, the output control pulse generation circuit 6 may include a first read output counter 61, a read selector 62, a second read output counter 63 (i.e., output counter), an internal read output control pulse generation circuit 64, a first write output counter 65, a write selector 66, a second write output counter 67 (i.e., output counter) and an internal write output control pulse generation circuit 68.

The first read output counter 61 may alternately generate the first and second read output control pulses RD_POUTP<1:2> whenever the read flag RDF occurs. For example, the first read output counter 61 may generate the first read output control pulse RD_POUTP<1> if the read flag RDF occurs first, may generate the second read output control pulse RD_POUTP<2> if the read flag RDF occurs second, and may generate the first read output control pulse RD_POUTP<1> again if the read flag RDF occurs third.

The read selector 62 may output the read flag RDF or the internal read flag IRDF as a selection read flag SRDF (i.e. selection flag) in response to the mode signal BG. The read selector 62 may output the read flag RDF as the selection read flag SRDF if the semiconductor device is out of the bank group mode. The read selector 62 may output the internal read flag IRDF as the selection read flag SRDF in the bank group mode. Since the internal read flag IRDF is generated only in the bank group mode, the read selector 62 may output the read flag RDF as the selection read flag SRDF if the semiconductor device is out of the bank group mode. Accordingly, the first and second internal read output control pulses IRD_POUTP<1:2> may be set to be generated by the same number of times as the first and second read output control pulses RD_POUTP<1:2>.

The second read output counter 63 may alternately generate first and second read count pulses RCNTP<1:2> whenever the selection read flag SRDF occurs. For example, the second read output counter 63 may generate the first read count pulse RCNTP<1> if the selection read flag SRDF occurs first, may generate the second read count pulse RCNTP<2> if the selection read flag SRDF occurs second, and may generate the first read count pulse RCNTP<1> again if the selection read flag SRDF occurs third.

The internal read output control pulse generation circuit 64 may perform a NAND operation and an inversion operation. The internal read output control pulse generation circuit 64 may include, for example but not limited to, a NAND gate NAND61 and an inverter IV61. The internal read output control pulse generation circuit 64 (i.e., internal output control pulse generation circuit) may generate the first and second internal read output control pulses IRD_POUTP<1:2> in response to the first and second read count pulses RCNTP<1:2>, the mode signal BG and the burst length signal BL32. The internal read output control pulse generation circuit 64 may buffer the first and second read count pulses RCNTP<1:2> to output the buffered pulses as the first and second internal read output control pulses IRD_POUTP<1:2> if both of the mode signal BG and the burst length signal BL32 are enabled to have a logic "high" level while the burst length is set to be '32' in the bank group mode. The internal read output control pulse generation circuit 64 may terminate the generation of the first and second internal read output control pulses IRD_POUTP<1:2> while the semiconductor device is out of the bank group mode (i.e., the semiconductor device is not operating in the bank group mode) or the burst length is not set to be '32'.

The first write output counter 65 may sequentially and repeatedly generate the first to $M^{th}$ write output control pulses WT_POUTP<1:M> whenever the write flag WTF occurs. For example, the first write output counter 65 may generate the first write output control pulse WT_POUTP<1> if the write flag WTF occurs first, may generate the second write output control pulse WT_POUTP<2> if the write flag WTF occurs second, may generate the $M^{th}$ write output control pulse WT_POUTP<M> if the write flag WTF 'occurs 'M'th, and may generate the first write output control pulse WT_POUTP<1> again if the write flag WTF occurs '(M+1)'th.

The write selector 66 may output the write flag WTF or the internal write flag IWTF as a selection write flag SWTF (i.e., selection flag) in response to the mode signal BG. The write selector 66 may output the write flag WTF as the selection write flag SWTF if the semiconductor device is out of the bank group mode. The write selector 66 may output the internal write flag IWTF as the selection write flag SWTF in the bank group mode (i.e., the semiconductor device is operating in the bank group mode). Since the internal write flag IWTF is generated only in the bank group mode, the write selector 66 may output the write flag WTF as the selection write flag SWTF if the semiconductor device is out of the bank group mode. Accordingly, the first to $M^{th}$ internal write output control pulses IWT_POUTP<1:M> may be set to be generated by the same number of times as the first to $M^{th}$ write output control pulses WT_POUTP<1:M>.

The second write output counter 67 may sequentially and repeatedly generate first to $M^{th}$ write count pulses WCNTP<1:M> whenever the selection write flag SWTF occurs. For example, the second write output counter 67 may generate the first write count pulse WCNTP<1> if the selection write flag SWTF occurs first, may generate the second write count pulse WCNTP<2> if the selection write flag SWTF occurs second, may generate the $M^{th}$ write count pulse WCNTP<M> if the selection write flag SWTF occurs 'M'th, and may generate the first write count pulse WCNTP<1> again if the selection write flag SWTF occurs '(M+1)'th.

The internal write output control pulse generation circuit 68 (i.e., internal output control pulse generation circuit) may perform a NAND operation and an inversion operation. The internal write output control pulse generation circuit 68 may include, for example but not limited to, a NAND gate NAND62 and an inverter IV62. The internal write output control pulse generation circuit 68 may generate the first to $M^{th}$ internal write output control pulses IWT_POUTP<1:M> in response to the first to $M^{th}$ write count pulses WCNTP<1:M>, the mode signal BG and the burst length signal BL32. The internal write output control pulse generation circuit 68 may buffer the first to $M^{th}$ write count pulses WCNTP<1:M> to output the buffered pulses as the first to $M^{th}$ internal write output control pulses IWT_POUTP<1:M> if both of the mode signal BG and the burst length signal BL32 are enabled to have a logic "high" level while the burst length is set to be '32' in the bank group mode. The internal write output control pulse generation circuit 68 may terminate the generation of the first to $M^{th}$ internal write output control pulses IWT_POUTP<1:M> while the semiconductor device is out of the bank group mode or the burst length is not set to be '32'.

Figure 7:
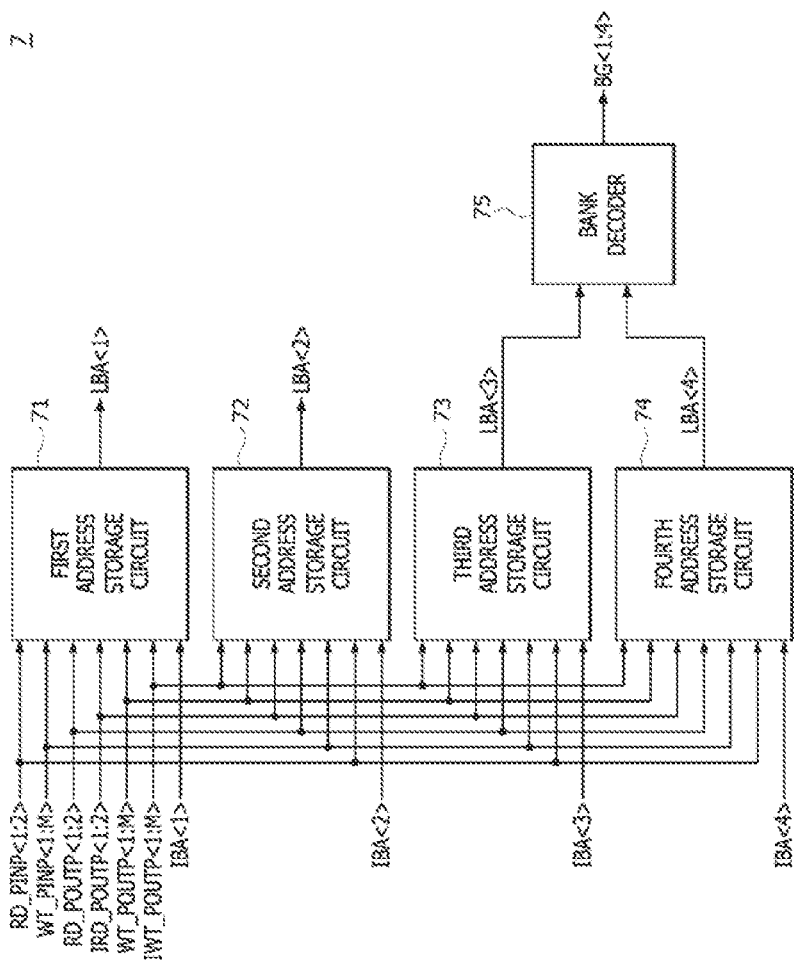
FIG. 7 is a block diagram illustrating a configuration of an example of a bank group selection signal generation circuit included in the semiconductor device of FIG. 1.

Referring to FIG. 7, the bank group selection signal generation circuit 7 may include a first address storage circuit 71, a second address storage circuit 72, a third address storage circuit 73, a fourth address storage circuit 74 and a bank decoder 75. In an embodiment, the second to fourth address storage circuits 72-74 may all have the same configuration as the first address storage circuit 71 except that the input and output signals are respectively different. Thus, for brevity of discussion, the discussion relating to FIG. 8 will only discuss the first address storage circuit 71 for an example on how the other address storage circuits operate.

The first address storage circuit 71 may generate a first latch bank address LBA<1> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the first bank address IBA<1>. The first address storage circuit 71 may store the first bank address IBA<1> input to the first address storage circuit 71 during the read operation in response to the first and second read input control pulses RD_PINP<1:2>. The first address storage circuit 71 may output the first bank address IBA<1> stored therein during the read operation as the first latch bank address LBA<1> in response to the first and second read output control pulses RD_POUTP<1:2> and the first and second internal read output control pulses IRD_POUTP<1:2>. The first address storage circuit 71 may store the first bank address IBA<1> input to the first address storage circuit 71 during the write operation in response to the first to $M^{th}$ write input control pulses WT_PINP<1:M>. The first address storage circuit 71 may output the first bank address IBA<1> stored therein during the write operation as the first latch bank address LBA<1> in response to the first to $M^{th}$ write output control pulses WT_POUTP<1:M> and the first to $M^{th}$ internal write output control pulses IWT_POUTP<1:M>.

The second address storage circuit 72 may generate a second latch bank address LBA<2> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the second bank address IBA<2>. The second address storage circuit 72 may store the second bank address IBA<2> input to the second address storage circuit 72 during the read operation in response to the first and second read input control pulses RD_PINP<1:2>. The second address storage circuit 72 may output the second bank address IBA<2> stored therein during the read operation as the second latch bank address LBA<2> in response to the first and second read output control pulses RD_POUTP<1:2> and the first and second internal read output control pulses IRD_POUTP<1:2>. The second address storage circuit 72 may store the second bank address IBA<2> input to the second address storage circuit 72 during the write operation in response to the first to $M^{th}$ write input control pulses WT_PINP<1:M>. The second address storage circuit 72 may output the second bank address IBA<2> stored therein during the write operation as the second latch bank address LBA<2> in response to the first to $M^{th}$ write output control pulses WT_POUTP<1:M> and the first to $M^{th}$ internal write output control pulses IWT_POUTP<1:M>.

The third address storage circuit 73 may generate a third latch bank address LBA<3> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the third bank address IBA<3>. The third address storage circuit 73 may store the third bank address IBA<3> input to the third address storage circuit 73 during the read operation in response to the first and second read input control pulses RD_PINP<1:2>. The third address storage circuit 73 may output the third bank address IBA<3> stored therein during the read operation as the third latch bank address LBA<3> in response to the first and second read output control pulses RD_POUTP<1:2> and the first and second internal read output control pulses IRD_POUTP<1:2>. The third address storage circuit 73 may store the third bank address IBA<3> input to the third address storage circuit 73 during the write operation in response to the first to $M^{th}$ write input control pulses WT_PINP<1:M>. The third address storage circuit 73 may output the third bank address IBA<3> stored therein during the write operation as the third latch bank address LBA<3> in response to the first to $M^{th}$ write output control pulses WT_POUTP<1:M> and the first to $M^{th}$ internal write output control pulses IWT_POUTP<1:M>.

The fourth address storage circuit 74 may generate a fourth latch bank address LBA<4> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the fourth bank address IBA<4>. The fourth address storage circuit 74 may store the fourth bank address IBA<4> input to the fourth address storage circuit 74 during the read operation in response to the first and second read input control pulses RD_PINP<1:2>. The fourth address storage circuit 74 may output the fourth bank address IBA<4> stored therein during the read operation as the fourth latch bank address LBA<4> in response to the first and second read output control pulses RD_POUTP<1:2> and the first and second internal read output control pulses IRD_POUTP<1:2>. The fourth address storage circuit 74 may store the fourth bank address IBA<4> input to the fourth address storage circuit 74 during the write operation in response to the first to $M^{th}$ write input control pulses WT_PINP<1:M>. The fourth address storage circuit 74 may output the fourth bank address IBA<4> stored therein during the write operation as the fourth latch bank address LBA<4> in response to the first to $M^{th}$ write output control pulses WT_POUTP<1:M> and the first to $M^{th}$ internal write output control pulses IWT_POUTP<1:M>.

The bank decoder 75 may generate the first to fourth bank group selection signals BG<1:4> in response to the third latch bank address LBA<3> and the fourth latch bank address LBA<4>. The bank decoder 75 may decode the third latch bank address LBA<3> and the fourth latch bank address LBA<4> to generate the first to fourth bank group selection signals BG<1:4>. The bank decoder 75 may generate the first to fourth bank group selection signals BG<1:4> having a certain logic level combination according to a logic level combination of the third latch bank address LBA<3> and the fourth latch bank address LBA<4>.

Figure 8:
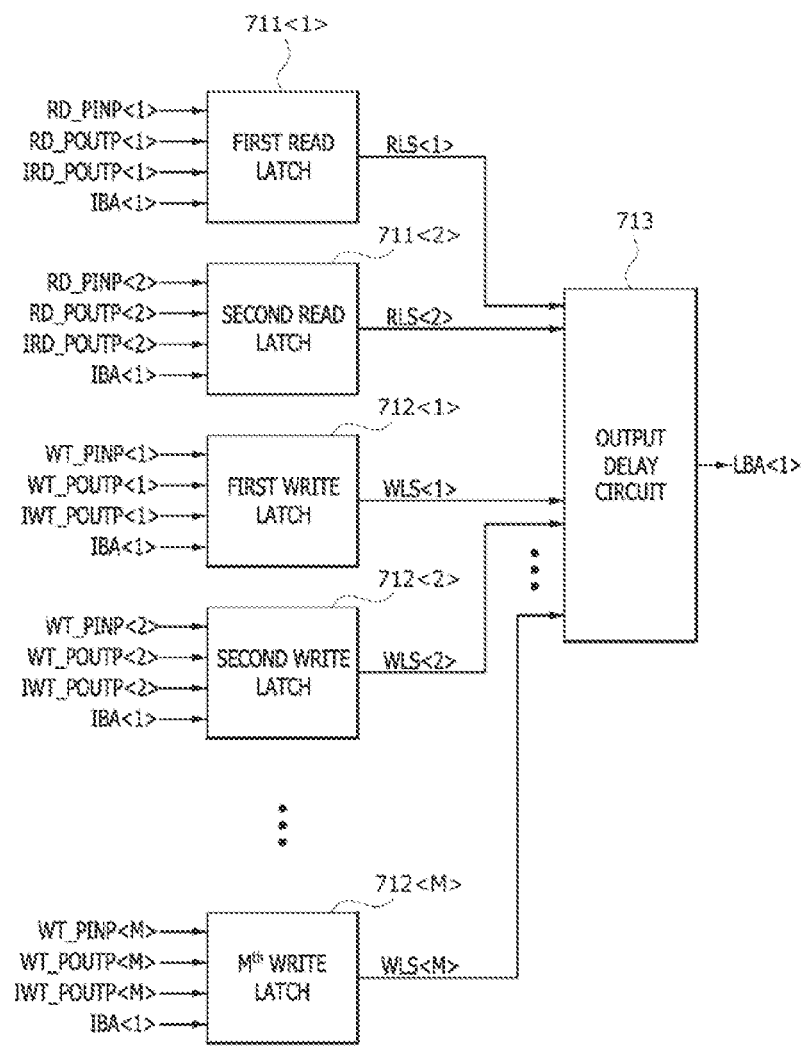
FIG. 8 is a block diagram illustrating a configuration of an example of a first address storage circuit included in the bank group selection signal generation circuit of FIG. 7.

Referring to FIG. 8, the first address storage circuit 71 may include a first read latch 711<1>, a second read latch 711<2>, first to $M^{th}$ write latches 712<1:M> and an output delay circuit 713. In an embodiment, the second read latch 711<2> and first to $M^{th}$ write latches 712<1:M> may all have the same configuration as the first read latch 711<1> except that the input and output signals are respectively different. Thus, for brevity of discussion, the discussion relating to FIG. 9 will only discuss the first read latch 711<1> for an example on how the other read and write latches operate.

The first read latch 711<1> may generate a first read latch signal RLS<1> in response to the first read input control pulse RD_PINP<1>, the first read output control pulse RD_POUTP<1>, the first internal read output control pulse IRD_POUTP<1> and the first bank address IBA<1>. The first read latch 711<1> may latch and store the first bank address IBA<1> if the first read input control pulse RD_PINP<1> occurs. The first read latch 711<1> may output the first bank address IBA<1> stored therein as the first read latch signal RLS<1> if the first read output control pulse RD_POUTP<1> or the first internal read output control pulse IRD_POUTP<1> occurs.

The second read latch 711<2> may generate a second read latch signal RLS<2> in response to the second read input control pulse RD_PINP<2>, the second read output control pulse RD_POUTP<2>, the second internal read output control pulse IRD_POUTP<2> and the first bank address IBA<1>. The second read latch 711<2> may latch and store the first bank address IBA<1> if the second read input control pulse RD_PINP<2> occurs. The second read latch 711<2> may output the first bank address IBA<1> stored therein as the second read latch signal RLS<2> if the second read output control pulse RD_POUTP<2> or the second internal read output control pulse IRD_POUTP<2> occurs.

The first write latch 712<1> may generate a first write latch signal WLS<1> in response to the first write input control pulse WT_PINP<1>, the first write output control pulse WT_POUTP<1>, the first internal write output control pulses IWT_POUTP<1> and the first bank address IBA<1>. The first write latch 712<1> may latch and store the first bank address IBA<1> if the first write input control pulse WT_PINP<1> occurs. The first write latch 712<1> may output the first bank address IBA<1> stored therein as the first write latch signal WLS<1> if the first write output control pulse WT_POUTP<1> or the first internal write output control pulses IWT_POUTP<1> occurs.

The second write latch 712<2> may generate a second write latch signal WLS<2> in response to the second write input control pulse WT_PINP<2>, the second write output control pulse WT_POUTP<2>, the second internal write output control pulses IWT_POUTP<2> and the first bank address IBA<1>. The second write latch 712<2> may latch and store the first bank address IBA<1> if the second write input control pulse WT_PINP<2> occurs. The second write latch 712<2> may output the first bank address IBA<1> stored therein as the second write latch signal WLS<2> if the second write output control pulse WT_POUTP<2> or the second internal write output control pulses IWT_POUTP<2> occurs.

The $M^{th}$ write latch 712<M> may generate an $M^{th}$ write latch signal WLS<M> in response to the $M^{th}$ write input control pulse WT_PINP<M>, the $M^{th}$ write output control pulse WT_POUTP<M>, the $M^{th}$ internal write output control pulses IWT_POUTP<M> and the first bank address IBA<1>. The $M^{th}$ write latch 712<M> may latch and store the first bank address IBA<1> if the $M^{th}$ write input control pulse WT_PINP<M> occurs. The $M^{th}$ write latch 712<M> may output the first bank address IBA<1> stored therein as the $M^{th}$ write latch signal WLS<M> if the $M^{th}$ write output control pulse WT_POUTP<M> or the $M^{th}$ internal write output control pulses IWT_POUTP<M> occurs.

The output delay circuit 713 may generate the first latch bank address LBA<1> in response to the first and second read latch signals RLS<1:2> and the first to $M^{th}$ write latch signals WLS<1:M>. The output delay circuit 713 may delay any one of the first and second read latch signals RLS<1:2> and the first to $M^{th}$ write latch signals WLS<1:M> by a predetermined period to generate the first latch bank address LBA<1>. The output delay circuit 713 may delay the first read latch signal RLS<1>, which is generated by occurrence of the first read output control pulse RD_POUTP<1> or the first internal read output control pulse IRD_POUTP<1>, by the predetermined period to generate the first latch bank address LBA<1>. The output delay circuit 713 may delay the second read latch signal RLS<2>, which is generated by occurrence of the second read output control pulse RD_POUTP<2> or the second internal read output control pulse IRD_POUTP<2>, by the predetermined period to generate the first latch bank address LBA<1>. The output delay circuit 713 may delay the first write latch signal WLS<1>, which is generated by occurrence of the first write output control pulse WT_POUTP<1> or the first internal write output control pulse IWT_POUTP<1>, by the predetermined period to generate the first latch bank address LBA<1>. The output delay circuit 713 may delay the second write latch signal WLS<2>, which is generated by occurrence of the second write output control pulse WT_POUTP<2> or the second internal write output control pulse IWT_POUTP<2>, by the predetermined period to generate the first latch bank address LBA<1>. The output delay circuit 713 may delay the $M^{th}$ write latch signal WLS<M>, which is generated by occurrence of the $M^{th}$ write output control pulse WT_POUTP M> or the $M^{th}$ internal write output control pulse IWT_POUTP<M>, by the predetermined period to generate the first latch bank address LBA-<1>.

Figure 9:
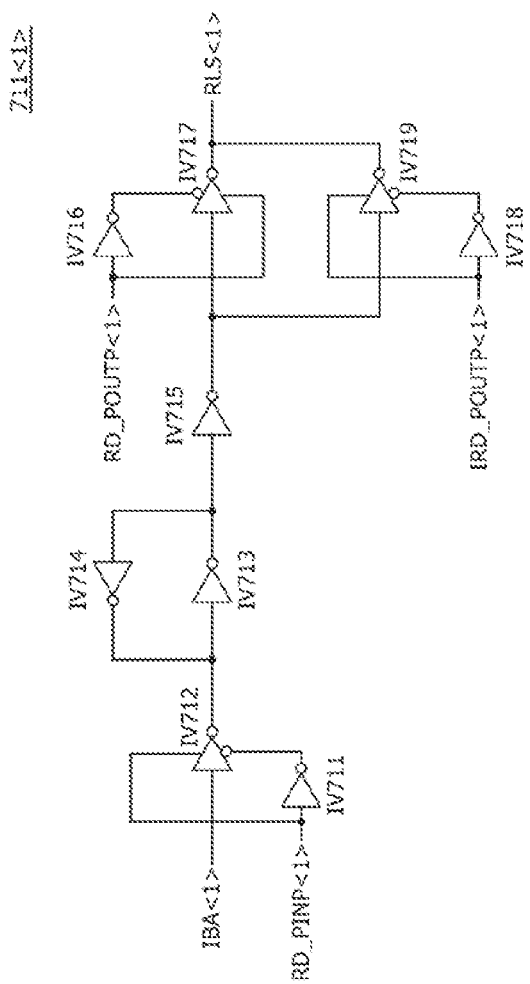
FIG. 9 is a circuit diagram illustrating a configuration of an example of a first read latch included in the first address storage circuit of FIG. 8.

Referring to FIG. 9, the first read latch 711<1> may include inverters IV711, IV712, IV713, IV714, IV715, IV716, IV717, IV718 and IV719. The inverter IV711 may inversely buffer the first read input control pulse RD_PINP<1> and may output the inversely buffered pulse. The inverter IV712 may inversely buffer the first bank address IBA<1> to output the inversely buffered address if the first read input control pulse RD_PINP<1> has a logic "high" level. The inverters IV713 and IV714 may latch and inversely buffer an output signal of the inverter IV712 to output the inversely buffered signal. The inverter IV715 may inversely buffer an output signal of the inverter IV713 to output the inversely buffered signal. The inverter IV716 may inversely buffer the first read output control pulse RD_POUTP<1> to output the inversely buffered signal of the first read output control pulse RD_POUTP<1>. The inverter IV717 may inversely buffer an output signal of the inverter IV715 to output the inversely buffered signal as the first read latch signal RLS<1> if the first read output control pulse RD_POUTP<1> has a logic "high" level. The inverter IV718 may inversely buffer the first internal read output control pulse IRD_POUTP<1> to output the inversely buffered signal of the first internal read output control pulse IRD_POUTP<1>. The inverter IV719 may inversely buffer an output signal of the inverter IV715 to output the inversely buffered signal as the first read latch signal RLS<1> if the first internal read output control pulse IRD_POUTP<1> has a logic "high" level. The first read latch 711<1> may output the first bank address IBA<1> stored therein as the first read latch signal RLS<1> if the first read output control pulse RD_POUTP<1> or the first internal read output control pulse IRD_POUTP<1> occurs.

Figure 10:
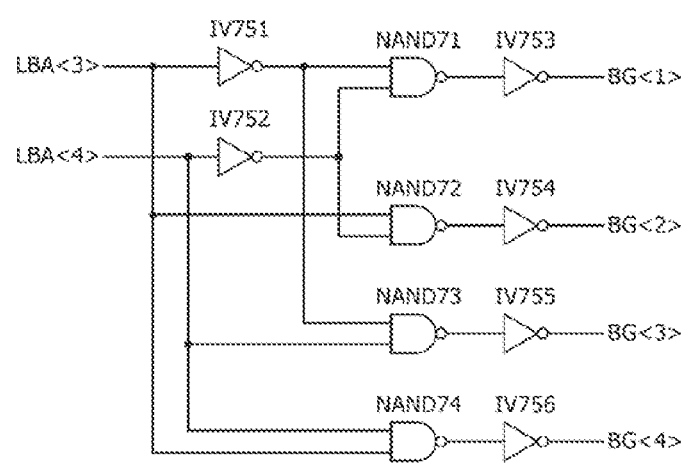
FIG. 10 is a circuit diagram illustrating a configuration of an example of a bank decoder included in the bank group selection signal generation circuit of FIG. 7.

Referring to FIG. 10, the bank decoder 75 may include inverters IV751, IV752, IV753, IV754, IV755 and IV756 and NAND gates NAND71, NAND72, NAND73 and NAND74. The inverter IV751 may inversely buffer the third latch bank address LBA<3> to output the inversely buffered address. The inverter IV752 may inversely buffer the fourth latch bank address LBA<4> to output the inversely buffered address. The NAND gate NAND71 and the inverter IV753 may perform a logical AND operation of an output signal of the inverter IV751 and an output signal of the inverter IV752 to generate the first bank group selection signal BG<1>. The NAND gate NAND72 and the inverter IV754 may perform a logical AND operation of the third latch bank address LBA<3> and an output signal of the inverter IV752 to generate the second bank group selection signal BG<2>. The NAND gate NAND73 and the inverter IV755 may perform a logical AND operation of the fourth latch bank address LBA<4> and an output signal of the inverter IV751 to generate the third bank group selection signal BG<3>. The NAND gate NAND74 and the inverter IV756 may perform a logical AND operation of the third latch bank address LBA<3> and the fourth latch bank address LBA<4> to generate the fourth bank group selection signal BG<4>.

Figure 11:
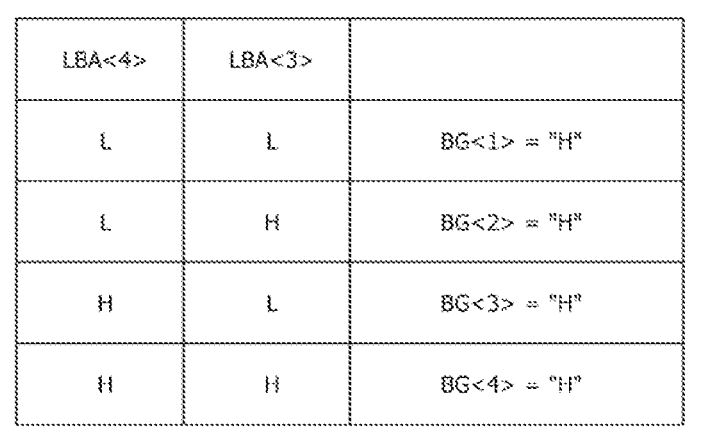

Referring to FIG. 11, the bank group selection signals BG<1:4> enabled according to logic level combinations of the third and fourth latch bank addresses LBA<3:4> are listed. If the third latch bank address LBA<3> has a logic "low" level and the fourth latch bank address LBA<4> has a logic "low" level, the first bank group selection signal BG<1> may be enabled to have a logic "high" level to select a first bank group. If the third latch bank address LBA<3> has a logic "high" level and the fourth latch bank address LBA<4> has a logic "low" level, the second bank group selection signal BG<2> may be enabled to have a logic "high" level to select a second bank group. If the third latch bank address LBA<3> has a logic "low" level and the fourth latch bank address LBA<4> has a logic "high" level, the third bank group selection signal BG<3> may be enabled to have a logic "high" level to select a third bank group. If the third latch bank address LBA<3> has a logic "high" level and the fourth latch bank address LBA<4> has a logic "high" level, the fourth bank group selection signal BG<4> may be enabled to have a logic "high" level to select a fourth bank group.

Figure 12:
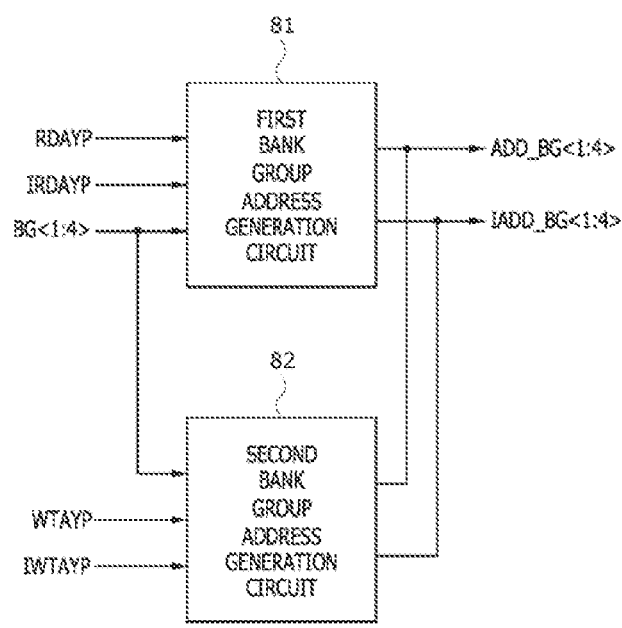
FIG. 12 is a block diagram illustrating a configuration of an example of a bank group address generation circuit included in the semiconductor device of FIG. 1.

Referring to FIG. 12, the bank group address generation circuit 8 may include a first bank group address generation circuit 81 and a second bank group address generation circuit 82.

The first bank group address generation circuit 81 may generate the first to fourth bank group addresses ADD_BG<1:4> and the first to fourth internal bank group addresses IADD_BG<1:4> in response to the read column control pulse RDAYP, the internal read column control pulse IRDAYP and the first to fourth bank group selection signals BG<1:4>. The first bank group address generation circuit 81 may generate the first to fourth bank group addresses ADD_BG<1:4> from the first to fourth bank group selection signals BG<1:4> in response to the read column control pulse RDAYP. The first bank group address generation circuit 81 may buffer the first to fourth bank group selection signals BG<1:4> to generate the first to fourth bank group addresses ADD_BG<1:4> if the read column control pulse RDAYP occurs. In an embodiment, a logic level combination of the first to fourth bank group addresses ADD_BG<1:4> generated by the first bank group address generation circuit 81 may be identical to a logic level combination of the first to fourth bank group selection signals BG<1:4>. However, in another embodiment, a logic level combination of the first to fourth bank group addresses ADD_BG<1:4> generated by the first bank group address generation circuit 81 may be different from a logic level combination of the first to fourth bank group selection signals BG<1:4>. The first bank group address generation circuit 81 may generate the first to fourth internal bank group addresses IADD_BG<1:4> from the first to fourth bank group selection signals BG<1:4> in response to the internal read column control pulse IRDAYP. The first bank group address generation circuit 81 may buffer the first to fourth bank group selection signals BG<1:4> to generate the first to fourth internal bank group addresses IADD_BG<1:4> if the internal read column control pulse IRDAYP occurs. In an embodiment, a logic level combination of the first to fourth internal bank group addresses IADD_BG<1:4> generated by the first bank group address generation circuit 81 may be identical to a logic level combination of the first to fourth bank group selection signals BG<1:4>. However, in another embodiment, a logic level combination of the first to fourth internal bank group addresses IADD_BG<1:4> generated by the first bank group address generation circuit 81 may be different from a logic level combination of the first to fourth bank group selection signals BG<1:4>.

The second bank group address generation circuit 82 may generate the first to fourth bank group addresses ADD_BG<1:4> and the first to fourth internal bank group addresses IADD_BG<1:4> in response to the write column control pulse WTAYP, the internal write column control pulse IWTAYP and the first to fourth bank group selection signals BG<1:4>. The second bank group address generation circuit 82 may generate the first to fourth bank group addresses ADD_BG<1:4> from the first to fourth bank group selection signals BG<1:4> in response to the write column control pulse WTAYP. The second bank group address generation circuit 82 may buffer the first to fourth bank group selection signals BG<1:4> to generate the first to fourth bank group addresses ADD_BG<1:4> if the write column control pulse WTAYP occurs. In an embodiment, a logic level combination of the first to fourth bank group addresses ADD_BG<1:4> generated by the second bank group address generation circuit 82 may be identical to a logic level combination of the first to fourth bank group selection signals BG<1:4>. However, in another embodiment, a logic level combination of the first to fourth bank group addresses ADD_BG<1:4> generated by the second bank group address generation circuit 82 may be different from a logic level combination of the first to fourth bank group selection signals BG<1:4>. The second bank group address generation circuit 82 may generate the first to fourth internal bank group addresses IADD_BG<1:4> from the first to fourth bank group selection signals BG<1:4> in response to the internal write column control pulse IWTAYP. The second bank group address generation circuit 82 may buffer the first to fourth bank group selection signals BG<1:4> to generate the first to fourth internal bank group addresses IADD_BG<1:4> if the internal write column control pulse IWTAYP occurs. In an embodiment, a logic level combination of the first to fourth internal bank group addresses IADD_BG<1:4> generated by the second bank group address generation circuit 82 may be identical to a logic level combination of the first to fourth bank group selection signals BG<1:4>. However, in another embodiment, a logic level combination of the first to fourth internal bank group addresses IADD_BG<1:4> generated by the second bank group address generation circuit 82 may be different from a logic level combination of the first to fourth bank group selection signals BG<1:4>.

Figure 13:
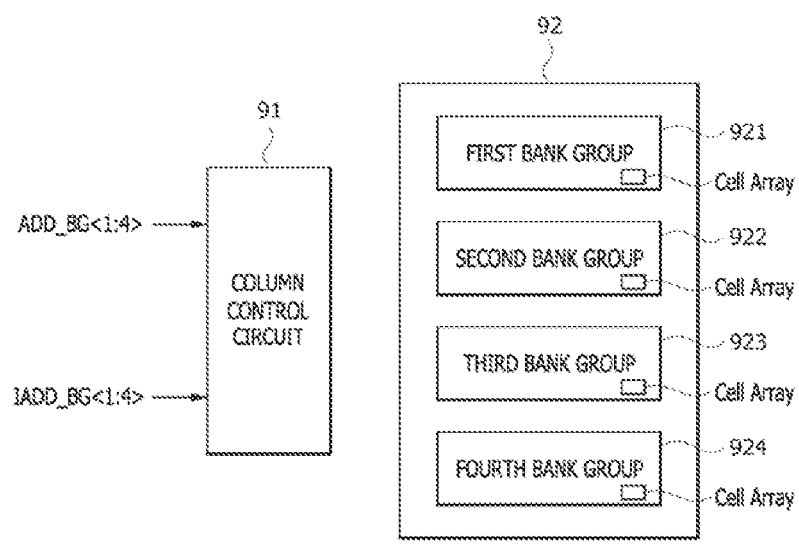
FIG. 13 is a block diagram illustrating a configuration of an example of a core circuit included in the semiconductor device of FIG. 1.

Referring to FIG. 13, the core circuit 9 may include a column control circuit 91 and a memory cell region 92. The column control circuit 91 may control the column operations of cell arrays disposed in first to fourth bank groups 921, 922, 923 and 924 included in the memory cell region 92 in response to the first to fourth bank group addresses ADD_BG<1:4> and the first to fourth internal bank group addresses IADD_BG<1:4>. The column control circuit 91 may sequentially perform the column operations of the cell array included in the first bank group 921 if the first bank group address ADD_BG<1> and the first internal bank group address IADD_BG<1> are sequentially enabled. While the burst length is set to be '32', the column control circuit 91 may perform the column operation for 16-bit data of the cell array included in the first bank group 921 in response to the first bank group address ADD_BG<1> which is enabled and may perform the column operation for 16-bit data of the cell array included in the first bank group 921 in response to the first internal bank group address IADD_BG<1> which is enabled after a certain period elapses. The column control circuit 91 may sequentially perform the column operations of the cell array included in the second bank group 922 if the second bank group address ADD_BG<2> and the second internal bank group address IADD_BG<2> are sequentially enabled. While the burst length is set to be '32', the column control circuit 91 may perform the column operation for 16-bit data of the cell array included in the second bank group 922 in response to the second bank group address ADD_BG<2> which is enabled and may perform the column operation for 16-bit data of the cell array included in the second bank group 922 in response to the second internal bank group address IADD_BG<2> which is enabled after the certain period elapses. The column control circuit 91 may sequentially perform the column operations of the cell array included in the third bank group 923 if the third bank group address ADD_BG<3> and the third internal bank group address IADD_BG<3> are sequentially enabled. While the burst length is set to be '32', the column control circuit 91 may perform the column operation for 16-bit data of the cell array included in the third bank group 923 in response to the third bank group address ADD_BG<3> which is enabled and may perform the column operation for 16-bit data of the cell array included in the third bank group 923 in response to the third internal bank group address IADD_BG<3> which is enabled after the certain period elapses. The column control circuit 91 may sequentially perform the column operations of the cell array included in the fourth bank group 924 if the fourth bank group address ADD_BG<4> and the fourth internal bank group address IADD_BG<4> are sequentially enabled. While the burst length is set to be '32', the column control circuit 91 may perform the column operation for 16-bit data of the cell array included in the fourth bank group 924 in response to the fourth bank group address ADD_BG<4> which is enabled and may perform the column operation for 16-bit data of the cell array included in the fourth bank group 924 in response to the fourth internal bank group address IADD_BG<4> which is enabled after the certain period elapses. The column control circuit 91 may include various circuits to control the column operations of the cell arrays disposed in the first to fourth bank groups 921, 922, 923 and 924 included in the memory cell region 92 in response to the first to fourth bank group addresses ADD_BG<1:4> and the first to fourth internal bank group addresses IADD_BG<1:4>. For example, the column control circuit 91 may include a first circuit for selecting one of the cell arrays included in the first to fourth bank groups 921~924, a second circuit for outputting the data stored in the selected cell array in units of 16 bits, and a third circuit for transmitting the data output from the selected cell array to data pads through data paths, in response to the first to fourth bank group addresses ADD_BG<1:4> and the first to fourth internal bank group addresses IADD_BG<1:4>. The first circuit for selecting one of the cell arrays, the second circuit for outputting the data stored in the selected cell array in units determined by the burst length, and the third circuit for transmitting the data output from the selected cell array to the data pads may be realized using general circuits. Thus, descriptions of the first to third circuits will be omitted hereinafter.

Figure 14:
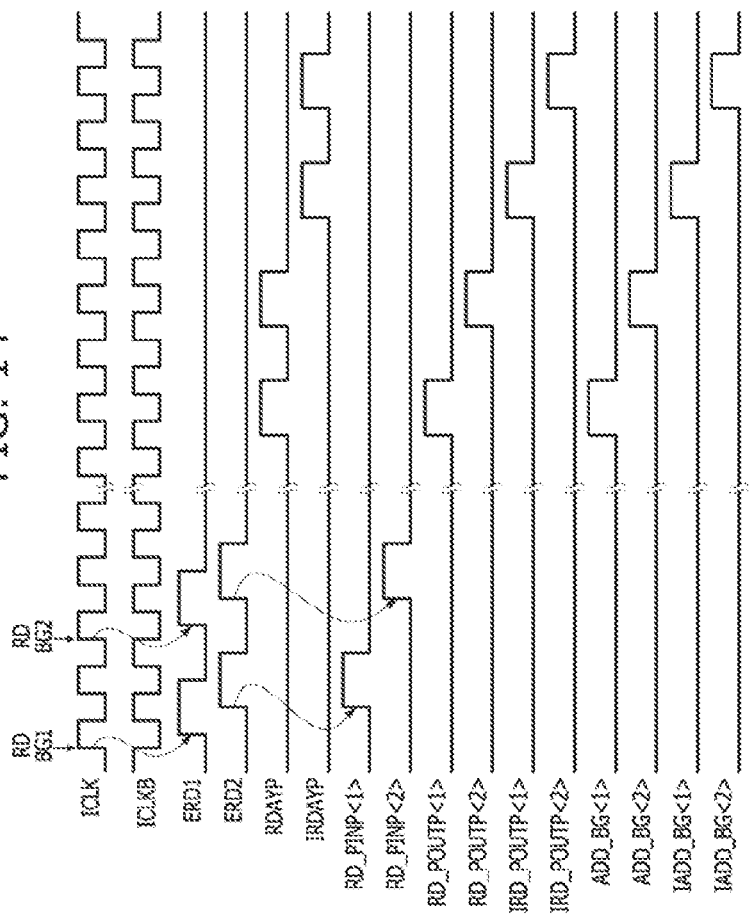
FIGS. 14 and 15 are timing diagrams illustrating operations of the semiconductor device illustrated in FIG. 1.

A read mode of the semiconductor device having an aforementioned configuration will be described hereinafter with reference to FIG. 14 in conjunction with an example in which read operations of the first bank group 921 and the second bank group 922 are sequentially performed while the burst length is set to be '32' in the bank group mode.

If a command for the read operation of the first bank group 921 is input to the command pulse generation circuit 1, the first read command pulse ERD1 may be generated in synchronization with the internal clock signal ICLK and the second read command pulse ERD2 may be generated in synchronization with the inverted internal clock signal ICLKB. The first read command pulse ERD1 may be shifted by a period set by the read latency to provide the read column control pulse RDAYP. The read column control pulse RDAYP may be shifted by a period set to perform the column operation according to the burst length to provide the internal read column control pulse IRDAYP, Whenever the second read command pulse ERD2 occurs, the first read input control pulse RD_PINP<1> and the second read input control pulse RD_PINP<2> may be alternately generated. Whenever the second read command pulse ERD2 occurs, the first read output control pulse RD_POUTP<1> and the second read output control pulse RD_POUTP<2> may be alternately generated after the period set by the read latency elapses from a point of time that the second read command pulse ERD2 occurs. Whenever the second read command pulse ERD2 occurs, the first internal read output control pulse IRD_POUTP<1> and the second internal read output control pulse IRD_POUTP<2> may be alternately generated after the period set to perform the column operation according to the burst length elapses from a point of time that the second read command pulse ERD2 occurs. The first bank group address ADD_BG<1> may be generated in synchronization with the first read output control pulse RD_POUTP<1>, the second bank group address ADD_BG<2> may be generated in synchronization with the second read output control pulse RD_POUTP<2>, the first internal bank group address IADD_BG<1> may be generated in synchronization with the first internal read output control pulse IRD_POUTP<1>, and the second internal bank group address IADD_BG<2> may be generated in synchronization with the second internal read output pulse IRD_POUTP<2>. The column operation for 16-bit data of the cell array included in the first bank group 921 may be performed by the read column control pulse RDAYP created while the first bank group address ADD_BG<1> is generated. The column operation for 16-bit data of the cell array included in the second bank group 922 may be performed by the read column control pulse RDAYP created while the second bank group address ADD_BG<2> is generated. The column operation for 16-bit data of the cell array included in the first bank group 921 may be performed by the internal read column control pulse IRDAYP created while the first internal bank group address IADD_BG<1> is generated. The column operation for 16-bit data of the cell array included in the second bank group 922 may be performed by the internal read column control pulse IRDAYP created while the second internal bank group address IADD_BG<2> is generated.

Figure 15:
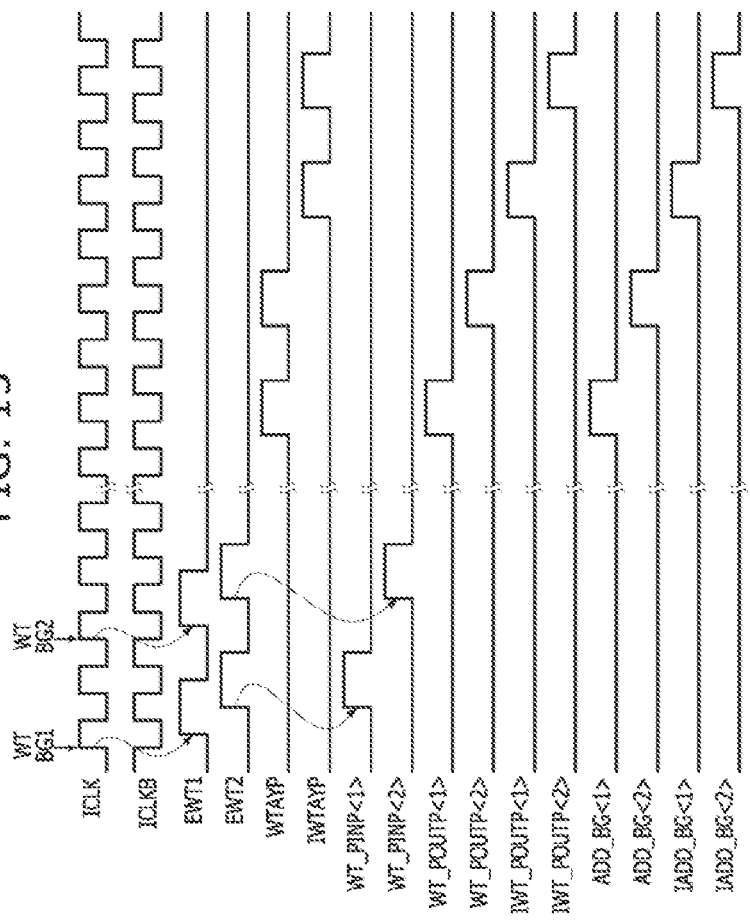

A write mode of the semiconductor device having an aforementioned configuration will be described hereinafter with reference to FIG. 15 in conjunction with an example in which write operations of the first bank group 921 and the second bank group 922 are sequentially performed while the burst length is set to be '32' in the bank group mode.

If a command for the write operation of the first bank group 921 is input to the command pulse generation circuit 1, the first write command pulse EWT1 may be generated in synchronization with the internal clock signal ICLK and the second write command pulse EWT2 may be generated in synchronization with the inverted internal clock signal ICLKB. The first write command pulse EWT1 may be shifted by a period set by the read latency to provide the write column control pulse WTAYP. The write column control pulse WTAYP may be shifted by a period set to perform the column operation according to the burst length to provide the internal write column control pulse IWTAYP. Whenever the second write command pulse EWT2 occurs, the first write input control pulse WT_PINP<1> and the second write input control pulse WT_PINP<2> may be alternately generated. Whenever the second write command pulse EWT2 occurs, the first write output control pulse WT_POUTP<1> and the second write output control pulse WT_POUTP<2> may be alternately generated after the period set by the read latency elapses from a point of time that the second write command pulse EWT2 occurs. Whenever the second write command pulse EWT2 occurs, the first internal write output control pulse IWT_POUTP<1> and the second internal write output control pulse IWT_POUTP<2> may be alternately generated after the period set to perform the column operation according to the burst length elapses from a point of time that the second write command pulse EWT2 occurs. The first bank group address ADD_BG<1> may be generated in synchronization with the first write output control pulse WT_POUTP<1>, the second bank group address ADD_BG<2> may be generated in synchronization with the second write output control pulse WT_POUTP<2>, the first internal bank group address IADD_BG<1> may be generated in synchronization with the first internal write output control pulse IWT_POUTP<1>, and the second internal bank group address IADD_BG<2> may be generated in synchronization with the second internal write output control pulse IWT_POUTP<2>. The column operation for 16-bit data of the cell array included in the first bank group 921 may be performed by the write column control pulse WTAYP created while the first bank group address ADD_BG<1> is generated. The column operation for 16-bit data of the cell array included in the second bank group 922 may be performed by the write column control pulse WTAYP created while the second bank group address ADD_BG<2> is generated. The column operation for 16-bit data of the cell array included in the first bank group 921 may be performed by the internal write column control pulse IWTAYP created while the first internal bank group address IADD_BG<1> is generated. The column operation for 16-bit data of the cell array included in the second bank group 922 may be performed by the internal write column control pulse IWTAYP created while the second internal bank group address IADD_BG<2> is generated.

As described above, a semiconductor device according to an embodiment may separately perform column operations for a cell array included in a bank group accessed by first to fourth bank addresses IBA<1:4>. This may lead to reduction of the column operation time and the electric power consumption during the column operations. In addition, the semiconductor device according to an embodiment may store the first to fourth bank addresses IBA<1:4> to separately perform the column operations. Accordingly, the column operations may be efficiently performed.

Figure 16:
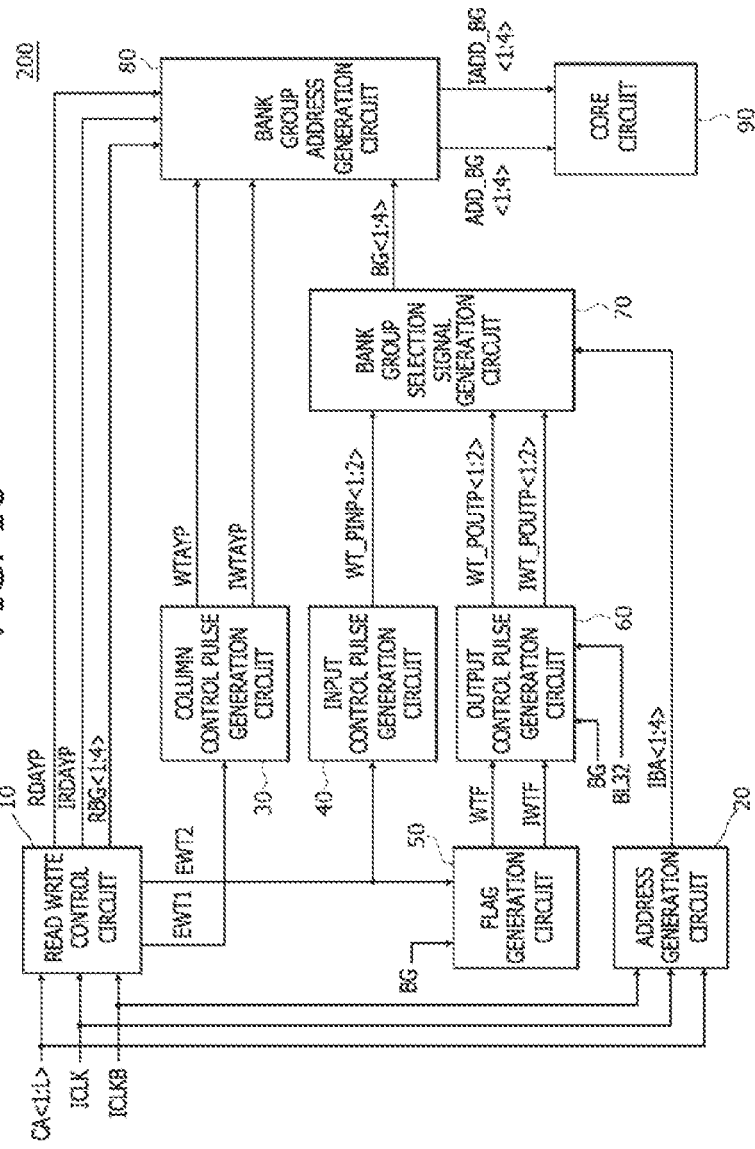
FIG. 16 is a block diagram illustrating a configuration of a semiconductor device according to another embodiment of the present disclosure.

As illustrated in FIG. 16, a semiconductor device 200 according to another embodiment may include a read write control circuit 10, an address generation circuit 20, a column control pulse generation circuit 30, an input control pulse generation circuit 40, a flag generation circuit 50, an output control pulse generation circuit 60, a bank group selection signal generation circuit 70, a bank group address generation circuit 80, and a core circuit 90.

The read write control circuit 10 may generate a read column control pulse RDAYP, an internal read column control pulse IRDAYP, and first to fourth read bank group selection signals RBG<1:4> in response to first to $L^{th}$ external control signals CA<1:L>, an internal clock signal ICLK, and an inverted internal clock signal ICLKB. The first to $L^{th}$ external control signals CA<1:L> may include a command and an address provided by an external device. The internal clock signal ICLK may be toggled in synchronization with a rising edge of a clock signal (not illustrated) that is provided by the external device or another external device. The inverted internal clock signal ICLKB may be toggled in synchronization with a falling edge of the clock signal (not illustrated). The number 'L' of bits included in the first to $L^{th}$ external control signals CA<1:L> may be set to be different according to the embodiments.

The read write control circuit 10 may decode the first to $L^{th}$ external control signals CA<1:L> in synchronization with the internal clock signal ICLK or the inverted internal clock signal ICLKB to generate the read column control pulse RDAYP, the internal read column control pulse IRDAYP, and the first to fourth read bank group selection signals RBG<1:4> for execution of a read operation. In an embodiment, the read write control circuit 10 may decode the first to $L^{th}$ external control signals CA<1:L> in synchronization with the internal clock signal ICLK to generate the read column control pulse RDAYP and may shift the read column control pulse RDAYP in synchronization with the inverted internal clock signal ICLKB to generate the internal read column control pulse IRDAYP, in order to perform the read operation. The read column control pulse RDAYP may be enabled in a first burst length mode and a second burst length mode. The internal read column control pulse IRDAYP may be enabled in the second burst length mode. The first burst length mode may be activated with a first burst length which is set to be '16'. In first burst length mode, 16-bit data may be successively output or input when the read operation or a write operation is performed once. The second burst length mode may be activated with a second burst length which is set to be '32'. In the second burst length mode, 32-bit data may be successively output or input when the read operation or the write operation is performed once.

The read write control circuit 10 may decode the first to $L^{th}$ external control signals CA<1:L> in synchronization with the internal clock signal ICLK or the inverted internal clock signal ICLKB to generate a first write command pulse EWT1 and a second write command pulse EWT2 for execution of the write operation. In an embodiment, the read write control circuit 10 may decode the first to $L^{th}$ external control signals CA<1:L> in synchronization with the internal clock signal ICLK to generate the first write command pulse EWT1 and may shift the first write command pulse EWT1 in synchronization with the inverted internal clock signal ICLKB to generate the second write command pulse EWT2, in order to perform the write operation.

The address generation circuit 20 may generate first to fourth bank addresses IBA<1:4> in response to the first to $L^{th}$ external control signals CA<1:L>, the internal clock signal ICLK and the inverted internal clock signal ICLKB. The address generation circuit 20 may decode the first to $L^{th}$ external control signals CA<1:L> in synchronization with the internal clock signal ICLK or the inverted internal clock signal ICLKB to generate the first to fourth bank addresses IBA<1:4>. A logic level combination of the first to fourth bank addresses IBA<1:4> may be determined as a logic level combination of some signals among the first to $L^{th}$ external control to signals CA<1:L> that is input to the address generation circuit 20 in synchronization with a rising edge of the internal clock signal ICLK or the inverted internal clock signal ICLKB.

The column control pulse generation circuit 30 may generate a write column control pulse WTAYP and an internal write column control pulse IWTAYP in response to the first write command pulse EWT1.

The column control pulse generation circuit 30 may sequentially generate the write column control pulse WTAYP and the internal write column control pulse IWTAYP after a first predetermined period elapses from a point of time that the first write command pulse EWT1 occurs. The column control pulse generation circuit 30 may shift the first write command pulse EWT1 by the first predetermined period to generate the write column control pulse WTAYP. The first predetermined period by which the first write command pulse EWT1 is shifted may be set according to a write latency. The first predetermined period by which the first write command pulse EWT1 is shifted may be set to be different according to the embodiments. The column control pulse generation circuit 30 may shift the write column control pulse WTAYP by a second predetermined period to generate the internal write column control pulse IWTAYP. The second predetermined period by which the write column control pulse WTAYP is shifted may be a period which is set to perform a column operation according to a burst length. The second predetermined period by which the write column control pulse WTAYP is shifted may be set to be different according to the embodiments. In some embodiments, the column control pulse generation circuit 30 may be configured to generate the write column control pulse WTAYP and the internal write column control pulse IWTAYP in response to the second write command pulse EWT2. The write column control pulse WTAYP may be enabled in the first burst length mode and the second burst length mode. The internal write column control pulse IWTAYP may be enabled in the second burst length mode.

The input control pulse generation circuit 40 may generate first and second write input control pulses WT_PINP<1:2> in response to the second write command pulse EWT2.

The input control pulse generation circuit 40 may alternately generate the first and second write input control pulses WT_PINP<1:2> whenever the second write command pulse EWT2 occurs. For example, the input control pulse generation circuit 40 may generate the first write input control pulse WT_PINP<1> if the second write command pulse EWT2 occurs first, may generate the second write input control pulse WT_PINP<2> if the second write command pulse EWT2 occurs second, and may generate the first write input control pulse WT_PINP<1> if the second write command pulse EWT2 occurs third.

The flag generation circuit 50 may generate a write flag WTF and an internal write flag IWTF in response to the second write command pulse EWT2 and a mode signal BG. The mode signal BG may be enabled in the bank group mode.

The flag generation circuit 50 may generate the write flag WTF and the internal write flag IWTF in response to the second write command pulse EWT2 and the mode signal BG. The flag generation circuit 50 may generate the write flag WTF after a third predetermined period elapses from a point of time that the second write command pulse EWT2 occurs. The flag generation circuit 50 may shift the second write command pulse EWT2 by the third predetermined period to generate the write flag WTF. The third predetermined period by which the second write command pulse EWT2 is shifted may be set to be different according to the embodiments. The flag generation circuit 50 may shift the write flag WTF by a fourth predetermined period to generate the internal write flag IWTF while the mode signal BG is enabled. The fourth predetermined period by which the write flag WTF is shifted may be a period which is set to perform the column operation according to the burst length. The fourth predetermined period by which the write flag WTF is shifted may be set to be different according to the embodiments.

The output control pulse generation circuit 60 may generate first and second write output control pulses WT_POUTP<1:2> and first and second internal write output control pulses IWT_POUTP<1:2> in response to the write flag WTF, the internal write flag IWTF, the mode signal BG and a burst length signal BL32. The burst length signal BL32 may be enabled if the burst length is set to be '32'.

The output control pulse generation circuit 60 may alternately generate the first and second write output control pulses WT_POUTP<1:2> whenever the write flag WTF occurs. For example, the output control pulse generation circuit 60 may generate the first write output control pulse WT_POUTP<1> if the write flag WTF occurs first, may generate the second write output control pulse WT_POUTP<2> if the write flag WTF occurs second, and may generate the first write output control pulse WT_POUTP<1> again if the write flag WTF occurs third.

The output control pulse generation circuit 60 may alternately generate the first and second internal write output control pulses IWT_POUTP<1:2> whenever the write flag WTF or the internal write flag IWTF occurs. For example, the output control pulse generation circuit 60 may generate the first internal write output control pulse IWT_POUTP<1> if the write flag WTF or the internal write flag IWTF occurs first, may generate the second internal write output control pulse IWT_POUTP<2> if the write flag WTF or the internal write flag IWTF occurs second, and may generate the first internal write output control pulse IWT_POUTP<1> again if the write flag WTF or the internal write flag IWTF occurs third. The output control pulse generation circuit 60 may control generation of the first and second internal write output control pulses IWT_POUTP<1:2> according to the burst length in the bank group mode. For example, the output control pulse generation circuit 60 may sequentially generate the first and second internal write output control pulses IWT_POUTP<1:2> according to the internal write flag IWTF if the burst length is set to be '32' in the bank group mode and may terminate the generation of the first and second internal write output control pulses IWT_POUTP<1:2> if the semiconductor device 200 is out of the bank group mode or the burst length is not set to be '32'.

The bank group selection signal generation circuit 70 may generate first to fourth bank group selection signals BG<1:4> in response to the first and second write input control pulses WT_PINP<1:2>, the first and second write output control pulses WT_POUTP<1:2>, the first and second internal write output control pulses IWT_POUTP<1:2> and the first to fourth bank addresses IBA<1:4>. The bank group selection signal generation circuit 70 may store the first to fourth bank addresses IBA<1:4> in response to the first and second write input control pulses WT_PINP<1:2> during the write operation. The bank group selection signal generation circuit 70 may output the first to fourth bank addresses IBA<1:4> as the first to fourth bank group selection signals BG<1:4> in response to the first and second write output control pulses WT_POUTP<1:2> and the first and second internal write output control pulses IWT_POUTP<1:2>.

The bank group address generation circuit 80 may generate first to fourth bank group addresses ADD_BG<1:4> and first to fourth internal bank group addresses IADD_BG<1:4> in response to the read column control pulse RDAYP, the internal read column control pulse IRDAYP, the write column control pulse WTAYP, the internal write column control pulse IWTAYP, the first to fourth read bank group selection signals RBG<1:4> and the first to fourth bank group selection signals BG<1:4>. The bank group address generation circuit 80 may generate the first to fourth bank group addresses ADD_BG<1:4> and the first to fourth internal bank group addresses IADD_BG<1:4> having logic level combinations according to a bank group performing the column operation in response to the read column control pulse RDAYP, the internal read column control pulse IRDAYP and the first to fourth read bank group selection signals RBG<1:4> if the read operation is performed. The bank group address generation circuit 80 may generate the first to fourth bank group addresses ADD_BG<1:4> and the first to fourth internal bank group addresses IADD_BG<1:4> having logic level combinations according to a bank group performing the column operation in response to the write column control pulse WTAYP, the internal write column control pulse IWTAYP and the first to fourth bank group selection signals BG<1:4> if the write operation is performed.

The core circuit 90 may receive the first to fourth bank group addresses ADD_BG<1:4> and the first to fourth internal bank group addresses IADD_BG<1:4> to perform the column operation for each of the bank groups. The core circuit 90 may separately perform the column operations for cell arrays selected by the first to fourth bank group addresses ADD_BG<1:4> and the first to fourth internal bank group addresses IADD_BG<1:4> in one bank group. For example, if the read operation is performed while the burst length is set to be '32', the column operation for a cell array included in a bank group selected by the first to fourth read bank group selection signals RBG<1:4> may be divided into two column operations which are separately performed for sixteen-bit data selected by the first to fourth bank group addresses ADD_BG<1:4> and for sixteen-bit data selected by the first to fourth internal bank group addresses IADD_BG<1:4>. In addition, if the write operation is performed while the burst length is set to be '32', the column operation for a cell array included in a bank group selected by the first to fourth bank group selection signals BG<1:4> may be divided into two column operations which are separately performed for sixteen-bit data selected by the first to fourth bank group addresses ADD_BG<1:4> and for sixteen-bit data selected by the first to fourth internal bank group addresses IADD_BG<1:4>. In the burst length, '32' means that 32 bits of data are successively read or written whenever the read operation or the write operation is performed once during the column operation.

Figure 17:
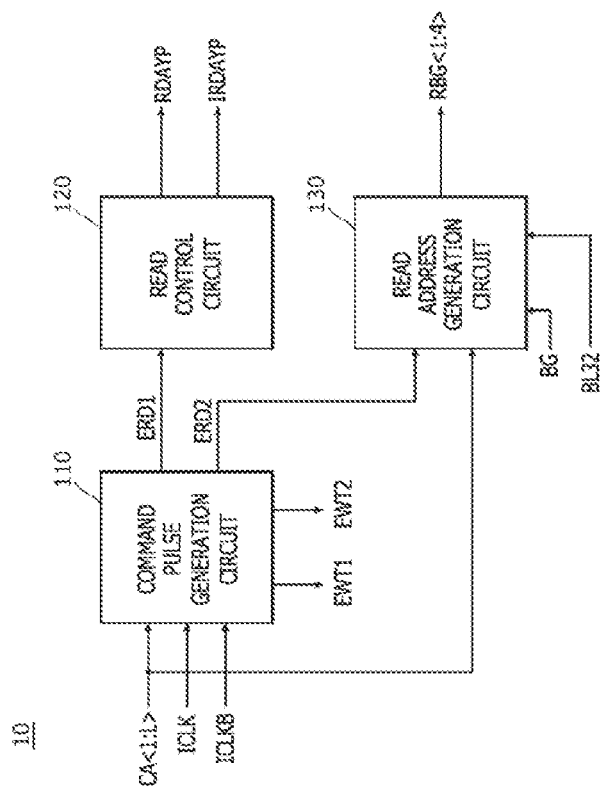
FIG. 17 is a block diagram illustrating a configuration of an example of a read write control circuit included in the semiconductor device illustrated in FIG. 16.

Referring to FIG. 17, the read write control circuit 10 may include a command pulse generation circuit 110, a read control circuit 120, and a read address generation circuit 130.

The command pulse generation circuit 110 may generate a first read command pulse ERD1, the first write command pulse EWT1, a second read command pulse ERD2, and the second write command pulse EWT2 in response to the first to $L^{th}$ external control signals CA<1:L>, the internal clock signal ICLK, and the inverted internal clock signal ICLKB.

The command pulse generation circuit 110 may decode the first to $L^{th}$ external control signals CA<1:L> in synchronization with the internal clock signal ICLK or the inverted internal clock signal ICLKB to generate the first read command pulse ERD1 and the second read command pulse ERD2 for execution of the read operation. In an embodiment, the command pulse generation circuit 110 may decode the first to $L^{th}$ external control signals CA<1:L> in synchronization with the internal clock signal ICLK to generate the first read command pulse ERD1 and may shift the first read command pulse ERD1 in synchronization with the inverted internal clock signal ICLKB to generate the second read command pulse ERD2, in order to perform the read operation. A point of time that the first read command pulse ERD1 is generated for the read operation may be determined as a point of time that the first to $L^{th}$ external control signals CA<1:L> having a first predetermined logic level combination is input to the command pulse generation circuit 110 in synchronization with a rising edge of the internal clock signal ICLK.

The command pulse generation circuit 110 may decode the first to $L^{th}$ external control signals CA<1:L> in synchronization with the internal clock signal ICLK or the inverted internal clock signal ICLKB to generate the first write command pulse EWT1 and the second write command pulse EWT2 for execution of the write operation. In an embodiment, the command pulse generation circuit 110 may decode the first to $L^{th}$ external control signals CA<1:L> in synchronization with the internal clock signal ICLK to generate the first write command pulse EWT1 and may shift the first write command pulse EWT1 in synchronization with the inverted internal clock signal ICLKB to generate the second write command pulse EWT2, in order to perform the write operation. A point of time that the first write command pulse EWT1 is generated for the write operation may be determined as a point of time that the first to $L^{th}$ external control signals CA<1:L> having a second predetermined logic level combination is input to the command pulse generation circuit 110 in synchronization with a rising edge of the internal clock signal ICLK.

The read control circuit 120 may generate the read column control pulse RDAYP and the internal read column control pulse IRDAYP in response to the first read command pulse ERD1. The read control circuit 120 may sequentially generate the read column control pulse RDAYP and the internal read column control pulse IRDAYP after a fifth predetermined period elapses from a point of time that the first read command pulse ERD1 occurs. The read control circuit 120 may shift the first read command pulse ERD1 by the fifth predetermined period to generate the read column control pulse RDAYP. The fifth predetermined period by which the first read command pulse ERD1 is shifted may be set according to a read latency. The fifth predetermined period by which the first read command pulse ERD1 is shifted may be set to be different according to the embodiments. The read control circuit 120 may shift the read column control pulse RDAYP by a sixth predetermined period to generate the internal read column control pulse IRDAYP. The sixth predetermined period by which the read column control pulse RDAYP is shifted may be a period which is set to perform a column operation according to a burst length. The sixth predetermined period by which the read column control pulse RDAYP is shifted may be set to be different according to the embodiments.

The read address generation circuit 130 may generate the first to fourth read bank group selection signals RBG<1:4> from the first to $L^{th}$ external control signals CA<1:L> in response to the second read command pulse ERD2. The read address generation circuit 130 may generate the first to fourth read bank group selection signals RBG<1:4> from the first to $L^{th}$ external control signals CA<1:L> in response to the mode signal BG and the burst length signal BL32. A logic level combination of the first to fourth read bank group selection signals RBG<1:4> may be determined as a logic level combination of the first to $L^{th}$ external control signals CA<1:L> which are input in synchronization with a rising edge of the internal clock signal ICLK or the inverted internal clock signal ICLKB.

Referring to FIG. 18, command pulses and bank addresses that are generated according to a logic level combination of first to fourth external control signals CA<1:4> are listed.

If the first to fourth external control signals CA<1:4> are set to have a logic level combination of 'A' in synchronization with a rising edge of the internal clock signal ICLK, a command pulse for performing the write operation may be generated. In the first to fourth external control signals CA<1:4>, the logic level combination of 'A' means that a first external control signal CA<1> has a logic "low(L)" level and second and third external control signals CA<2:3> have a logic "high(H)" level. In such a case, a fourth external control signal CA<4> may have a don't care condition. After the command pulse for the write operation is generated, the first to fourth external control signals CA<1:4> input to the semiconductor device in synchronization with a falling edge of the internal clock signal ICLK may be generated as the first to fourth bank addresses IBA<1:4> for the write operation.

If the first to fourth external control signals CA<1:4> are set to have a logic level combination of 'B' in synchronization with a rising edge of the internal clock signal ICLK, a command pulse for performing the read operation may be generated. In the first to fourth external control signals CA<1:4>, the logic level combination of 'B' means that the first external control signal CA<1> has a logic "high(H)" level and the second external control signals CA<2> has a logic "low(L)" level. In such a case, the third and fourth external control signals CA<3:4> may have a don't care condition. After the command pulse for the read operation is generated, the first to fourth external control signals CA<1:4> input to the semiconductor device in synchronization with a falling edge of the internal clock signal ICLK may be generated as first to fourth read bank addresses RIBA<1:4> for the read operation.

Figure 19:
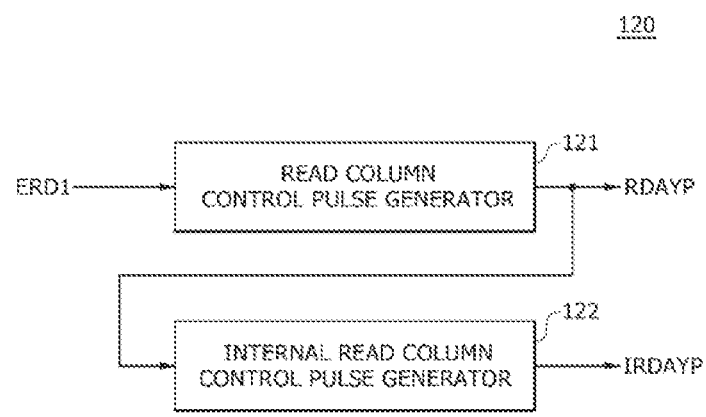
FIG. 19 is a block diagram illustrating a configuration of an example of a read control circuit included in the read write control circuit illustrated in FIG. 17.

Referring to FIG. 19, the read control circuit 120 may include a read column control pulse generator 121 and an internal read column control pulse generator 122.

The read column control pulse generator 121 may shift the first read command pulse ERD1 by the fifth predetermined period to generate the read column control pulse RDAYP. The read column control pulse generator 121 may be configured to shift the first read command pulse ERD1 by the fifth predetermined period which is set according to the read latency.

The internal read column control pulse generator 122 may shift the read column control pulse RDAYP by the sixth predetermined period to generate the internal read column control pulse IRDAYP. The internal read column control pulse generator 122 may be configured to shift the read column control pulse RDAYP by the sixth predetermined period which is set to perform the column operation according to the burst length during the read operation.

Figure 20:
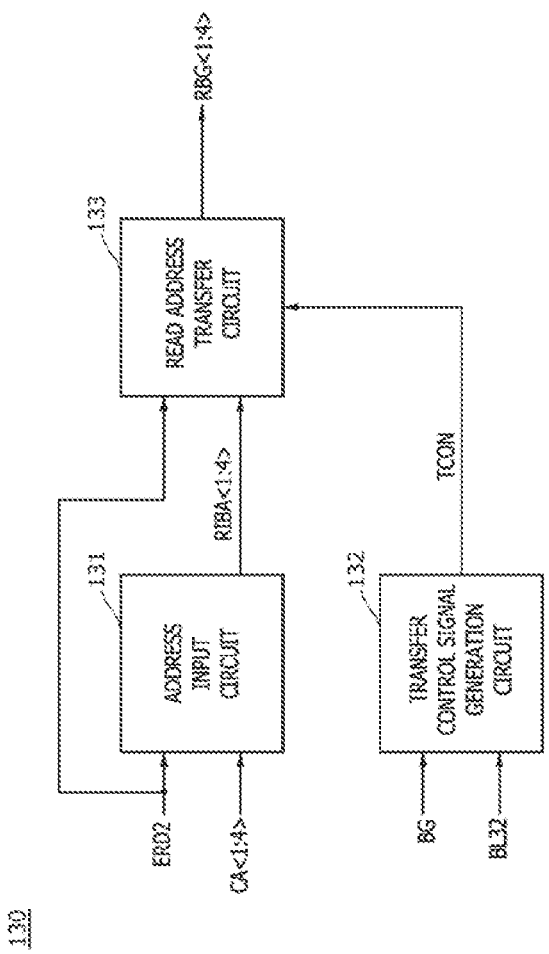
FIG. 20 is a block diagram illustrating a configuration of an example of a read address generation circuit included in the read write control circuit illustrated in FIG. 17.

Referring to FIG. 20, the read address generation circuit 130 may include an address input circuit 131, a transfer control signal generation circuit 132, and a read address transfer circuit 133.

The address input circuit 131 may generate the first to fourth read bank addresses RIBA<1:4> from the first to fourth external control signals CA<1:4> in response to the second read command pulse ERD2. The address input circuit 131 may generate the first to fourth read bank addresses RIBA<1:4> from the first to fourth external control signals CA<1:4> which are input in synchronization with a falling edge of the internal clock signal ICLK.

The transfer control signal generation circuit 132 may generate a transfer control signal TCON in response to the mode signal BG and the burst length signal BL32. The transfer control signal generation circuit 132 may generate the transfer control signal TCON which is enabled when both of the mode signal BG and the burst length signal BL32 are enabled. The transfer control signal generation circuit 132 may generate the transfer control signal TCON which is enabled when the burst length is set to be '32' in the bank group mode.

The read address transfer circuit 133 may generate the first to fourth read bank group selection signals RBG<1:4> from the first to fourth read bank addresses RIBA<1:4> in response to the second read command pulse ERD2. The read address transfer circuit 133 may generate the first to fourth read bank group selection signals RBG<1:4> from at least one of the first to fourth read bank addresses RIBA<1:4> in response to the second read command pulse ERD2. The read address transfer circuit 133 may generate the first to fourth read bank group selection signals RBG<1:4> from the first to fourth read bank addresses RIBA<1:4> in response to the transfer control signal TCON. The read address transfer circuit 133 may generate the first to fourth read bank group selection signals RBG<1:4> from at least one of the first to fourth read bank addresses RIBA<1:4> in response to the transfer control signal TCON. The read address transfer circuit 133 may generate the first to fourth read bank group selection signals RBG<1:4> from the first to fourth read bank addresses RIBA<1:4> when the read operation is performed in the bank group mode. The read address transfer circuit 133 may generate the first to fourth read bank group selection signals RBG<1:4> from the first to fourth read bank addresses RIBA<1:4> when the burst length is set to be '32' while the read operation is performed in the bank group mode.

Figure 21:
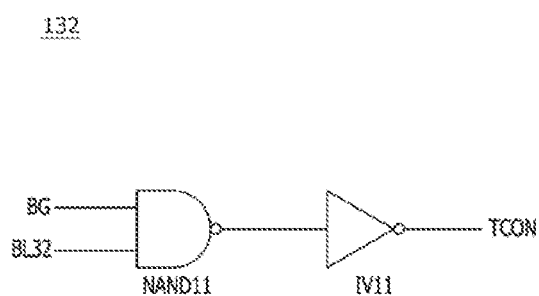
FIG. 21 is a circuit diagram illustrating a configuration of an example of a transfer control signal generation circuit included in the read address generation circuit illustrated in FIG. 20.

Referring to FIG. 21, the transfer control signal generation circuit 132 may be realized to include a NAND gate NAND11 and an inverter IV11.

The transfer control signal generation circuit 132 may generate the transfer control signal TCON which is enabled to have a logic "high" level when both of the mode signal BG and the burst length signal BL32 are enabled to have a logic "high" level.

Figure 22:
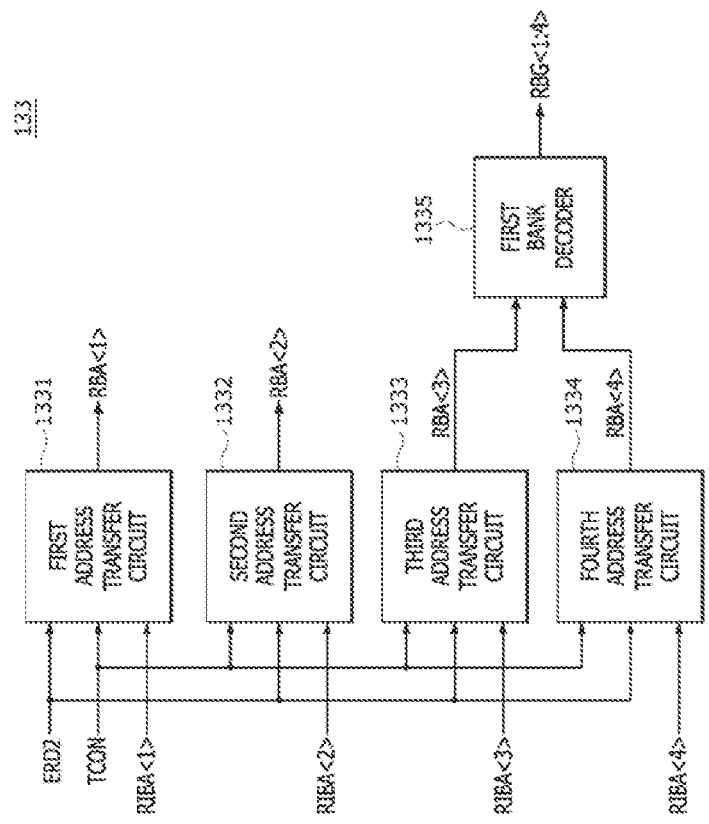
FIG. 22 is a block diagram illustrating a configuration of an example of a read address transfer circuit included in the read address generation circuit illustrated in FIG. 20.

Referring to FIG. 22, the read address transfer circuit 133 may include a first address transfer circuit 1331, a second address transfer circuit 1332, a third address transfer circuit 1333, a fourth address transfer circuit 1334 and a first bank decoder 1335.

The first address transfer circuit 1331 may generate a first read latch bank address RBA<1> from the first read bank address RIBA<1> in response to the second read command pulse ERD2 and the transfer control signal TCON. The first address transfer circuit 1331 may output the first read bank address RIBA<1> as the first read latch bank address RBA<1> when any one of the second read command pulse ERD2 and the transfer control signal TCON is enabled.

The second address transfer circuit 1332 may generate a second read latch bank address RBA<2> from the second read bank address RIBA<2> in response to the second read command pulse ERD2 and the transfer control signal TCON. The second address transfer circuit 1332 may output the second read bank address RIBA<2> as the second read latch bank address RBA<2> when any one of the second read command pulse ERD2 and the transfer control signal TCON is enabled.

The third address transfer circuit 1333 may generate a third read latch bank address RBA<3> from the third read bank address RIBA<3> in response to the second read command pulse ERD2 and the transfer control signal TCON. The third address transfer circuit 1333 may output the third read bank address RIBA<3> as the third read latch bank address RBA<3> when any one of the second read command pulse ERD2 and the transfer control signal TCON is enabled.

The fourth address transfer circuit 1334 may generate a fourth read latch bank address RBA<4> from the fourth read bank address RIBA<4> in response to the second read command pulse ERD2 and the transfer control signal TCON. The fourth address transfer circuit 1334 may output the fourth read bank address RIBA<4> as the fourth read latch bank address RBA<4> when any one of the second read command pulse ERD2 and the transfer control signal TCON is enabled.

The first bank decoder 1335 may generate the first to fourth read bank group selection signals RBG<1:4> in response to the third read latch bank address RBA<3> and the fourth read latch bank address RBA<4>. The first bank decoder 1335 may decode the third read latch bank address RBA<3> and the fourth read latch bank address RBA<4> to generate the first to fourth read bank group selection signals RBG<1:4>. The first bank decoder 1335 may generate the first to fourth read bank group selection signals RBG<1:4> having a certain logic level combination which is set according to a logic level combination of the third read latch bank address RBA<3> and the fourth read latch bank address RBA<4>.

Figure 23:
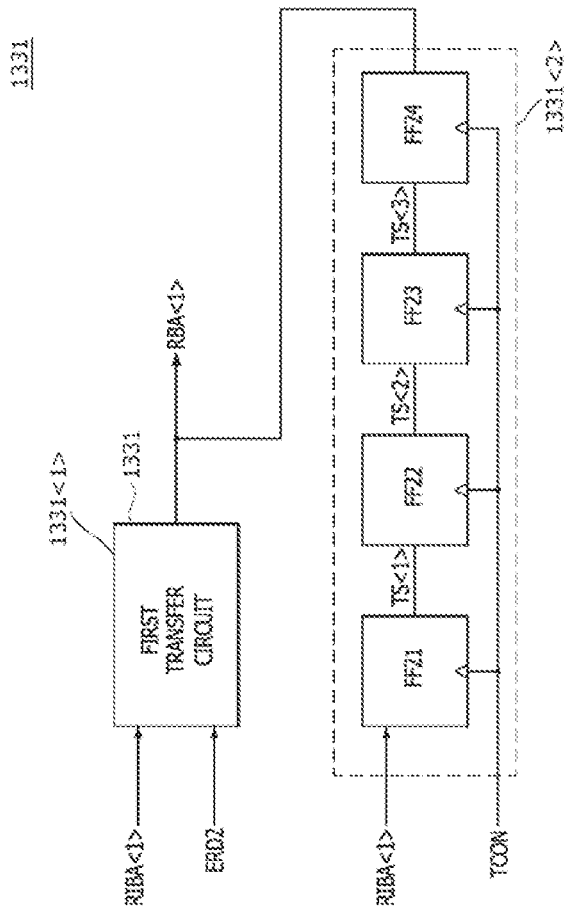
FIG. 23 is a block diagram illustrating a configuration of an example of a first address transfer circuit included in the read address transfer circuit illustrated in FIG. 22.

Referring to FIG. 23, the first address transfer circuit 1331 may include a first transfer circuit 1331<1> and a first shift circuit 1331<2>.

The first transfer circuit 1331<1> may generate the first read latch bank address RBA<1> from the first read bank address RIBA<1> in response to the second read command pulse ERD2. The first transfer circuit 1331<1> may output the first read bank address RIBA<1> as the first read latch bank address RBA<1> when the second read command pulse ERD2 is enabled.

The first shift circuit 1331<2> may shift the first read bank address RIBA<1> to generate the first read latch bank address RBA<1> in response to the transfer control signal TCON. The first shift circuit 1331<2> may shift the first read bank address RIBA<1> by a period, which is set to perform the column operation according to the burst length, to generate the first read latch bank address RBA<1> when the transfer control signal TCON is enabled.

For example, the first shift circuit 1331<2> may include a first flip-flop FF21, a second flip-flop FF22, a third flip-flop FF23 and a fourth flip-flop FF24. The first flip-flop FF21 may shift the first read bank address RIBA<1> to generate a first transfer signal TS<1> when the transfer control signal TCON is enabled. The second flip-flop FF22 may shift the first transfer signal TS<1> to generate a second transfer signal TS<2> when the transfer control signal TCON is enabled. The third flip-flop FF23 may shift the second transfer signal TS<2> to generate a third transfer signal TS<3> when the transfer control signal TCON is enabled. The fourth flip-flop FF24 may shift the third transfer signal TS<3> to generate the first read latch bank address RBA<1> when the transfer control signal TCON is enabled. The number of the flip-flops included in the first shift circuit 1331<2> may be set to be different according to the embodiments to control a total shift period determined by the first shift circuit 1331<2>.

Meanwhile, each of the second to fourth address transfer circuits 1332, 1333 and 1334 illustrated in FIG. 22 may be realized using substantially the same circuit as the first address transfer circuit 1331 illustrated in FIG. 23 except its input/output (I/O) signals. Thus, descriptions of the second to fourth address transfer circuits 1332, 1333 and 1334 will be omitted hereinafter.

Figure 24:
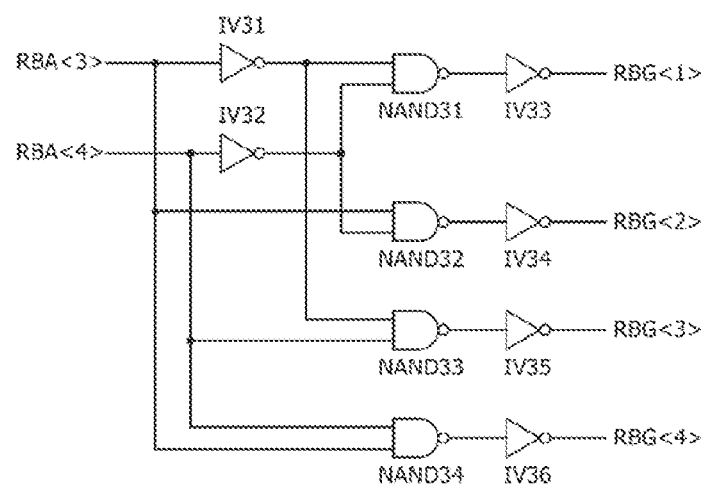
FIG. 24 is a circuit diagram illustrating a configuration of an example of a first bank decoder included in the read address transfer circuit illustrated in FIG. 22.

Referring to FIG. 24, the first bank decoder 1335 may include inverters IV31, IV32, IV33, IV34, IV35 and IV36 and NAND gates NAND31, NAND32, NAND33 and NAND34. The inverter IV31 may inversely buffer the third read latch bank address RBA<3> to output the inversely buffered address. The inverter IV32 may inversely buffer the fourth read latch bank address RBA<4> to output the inversely buffered address. The NAND gate NAND31 and the inverter IV33 may be coupled in series and may perform a logical AND operation of an output signal of the inverter IV31 and an output signal of the inverter IV32 to generate the first read bank group selection signal RBG<1>. The NAND gate NAND32 and the inverter IV34 may be coupled in series and may perform a logical AND operation of the third read latch bank address RBA<3> and an output signal of the inverter IV32 to generate the second read bank group selection signal RBG<2>. The NAND gate NAND33 and the inverter IV35 may be coupled in series and may perform a logical AND operation of the fourth read latch bank address RBA<4> and an output signal of the inverter IV31 to generate the third read bank group selection signal RBG<3>. The NAND gate NAND34 and the inverter IV36 may be coupled in series and may perform a logical AND operation of the third read latch bank address RBA<3> and the fourth read latch bank address RBA<4> to generate the fourth read bank group selection signal RBG<4>.

Referring to FIG. 25, bank groups enabled according to logic level combinations of the third and fourth read latch bank addresses RBA<3:4> are listed. If the third read latch bank address RBA<3> has a logic "low" level and the fourth read latch bank address RBA<4> has a logic "low" level, the first read bank group selection signal RBG<1> may be enabled to have a logic "high" level to select a first bank group. If the third read latch bank address RBA<3> has a logic "high" level and the fourth read latch bank address RBA<4> has a logic "low" level, the second read bank group selection signal RBG<2> may be enabled to have a logic "high" level to select a second bank group. If the third read latch bank address RBA<3> has a logic "low" level and the fourth read latch bank address RBA<4> has a logic "high" level, the third read bank group selection signal RBG<3> may be enabled to have a logic "high" level to select a third bank group. If the third read latch bank address RBA<3> has a logic "high" level and the fourth read latch bank address RBA<4> has a logic "high" level, the fourth read bank group selection signal RBG<4> may be enabled to have a logic "high" level to select a fourth bank group.

Figure 26:
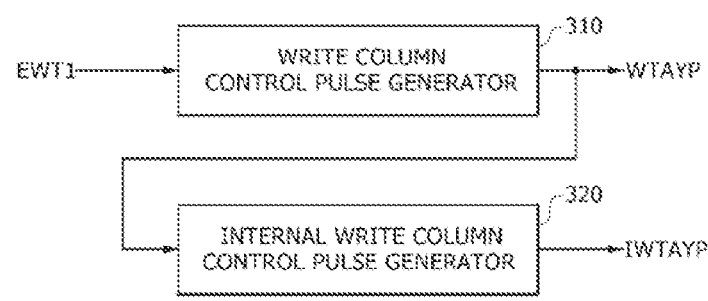
FIG. 26 is a block diagram illustrating a configuration of an example of a column control pulse generation circuit included in the semiconductor device illustrated in FIG. 16.

Referring to FIG. 26, the column control pulse generation circuit 30 may include a write column control pulse generator 310 and an internal write column control pulse generator 320.

The write column control pulse generator 310 may shift the first write command pulse EWT1 by the first predetermined period to generate the write column control pulse WTAYP. The write column control pulse generator 310 may be configured to shift the first write command pulse EWT1 by the first predetermined period which is set according to the write latency.

The internal write column control pulse generator 320 may shift the write column control pulse WTAYP by the second predetermined period to generate the internal write column control pulse IWTAYP. The internal write column control pulse generator 320 may be configured to shift the write column control pulse WTAYP by the second predetermined period which is set to perform the column operation according to the burst length during the write operation.

The write column control pulse generator 310 and the internal write column control pulse generator 320 may be realized using shift registers or delay circuits according to the embodiments.

Figure 27:
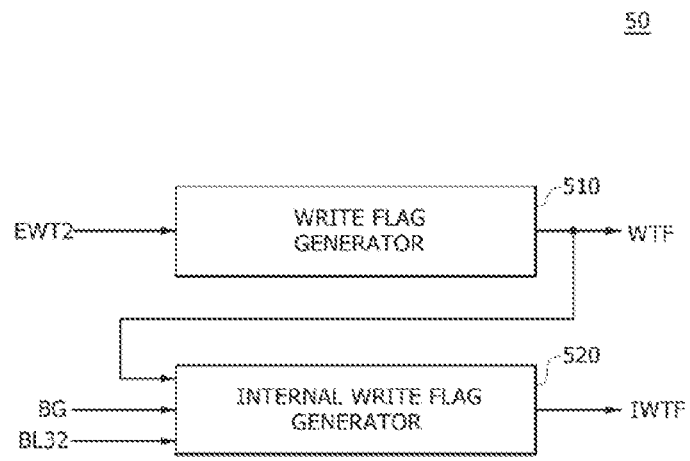
FIG. 27 is a block diagram illustrating a configuration of an example of a flag generation circuit included in the semiconductor device illustrated in FIG. 16.

Referring to FIG. 27, the flag generation circuit 50 may include a write flag generator 510 and an internal write flag generator 520.

The write flag generator 510 may shift the second write command pulse EWT2 by the third predetermined period to generate the write flag WTF. The write flag generator 510 may be configured to shift the second write command pulse EWT2 by the third predetermined period which is set according to the write latency.

The internal write flag generator 520 may shift the write flag WTF by the fourth predetermined period to generate the internal write flag IWTF if the mode signal BG and the burst length signal BL32 are enabled in the bank group mode. The internal write flag generator 520 may be configured to shift the write flag WTF by the fourth predetermined period which is set to perform the column operation according to the burst length during the write operation.

The write flag generator 510 and the internal write flag generator 520 may be realized using shift registers or delay circuits according to the embodiments.

Figure 28:
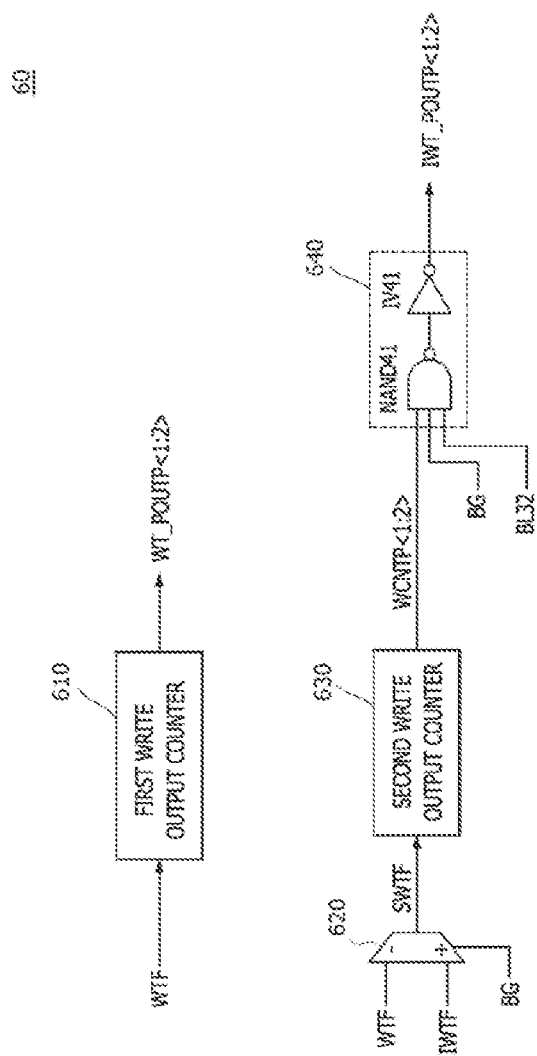
FIG. 28 is a block diagram illustrating a configuration of an example of an output control pulse generation circuit included in the semiconductor device illustrated in FIG. 16.

Referring to FIG. 28, the output control pulse generation circuit 60 may include a first write output counter 610, a write selector 620, a second write output counter 630 and an internal write output control pulse generation circuit 640.

The first write output counter 610 may alternately generate the first and second write output control pulses WT_POUTP<1:2> whenever the write flag WTF occurs. For example, the first write output counter 610 may generate the first write output control pulse WT_POUTP<1> if the write flag WTF occurs first, may generate the second write output control pulse WT_POUTP<2> if the write flag WTF occurs second, and may generate the first write output control pulse WT_POUTP<1> again if the write flag WTF occurs third.

The write selector 620 may output the write flag WTF or the internal write flag IWTF as a selection write flag SWTF in response to the mode signal BG. The write selector 620 may output the write flag WTF as the selection write flag SWTF if the semiconductor device is out of the bank group mode. The write selector 620 may output the internal write flag IWTF as the selection write flag SWTF in the bank group mode. Since the internal write flag IWTF is generated only in the bank group mode, the write selector 620 may output the write flag WTF as the selection write flag SWTF if the semiconductor device is out of the bank group mode. Accordingly, the first and second internal write output control pulses IWT_POUTP<1:2> may be set to be generated by the same number of times as the first and second write output control pulses WT_POUTP<1:2>.

The second write output counter 630 may alternately generate first and second write count pulses WCNTP<1:2> whenever the selection write flag SWTF occurs. For example, the second write output counter 630 may generate the first write count pulse WCNTP<1> if the selection write flag SWTF occurs first, may generate the second write count pulse WCNTP<2> if the selection write flag SWTF occurs second, and may generate the first write count pulse WCNTP<1> again if the selection write flag SWTF occurs third.

The internal write output control pulse generation circuit 640 may include, for example but not limited to, a NAND gate NAND41 and an inverter IV41. The internal write output control pulse generation circuit 640 may generate the first and second internal write output control pulses IWT_POUTP<1:2> in response to the first and second write count pulses WCNTP<1:2>, the mode signal BG and the burst length signal BL32. The internal write output control pulse generation circuit 640 may buffer the first and second write count pulses WCNTP<1:2> to output the buffered pulses as the first and second internal write output control pulses IWT_POUTP<1:2> if both of the mode signal BG and the burst length signal BL32 are enabled to have a logic "high" level while the burst length is set to be '32' in the bank group mode. The internal write output control pulse generation circuit 640 may terminate the generation of the first and second internal write output control pulses IWT_POUTP<1:2> while the semiconductor device is out of the bank group mode (i.e., the semiconductor device is not operating in the bank group mode) or the burst length is not set to be '32'.

Figure 29:
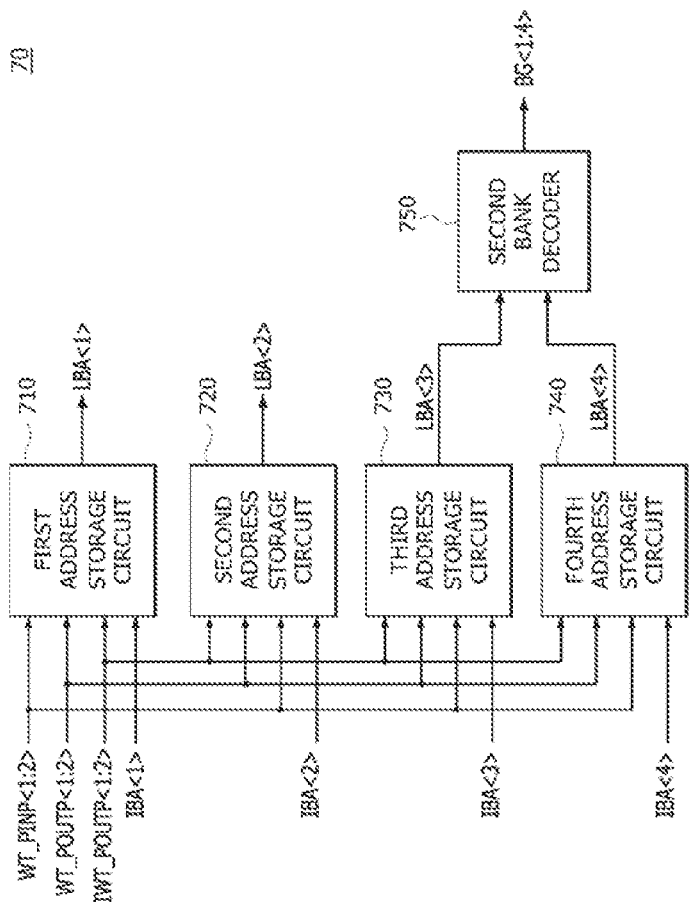
FIG. 29 is a block diagram illustrating a configuration of an example of a bank group selection signal generation circuit included in the semiconductor device illustrated in FIG. 16.

Referring to FIG. 29, the bank group selection signal generation circuit 70 may include a first address storage circuit 710, a second address storage circuit 720, a third address storage circuit 730, a fourth address storage circuit 740 and a second bank decoder 750.

The first address storage circuit 710 may generate a first latch bank address LBA<1> in response to the first and second write input control pulses WT_PINP<1:2>, the first and second write output control pulses WT_POUTP<1:2>, the first and second internal write output control pulses IWT_POUTP<1:2> and the first bank address IBA<1>. The first address storage circuit 710 may store the first bank address IBA<1> input to the first address storage circuit 710 during the write operation in response to the first and second write input control pulses WT_PINP<1:2>. The first address storage circuit 710 may output the first bank address IBA<1> stored therein during the write operation as the first latch bank address LBA<1> in response to the first and second write output control pulses WT_POUTP<1:2> and the first and second internal write output control pulses IWT_POUTP<1:2>.

The second address storage circuit 720 may generate a second latch bank address LBA<2> in response to the first and second write input control pulses WT_PINP<1:2>, the first and second write output control pulses WT_POUTP<1:2>, the first and second internal write output control pulses IWT_POUTP<1:2> and the second bank address IBA<2>. The second address storage circuit 720 may store the second bank address IBA<2> input to the second address storage circuit 720 during the write operation in response to the first and second write input control pulses WT_PINP<1:2>. The second address storage circuit 720 may output the second bank address IBA<2> stored therein during the write operation as the second latch bank address LBA<2> in response to the first and second write output control pulses WT_POUTP<1:2> and the first and second internal write output control pulses IWT_POUTP<1:2>.

The third address storage circuit 730 may generate a third latch bank address LBA<3> in response to the first and second write input control pulses WT_PINP<1:2>, the first and second write output control pulses WT_POUTP<1:2>, the first and second internal write output control pulses IWT_POUTP<1:2> and the third bank address IBA<3>. The third address storage circuit 730 may store the third bank address IBA<3> input to the third address storage circuit 730 during the write operation in response to the first and second write input control pulses WT_PINP<1:2>. The third address storage circuit 730 may output the third bank address IBA<3> stored therein during the write operation as the third latch bank address LBA<3> in response to the first and second write output control pulses WT_POUTP<1:2> and the first and second internal write output control pulses IWT_POUTP<1:2>.

The fourth address storage circuit 740 may generate a fourth latch bank address LBA<4> in response to the first and second write input control pulses WT_PINP<1:2>, the first and second write output control pulses WT_POUTP<1:2>, the first and second internal write output control pulses IWT_POUTP<1:2> and the fourth bank address IBA<4>. The fourth address storage circuit 740 may store the fourth bank address IBA<4> input to the fourth address storage circuit 740 during the write operation in response to the first and second write input control pulses WT_PINP<1:2>. The fourth address storage circuit 740 may output the fourth bank address IBA<4> stored therein during the write operation as the fourth latch bank address LBA<4> in response to the first and second write output control pulses WT_POUTP<1:2> and the first and second internal write output control pulses IWT_POUTP<1:2>.

Meanwhile, the first to fourth address storage circuits 710, 720, 730 and 740 may be realized using pipe circuits to store the first to fourth bank addresses IBA<1:4> in response to the first and second write input control pulses WT_PINP<1:2> and to output the first to fourth bank addresses IBA<1:4> stored therein as the first to fourth bank group selection signals BG<1:4> in response to the first and second write output control pulses WT_POUTP<1:2> or the first and second internal write output control pulses IWT_POUTP<1:2>.

The second bank decoder 750 may generate the first to fourth bank group selection signals BG<1:4> in response to the third latch bank address LBA<3> and the fourth latch bank address LBA<4>. The second bank decoder 750 may decode the third latch bank address LBA<3> and the fourth latch bank address LBA<4> to generate the first to fourth bank group selection signals BG<1:4>. The second bank decoder 750 may generate the first to fourth bank group selection signals BG<1:4> having a certain logic level combination according to a logic level combination of the third latch bank address LBA<3> and the fourth latch bank address LBA<4>.

Figure 30:
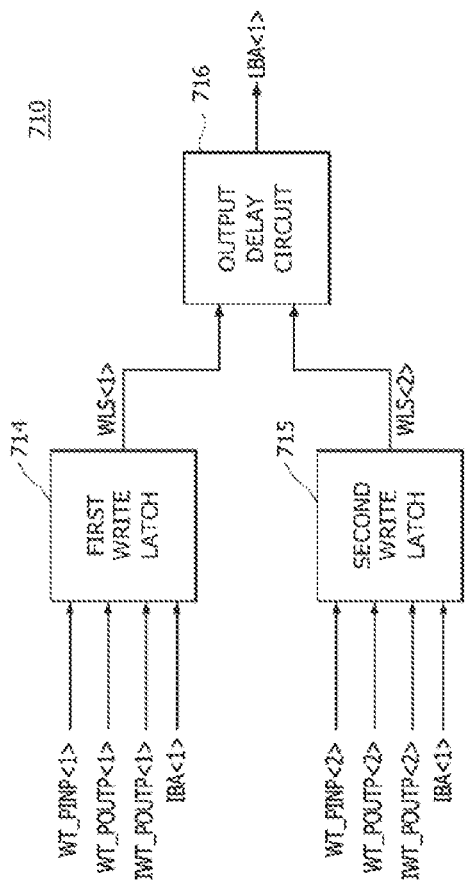
FIG. 30 is a block diagram illustrating a configuration of an example of a first address storage circuit included in the bank group selection signal generation circuit illustrated in FIG. 29.

Referring to FIG. 30, the first address storage circuit 710 may include a first write latch 714, a second write latch 715 and an output delay circuit 716.

The first write latch 714 may generate a first write latch signal WLS<1> in response to the first write input control pulse WT_PINP<1>, the first write output control pulse WT_POUTP<1>, the first internal write output control pulse IWT_POUTP<1> and the first bank address IBA<1>. The first write latch 714 may latch and store the first bank address IBA<1> if the first write input control pulse WT_PINP<1> occurs. The first write latch 714 may output the first bank address IBA<1> stored therein as the first write latch signal WLS<1> if the first write output control pulse WT_POUTP<1> or the first internal write output control pulse IWT_POUTP<1> occurs.

The second write latch 715 may generate a second write latch signal WLS<2> in response to the second write input control pulse WT_PINP<2>, the second write output control pulse WT_POUTP<2>, the second internal write output control pulse IWT_POUTP<2> and the first bank address IBA<1>. The second write latch 715 may latch and store the first bank address IBA<1> if the second write input control pulse WT_PINP<2> occurs. The second write latch 715 may output the first bank address IBA<1> stored therein as the second write latch signal WLS<2> if the second write output control pulse WT_POUTP<2> or the second internal write output control pulse IWT_POUTP<2> occurs.

The output delay circuit 716 may generate the first latch bank address LBA<1> in response to the first and second write latch signals WLS<1:2>. The output delay circuit 716 may delay any one of the first and second write latch signals WLS<1:2> by a seventh predetermined period to generate the first latch bank address LBA<1>. The output delay circuit 716 may delay the first write latch signal WLS<1>, which is generated by occurrence of the first write output control pulse WT_POUTP<1> or the first internal write output control pulse IWT_POUTP<1>, by the seventh predetermined period to generate the first latch bank address LBA<1>. The output delay circuit 716 may delay the second write latch signal WLS<2>, which is generated by occurrence of the second write output control pulse WT_POUTP<2> or the second internal write output control pulse IWT_POUTP<2>, by the seventh predetermined period to generate the first latch bank address LBA<1>.

Figure 31:
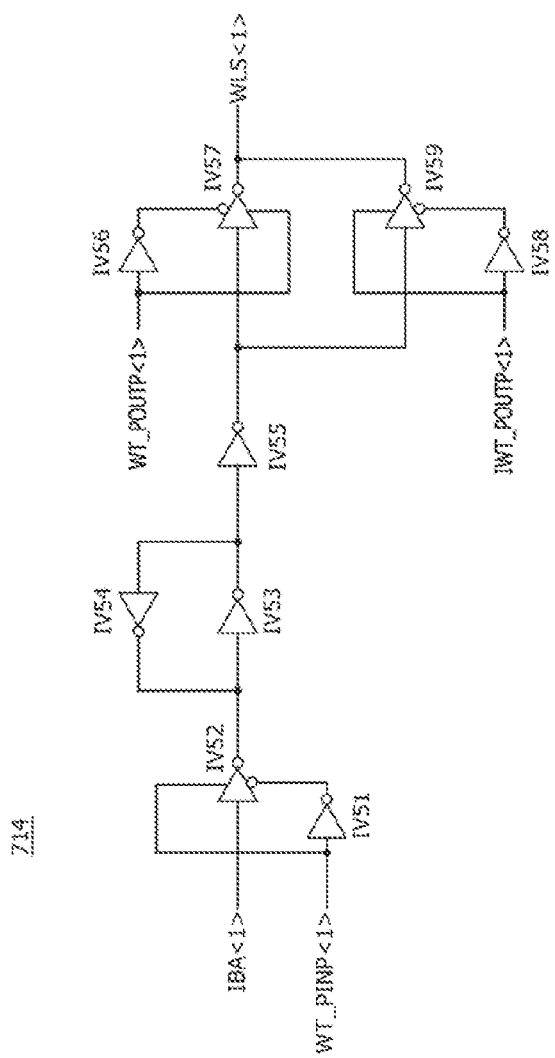
FIG. 31 is a circuit diagram illustrating a configuration of an example of a first write latch included in the first address storage circuit illustrated in FIG. 30.

Referring to FIG. 31, the first write latch 714 may include inverters IV51, IV52, IV53, IV54, IV55, IV56, IV57, IV58 and IV59. The inverter IV51 may inversely buffer the first write input control pulse WT_PINP<1> and may output the inversely buffered pulse. The inverter IV52 may inversely buffer the first bank address IBA<1> to output the inversely buffered address if the first write input control pulse WT_PINP<1> has a logic "high" level. The inverters IV53 and IV54 may latch and inversely buffer an output signal of the inverter IV52 to output the inversely buffered signal. The inverter IV55 may inversely buffer an output signal of the inverter IV53 to output the inversely buffered signal. The inverter IV56 may inversely buffer the first write output control pulse WT_POUTP<1> to output the inversely buffered signal of the first write output control pulse WT_POUTP<1>. The inverter IV57 may inversely buffer an output signal of the inverter IV55 to output the inversely buffered signal as the first write latch signal WLS<1> if the first write output control pulse WT_POUTP<1> has a logic "high" level. The inverter IV55 may inversely buffer the first internal write output control pulse IWT_POUTP<1> to output the inversely buffered signal of the first internal write output control pulse IWT_POUTP<1>. The inverter IV59 may inversely buffer an output signal of the inverter IV55 to output the inversely buffered signal as the first write latch signal WLS<1> if the first internal write output control pulse IWT_POUTP<1> has a logic "high" level. The first write latch 714 may output the first bank address IBA<1> stored therein as the first write latch signal WLS<1> if the first write output control pulse WT_POUTP<1> or the first internal write output control pulse IWT_POUTP<1> occurs.

The second write latch 715 illustrated in FIG. 30 may be realized using substantially the same circuit as the first write latch 714 illustrated in FIG. 31 except its input/output (I/O) signals. Thus, descriptions of the second write latch 715 will be omitted hereinafter.

Figure 32:
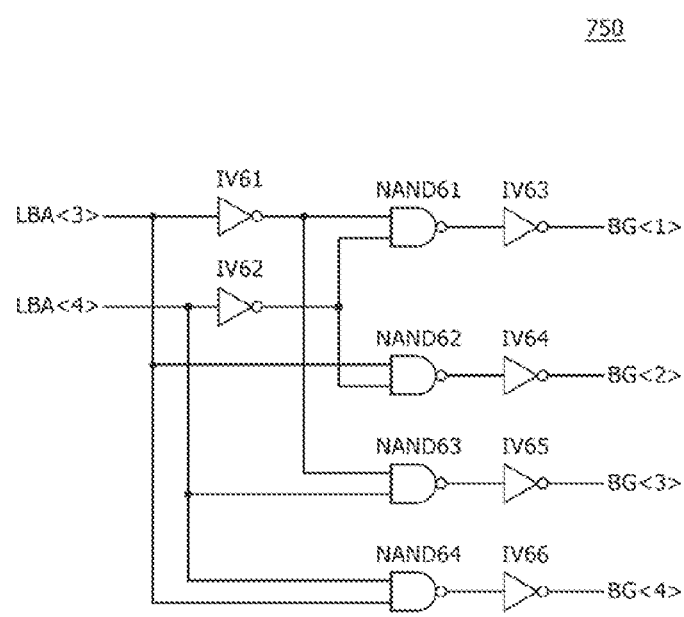
FIG. 32 is a circuit diagram illustrating a configuration of an example of a second bank decoder included in the bank group selection signal generation circuit illustrated in FIG. 29.

Referring to FIG. 32, the second bank decoder 750 may include inverters IV61, IV62, IV63, IV64, IV65 and IV66 and NAND gates NAND61, NAND62, NAND63 and NAND64. The inverter IV61 may inversely buffer the third latch bank address LBA<3> to output the inversely buffered address. The inverter IV62 may inversely buffer the fourth latch bank address LBA<4> to output the inversely buffered address. The NAND gate NAND61 and the inverter IV63 may be coupled in series and may perform a logical AND operation of an output signal of the inverter IV61 and an output signal of the inverter IV62 to generate the first bank group selection signal BG<1>. The NAND gate NAND62 and the inverter IV64 may be coupled in series and may perform a logical AND operation of the third latch bank address LBA<3> and an output signal of the inverter IV62 to generate the second bank group selection signal BG<2>. The NAND gate NAND63 and the inverter IV65 may be coupled in series and may perform a logical AND operation of the fourth latch bank address LBA<4> and an output signal of the inverter IV61 to generate the third bank group selection signal BG<3>. The NAND gate NAND64 and the inverter IV66 may be coupled in series and may perform a logical AND operation of the third latch bank address LBA<3> and the fourth latch bank address LBA<4> to generate the fourth bank group selection signal BG<4>.

The second bank decoder 750 may be realized using the same circuit as the bank decoder 75 illustrated in FIGS. 10 and 11 to perform the same operation as the bank decoder 75. Thus, descriptions of the second bank decoder 750 will be omitted hereinafter.

Figure 33:
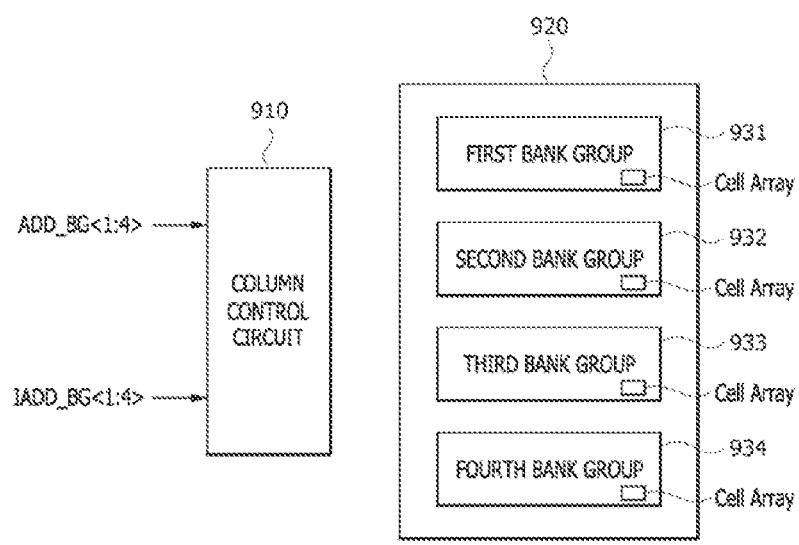
FIG. 33 is a block diagram illustrating a configuration of an example of a core circuit included in the semiconductor device illustrated in FIG. 16.

Referring to FIG. 33, the core circuit 90 may include a column control circuit 910 and a memory cell region 920.

The column control circuit 910 may control the column operations of cell arrays disposed in first to fourth bank groups 931, 932, 933 and 934 included in the memory cell region 920 in response to the first to fourth bank group addresses ADD_BG<1:4> and the first to fourth internal bank group addresses IADD_BG<1:4>. The column control circuit 910 may sequentially perform the column operations of the cell array included in the first bank group 931 if the first bank group address ADD_BG<1> and the first internal bank group address IADD_BG<1> are sequentially enabled. While the burst length is set to be '32', the column control circuit 910 may perform the column operation for 16-bit data of the cell array included in the first bank group 931 in response to the first bank group address ADD_BG<1> which is enabled and may perform the column operation for 16-bit data of the cell array included in the first bank group 931 in response to the first internal bank group address IADD_BG<1> which is enabled after a certain period elapses.

The column control circuit 910 may sequentially perform the column operations of the cell array included in the second bank group 932 if the second bank group address ADD_BG<2> and the second internal bank group address IADD_BG<2> are sequentially enabled. While the burst length is set to be '32', the column control circuit 910 may perform the column operation for 16-bit data of the cell array included in the second bank group 932 in response to the second bank group address ADD_BG<2> which is enabled and may perform the column operation for 16-bit data of the cell array included in the second bank group 932 in response to the second internal bank group address IADD_BG<2> which is enabled after the certain period elapses.

The column control circuit 910 may sequentially perform the column operations of the cell array included in the third bank group 933 if the third bank group address ADD_BG<3> and the third internal bank group address IADD_BG<3> are sequentially enabled. While the burst length is set to be '32', the column control circuit 910 may perform the column operation for 16-bit data of the cell array included in the third bank group 933 in response to the third bank group address ADD_BG<3> which is enabled and may perform the column operation for 16-bit data of the cell array included in the third bank group 933 in response to the third internal bank group address IADD_BG<3> which is enabled after the certain period elapses.

The column control circuit 910 may sequentially perform the column operations of the cell array included in the fourth bank group 934 if the fourth bank group address ADD_BG<4> and the fourth internal bank group address IADD_BG<4> are sequentially enabled. While the burst length is set to be '32', the column control circuit 910 may perform the column operation for 16-bit data of the cell array included in the fourth bank group 934 in response to the fourth bank group address ADD_BG<4> which is enabled and may perform the column operation for 16-bit data of the cell array included in the fourth bank group 934 in response to the fourth internal bank group address IADD_BG<4> which is enabled after the certain period elapses.

The column control circuit 910 may include various circuits to control the column operations of the cell arrays disposed in the first to fourth bank groups 931, 932, 933 and 934 included in the memory cell region 920 in response to the first to fourth bank group addresses ADD_BG<1:4> and the first to fourth internal bank group addresses IADD_BG<1:4>. For example, the column control circuit 910 may include a first circuit for selecting one of the cell arrays included in the first to fourth bank groups 931~934, a second circuit for outputting the data stored in the selected cell array in units of 16 bits, and a third circuit for transmitting the data output from the selected cell array to data pads through data paths, in response to the first to fourth bank group addresses ADD_BG<1:4> and the first to fourth internal bank group addresses IADD_BG<1:4>. The first circuit for selecting one of the cell arrays, the second circuit for outputting the data stored in the selected cell array in units determined by the burst length, and the third circuit for transmitting the data output from the selected cell array to the data pads may be realized using general circuits. Thus, descriptions of the first to third circuits will be omitted hereinafter.

Figure 34:
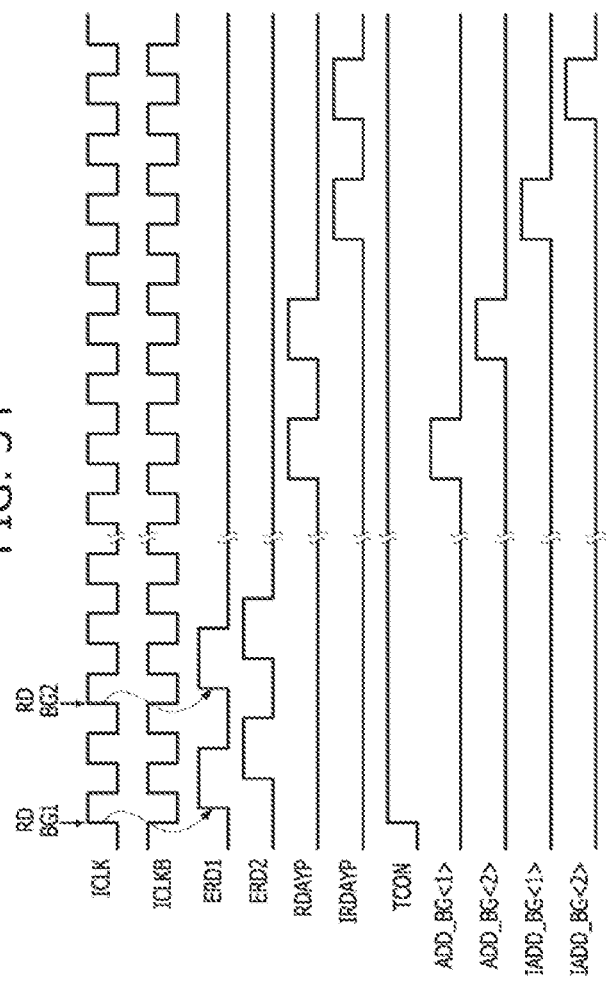
FIGS. 34 and 35 are timing diagrams illustrating operations of the semiconductor device illustrated in FIG. 16.

A read mode of the semiconductor device 200 having an aforementioned configuration will be described hereinafter with reference to FIG. 34 in conjunction with an example in which read operations of the first bank group 931 and the second bank group 932 are sequentially performed while the burst length is set to be '32' in the bank group mode.

If a command for the read operation (i.e., read command RD) of the first bank group 931 (i.e., first bank group selection signal BG1) and the second bank group 932 (i.e., second bank group selection signal BG2) is input to the read write control circuit 10, the first read command pulse ERD1 may be generated in synchronization with the internal clock signal ICLK and the second read command pulse ERD2 may be generated in synchronization with the inverted internal clock signal ICLKB. The first read command pulse ERD1 may be shifted by a period set by the read latency to provide the read column control pulse RDAYP. The read column control pulse RDAYP may be shifted by a period set to perform the column operation according to the burst length to provide the internal read column control pulse IRDAYP. If the burst length is set to be '32' in the bank group node, the transfer control signal TCON may be generated. The first bank group address ADD_BG<1> may be generated from the first read bank group selection signal RBG<1> which is generated by the transfer control signal TCON, and the second bank group address ADD_BG<2> may be generated from the second read bank group selection signal RBG<2> which is generated by the transfer control signal TCON. In addition, the first internal bank group address IADD_BG<1> may be generated from the first read bank group selection signal RBG<1> which is generated by the transfer control signal TCON, and the second internal bank group address IADD_BG<2> may be generated from the second read bank group selection signal RBG<2> which is generated by the transfer control signal TCON. The column operation for 16-bit data of the cell array included in the first bank group 931 may be performed by the read column control pulse RDAYP that occurs while the first bank group address ADD_BG<1> is generated. The column operation for 16-bit data of the cell array included in the second bank group 932 may be performed by the read column control pulse RDAYP that occurs while the second bank group address ADD_BG<2> is generated. The column operation for 16-bit data of the cell array included in the first bank group 931 may be performed by the internal read column control pulse IRDAYP that occurs while the first internal bank group address IADD_BG<1> is generated. The column operation for 16-bit data of the cell array included in the second bank group 932 may be performed by the internal read column control pulse IRDAYP that occurs while the second internal bank group address IADD_BG<2> is generated.

Figure 35:
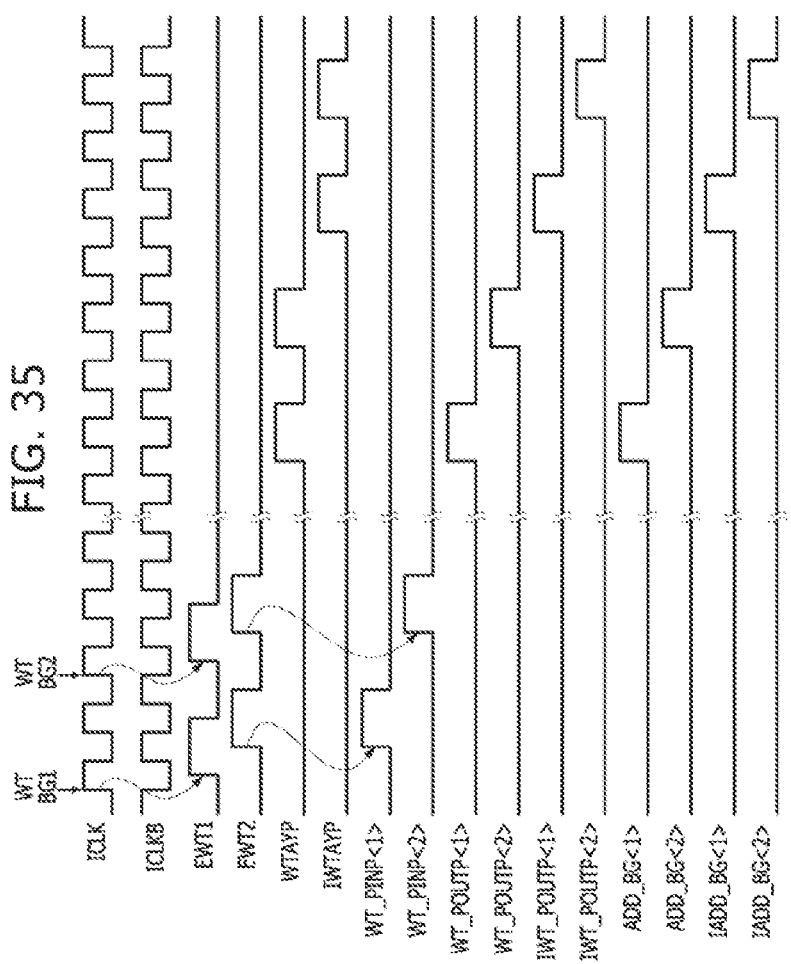

A write mode of the semiconductor device 200 having an aforementioned configuration will be described hereinafter with reference to FIG. 35 in conjunction with an example in which write operations of the first bank group 931 and the second bank group 932 are sequentially performed while the burst length is set to be '32' in the bank group mode.

If a command for the write operation (i.e., write command WT) of the first bank group 931 (i.e., first bank group selection signal BG1) and the second bank group 932 (i.e., second bank group selection signal BG2) is input to the read write control circuit 10, the first write command pulse EWT1 may be generated in synchronization with the internal clock signal ICLK and the second write command pulse EWT2 may be generated in synchronization with the inverted internal clock signal ICLKB. The first write command pulse EWT1 may be shifted by a period set by the read latency to provide the write column control pulse WTAYP. The write column control pulse WTAYP may be shifted by a period set to perform the column operation according to the burst length to provide the internal write column control pulse IWTAYP. Whenever the second write command pulse EWT2 occurs, the first write input control pulse WT_PINP<1> and the second write input control pulse WT_PINP<2> may be alternately generated. Whenever the second write command pulse EWT2 occurs after the second write command pulse EWT2 is shifted by a period set by the write latency from a point of time that the second write command pulse EWT2 occurs, the first write output control pulse WT_POUTP<1> and the second write output control pulse WT_POUTP<2> may be alternately generated. Whenever the second write command pulse EWT2 occurs after the second write command pulse EWT2 is shifted by a period set to perform the column operation according to the burst length from a point of time that the second write command pulse EWT2 occurs, the first internal write output control pulse IWT_POUTP<1> and the second internal write output control pulse IWT_POUTP<2> may be alternately generated. The first bank group address ADD_BG<1> may be generated in synchronization with the first write output control pulse WT_POUTP<1>, the second bank group address ADD_BG<2> may be generated in synchronization with the second write output control pulse WT_POUTP<2>, the first internal bank group address IADD_BG<1> may be generated in synchronization with the first internal write output control pulse IWT_POUTP<1>, and the second internal bank group address IADD_BG<2> may be generated in synchronization with the second internal write output control pulse IWT_POUTP<2>. The column operation for 16-bit data of the cell array included in the first bank group 931 may be performed by the write column control pulse WTAYP created while the first bank group address ADD_BG<1> is generated. The column operation for 16-bit data of the cell array included in the second bank group 932 may be performed by the write column control pulse WTAYP created while the second bank group address ADD_BG<2> is generated. The column operation for 16-bit data of the cell array included in the first bank group 931 may be performed by the internal write column control pulse IWTAYP created while the first internal bank group address IADD_BG<1> is generated. The column operation for 16-bit data of the cell array included in the second bank group 932 may be performed by the internal write column control pulse IWTAYP created while the second internal bank group address IADD_BG<2> is generated.

As described above, a semiconductor device according to another embodiment may generate signals for performing column operations during a read operation in a circuit realized without any pipe circuit and may generate signals for performing the column operations during a write operation in a circuit realized to include a pipe circuit. Thus, it may be possible to reduce a layout area of the semiconductor device.

Figure 36:
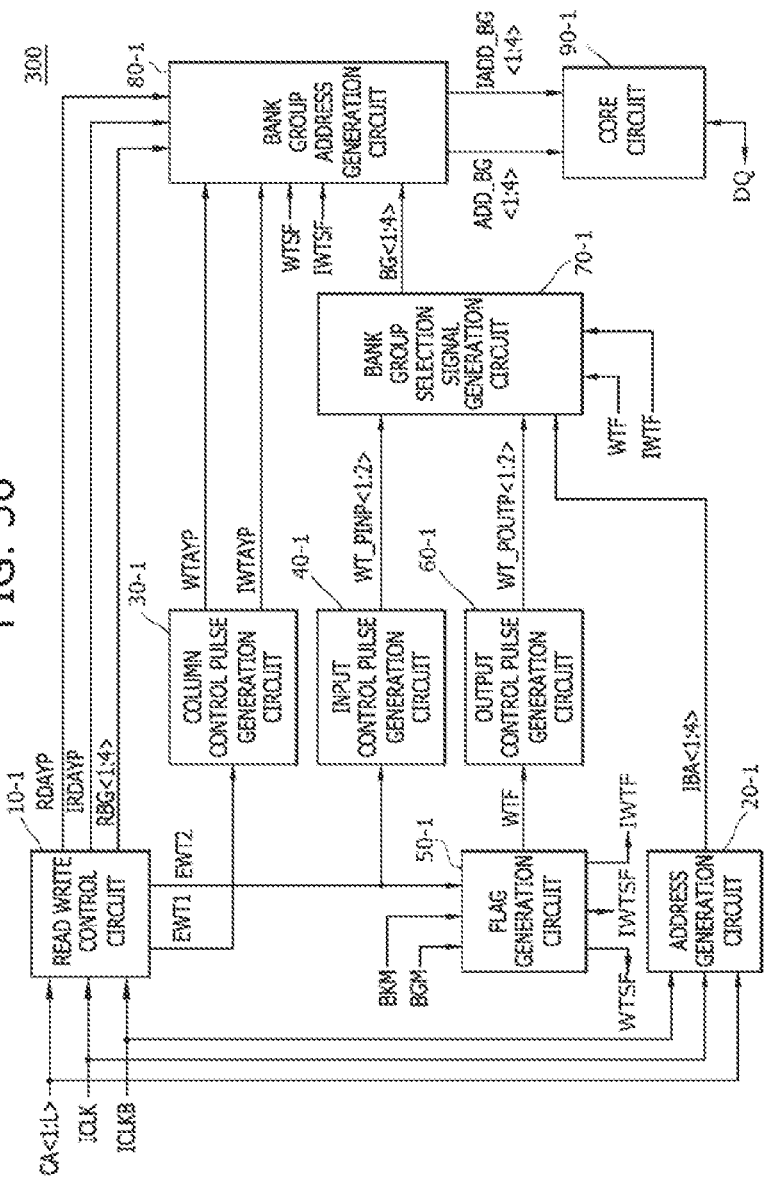
FIG. 36 is a block diagram illustrating a configuration of a semiconductor device in accordance with still another embodiment of the present disclosure.

As illustrated in FIG. 36, a semiconductor device 300 in accordance with still another embodiment of the present disclosure may include a read write control circuit 10-1, an address generation circuit 20-1, a column control pulse generation circuit 30-1, an input control pulse generation circuit 40-1, a flag generation circuit 50-1, an output control pulse generation circuit 60-1, a bank group selection signal generation circuit 70-1, a bank group address generation circuit 80-1 and a core circuit 90-1.

The read write control circuit 10-1 may generate a read column control pulse RDAYP, an internal read column control pulse IRDAYP and first to fourth read bank group selection signals RBG<1:4> in response to first to L^th external control signals CA<1:L>, an internal clock ICLK and an inverted internal clock ICLKB. The first to L^th external control signals CA<1:L> may include a command and an address which are applied from the outside of the semiconductor device 300. The internal clock ICLK may toggle in synchronization with a rising edge of a clock (not illustrated) applied from the outside of the semiconductor device 300. The inverted internal clock ICLKB may toggle in synchronization with a falling edge of the clock (not illustrated) applied from the outside of the semiconductor device 300. The bit number L of the first to L^th external control signals CA<1:L> may be variously set depending on an embodiment.

In order to perform a read operation, the read write control circuit 10-1 may generate the read column control pulse RDAYP, the internal read column control pulse IRDAYP and the first to fourth read bank group selection signals RBG<1:4>, by decoding the first to L^th external control signals CA<1:L> in synchronization with the internal clock ICLK or the inverted internal clock ICLKB. According to an embodiment, in order to perform a read operation, the read write control circuit 10-1 may generate the read column control pulse RDAYP by decoding the first to L^th external control signals CA<1:L> in synchronization with the internal clock ICLK, and then, may generate the internal read column control pulse IRDAYP by shifting the read column control pulse RDAYP in synchronization with the inverted internal clock ICLKB. The read column control pulse RDAYP may be enabled in first burst length and second burst length operations. The internal read column control pulse IRDAYP may be enabled in the second burst length operation. A first burst length may be set to a burst length of 16, and the first burst length operation may be set as an operation in which 16-bit data is successively input and output when one read operation and one write operation are performed. A second burst length may be set to a burst length of 32, and the second burst length operation may be set as an operation in which 32-bit data is successively input and output when one read operation and one write operation are performed.

In order to perform a write operation, the read write control circuit 10-1 may generate a first write command pulse EWT1 and a second write command pulse EWT2 by decoding the first to L^th external control signals CA<1:L> in synchronization with the internal clock ICLK or the inverted internal clock ICLKB. According to an embodiment, in order to perform a write operation, the read write control circuit 10-1 may generate the first write command pulse EWT1 by decoding the first to L^th external control signals CA<1:L> in synchronization with the internal clock ICLK, and then, may generate the second write command pulse EWT2 by shifting the first write command pulse EWT1 in synchronization with the inverted internal clock ICLKB.

Since the read write control circuit 10-1 is implemented by the same circuit and performs the same operation as the read write control circuit 10 illustrated in FIG. 16, detailed description for the operation thereof will be omitted herein.

The address generation circuit 20-1 may generate first to fourth bank addresses IBA<1:4> in response to the first to L^th external control signals CA<1:L>, the internal clock ICLK and the inverted internal clock ICLKB. The address generation circuit 20-1 may generate the first to fourth bank addresses IBA<1:4> by decoding the first to L^th external control signals CA<1:L> in synchronization with the internal clock ICLK or the inverted internal clock ICLKB. A logic level combination of the first to fourth bank addresses IBA<1:4> may be determined as a logic level combination of the first to L^th external control signals CA<1:L> input in synchronization with a rising edge of the internal clock ICLK or a rising edge of the inverted internal clock ICLKB.

The column control pulse generation circuit 30-1 may generate a write column control pulse WTAYP and an internal write column control pulse IWTAYP in response to the first write command pulse EWT1. The column control pulse generation circuit 30-1 may sequentially generate the write column control pulse WTAYP and the internal write column control pulse IWTAYP after a preset period elapses from a time point at which the first write command pulse EWT1 is generated. The column control pulse generation circuit 30-1 may generate the write column control pulse WTAYP by shifting the first write command pulse EWT1 by a preset period. The period during which the first write command pulse EWT1 is shifted may be set depending on a write latency. The period during which the first write command pulse EWT1 is shifted may be variously set depending on an embodiment. The column control pulse generation circuit 30-1 may generate the internal write column control pulse IWTAYP by shifting the write column control pulse WTAYP by a preset period. The period during which the write column control pulse WTAYP is shifted may be a period that is set to perform a column operation depending on a burst length. The period during which the write column control pulse WTAYP is shifted may be variously set depending on an embodiment. According to an embodiment, the column control pulse generation circuit 30-1 may be implemented to generate the write column control pulse WTAYP and the internal write column control pulse IWTAYP in response to the second write command pulse EWT2. The write column control pulse WTAYP may be enabled in the first burst length and second burst length operations. The internal write column control pulse IWTAYP may be enabled in the second burst length operation.

Since the column control pulse generation circuit 30-1 is implemented by the same circuit and performs the same operation as the column control pulse generation circuit 30 illustrated in FIG. 16, detailed description for the operation thereof will be omitted herein.

The input control pulse generation circuit 40-1 may generate first and second write input control pulses WT_PINP<1:2> in response to the second write command pulse EWT2. The input control pulse generation circuit 40-1 may alternately generate the first and second write input control pulses WT_PINP<1:2> when the second write command pulse EWT2 is generated. For example, the input control pulse generation circuit 40-1 may generate the first write input control pulse WT_PINP<1> when the second write command pulse EWT2 is generated for the first time, generate the second write input control pulse WT_PINP<2> when the second write command pulse EWT2 is generated for the second time, and generate the first write input control pulse WT_PINP<1> when the second write command pulse EWT2 is generated for the third time.

The flag generation circuit 50-1 may generate a write flag WTF, a write shifting flag WTSF, an internal write flag IWTF and an internal write shifting flag IWTSF based on the second write command pulse EWT2, a bank mode signal BKM and a bank group mode signal BGM. The flag generation circuit 50-1 may generate the write flag WTF by shifting the second write command pulse EWT2. The flag generation circuit 50-1 may generate the write shifting flag WTSF by shifting the write flag WTF in a bank mode. When the bank mode signal BKM is input, the flag generation circuit 50-1 may generate the write shifting flag WTSF by shifting the write flag WTF. The flag generation circuit 50-1 may generate the internal write flag IWTF and the internal write shifting flag IWTSF by shifting the write flag WTF in a bank group mode. When the bank group mode signal BGM is input, the flag generation circuit 50-1 may generate the internal write flag IWTF by shifting the write flag WTF and then generate the internal write shifting flag IWTSF. A period for generating the write shifting flag WTSF, the internal write flag IWTF and the internal write shifting flag IWTSF by shifting the second write command pulse EWT2 in the flag generation circuit 50-1 may be a period that is set to perform a column operation depending on a burst length. The bank mode signal BKM may be set as a signal for activating the bank mode for sequentially performing column operations on two banks included in different bank groups among banks included in bank groups. The bank mode may include an 8 bank mode and a 16 bank mode. In the 8 bank mode, column operations on two banks included in respective separate bank groups may be sequentially performed by one command. In the 16 bank mode, column operations on four banks included in respective separate bank groups may be sequentially performed by one command. The bank group mode signal BGM may be set as a signal for activating the bank group mode for performing a column operation on one bank included in a bank group. In the bank group mode, a column operation on one bank included in a bank group may be performed by one command.

The output control pulse generation circuit 60-1 may generate first and second write output control pulses WT_POUTP<1:2> in response to the write flag WTF. The output control pulse generation circuit 60-1 may alternately generate the first and second write output control pulses WT_POUTP<1:2> when the write flag WTF is generated. For example, the output control pulse generation circuit 60-1 may generate the first write output control pulse WT_POUTP<1> when the write flag WTF is generated for the first time, generate the second write output control pulse WT_POUTP<2> when the write flag WTF is generated for the second time, and generate the first write output control pulse WT_POUTP<1> when the write flag WTF is generated for the third time.

In the bank mode, the bank group selection signal generation circuit 70-1 may generate first to fourth bank group selection signals BG<1:4> in response to the first and second write input control pulses WT_PINP<1:2>, the first and second write output control pulses WT_POUTP<1:2> and the first to fourth bank addresses IBA<1:4>. In the bank mode, the bank group selection signal generation circuit 70-1 may store the first to fourth bank addresses IBA<1:4> which are input in a write operation, in response to the first and second write input control pulses WT_PINP<1:2>. In the bank mode, the bank group selection signal generation circuit 70-1 may output the stored first to fourth bank addresses IBA<1:4> as the first to fourth bank group selection signals BG<1:4> in response to the first and second write output control pulses WT_POUTP<1:2>.

In the bank group mode, the bank group selection signal generation circuit 70-1 may generate the first to fourth bank group selection signals BG<1:4> in response to the write flag WTF, the internal write flag IWTF, the first and second write input control pulses WT_PINP<1:2>, the first and second write output control pulses WT_POUTP<1:2> and the first to fourth bank addresses IBA<1:4>. In the bank group mode, the bank group selection signal generation circuit 70-1 may store the first to fourth bank addresses IBA<1:4> which are input in a write operation, in response to the first and second write input control pulses WT_PINP<1:2>. In the bank group mode, the bank group selection signal generation circuit 70-1 may output the stored first to fourth bank addresses IBA<1:4> as the first to fourth bank group selection signals BG<1:4> in response to the write flag WTF, the internal write flag IWTF and the first and second write output control pulses WT_POUTP<1:2>.

The bank group address generation circuit 80-1 may generate first to fourth bank group addresses ADD_BG<1:4> and first to fourth internal bank group addresses IADD_BG<1:4> in response to the read column control pulse RDAYP, the internal read column control pulse IRDAYP, the write column control pulse WTAYP, the internal write column control pulse IWTAYP, the write shifting flag WTSF, the internal write shifting flag IWTSF, the first to fourth read bank group selection signals RBG<1:4> and the first to fourth bank group selection signals BG<1:4>. When a read operation is performed, the bank group address generation circuit 80-1 may generate the first to fourth bank group addresses ADD_BG<1:4> and the first to fourth internal bank group addresses IADD_BG<1:4> having logic level combinations depending on a bank group on which a column operation is performed, in response to the read column control pulse RDAYP, the internal read column control pulse IRDAYP and the first to fourth read bank group selection signals RBG<1:4>. When a write operation is performed in the bank mode, the bank group address generation circuit 80-1 may generate the first to fourth bank group addresses ADD_BG<1:4> and the first to fourth internal bank group addresses IADD_BG<1:4> having logic level combinations depending on a bank group on which a column operation is performed, in response to the write column control pulse WTAYP, the internal write column control pulse IWTAYP and the first to fourth bank group selection signals BG<1:4>. When a write operation is performed in the bank group mode, the bank group address generation circuit 80-1 may generate the first to fourth bank group addresses ADD_BG<1:4> and the first to fourth internal bank group addresses IADD_BG<1:4> having logic level combinations depending on a bank group on which a column operation is performed, in response to the write shifting flag WTSF, the internal write shifting flag IWTSF and the first to fourth bank group selection signals BG<1:4>. Since the bank group address generation circuit 80-1 performs the same operation as the bank group address generation circuit 80 illustrated in FIG. 16 except that, apart from the bank group address generation circuit 80, the bank group address generation circuit 80-1 receives the write shifting flag WTSF and the internal write shifting flag IWTSF in the bank group mode, detailed description thereof will be omitted herein.

The core circuit 90-1 may input and output data DQ by performing a column operation on each bank group by the first to fourth bank group addresses ADD_BG<1:4> and the first to fourth internal bank group addresses IADD_BG<1:4>. The core circuit 90-1 may divisionally perform a column operation on a cell array included in a bank group, by the first to fourth bank group addresses ADD_BG<1:4> and the first to fourth internal bank group addresses IADD_BG<1:4>. For example, when a read operation is performed in a state in which a burst length is set to 32, a column operation on a cell array included in a bank group selected by the first to fourth read bank group selection signals RBG<1:4> may be performed by being divided into a column operation on 16-bit data DQ by the first to fourth bank group addresses ADD_BG<1:4> and a column operation on 16-bit data DQ by the first to fourth internal bank group addresses IADD_BG<1:4>. Also, when a write operation is performed in a state in which a burst length is set to 32, a column operation on a cell array included in a bank group selected by the first to fourth bank group selection signals BG<1:4> may be performed by being divided into a column operation on 16-bit data DQ by the first to fourth bank group addresses ADD_BG<1:4> and a column operation on 16-bit data DQ by the first to fourth internal bank group addresses IADD_BG<1:4>. The state in which a burst length is set to 32 means that, in the case where a column operation is performed, 32-bit data DQ is successively input and output when one read operation and one write operation are performed.

An operation of generating signals and addresses for performing a write operation and a read operation depending on the first to fourth external control signals CA<1:4> will be described below with reference to FIG. 37.

In the case where a logic level combination of the first to fourth external control signals CA<1:4> is set as A in synchronization with a rising edge of the internal clock ICLK, the first write command pulse EWT1 and the second write command pulse EWT2 for performing a write operation may be generated. The case where a logic level combination of the first to fourth external control signals CA<1:4> is A means that the first external control signal CA<1> is a logic low level and the second external control signal CA<2> and the third external control signal CA<3> are logic high levels. A logic level of the fourth external control signal CA<4> is irrelevant to the write operation. The first to fourth external control signals CA<1:4> input in synchronization with a falling edge of the internal clock ICLK after a command pulse for the write operation is generated may be generated as the first to fourth bank addresses IBA<1:4> for the write operation.

In the case where a logic level combination of the first to fourth external control signals CA<1:4> is set as B in synchronization with a rising edge of the internal clock ICLK, the read column control pulse RDAYP and the internal read column control pulse IRDAYP for performing a read operation may be generated. The case where a logic level combination of the first to fourth external control signals CA<1:4> is B means that the first external control signal CA<1> is a logic high level and the second external control signal CA<2> is a logic low level. Logic levels of the third and fourth external control signals CA<3:4> are irrelevant to the read operation. The first to fourth external control signals CA<1:4> input in synchronization with a falling edge of the internal clock ICLK after the read column control pulse RDAYP and the internal read column control pulse IRDAYP for the read operation are generated may be generated as the first to fourth read bank group selection signals RBG<1:4> for the read operation.

Figure 38:
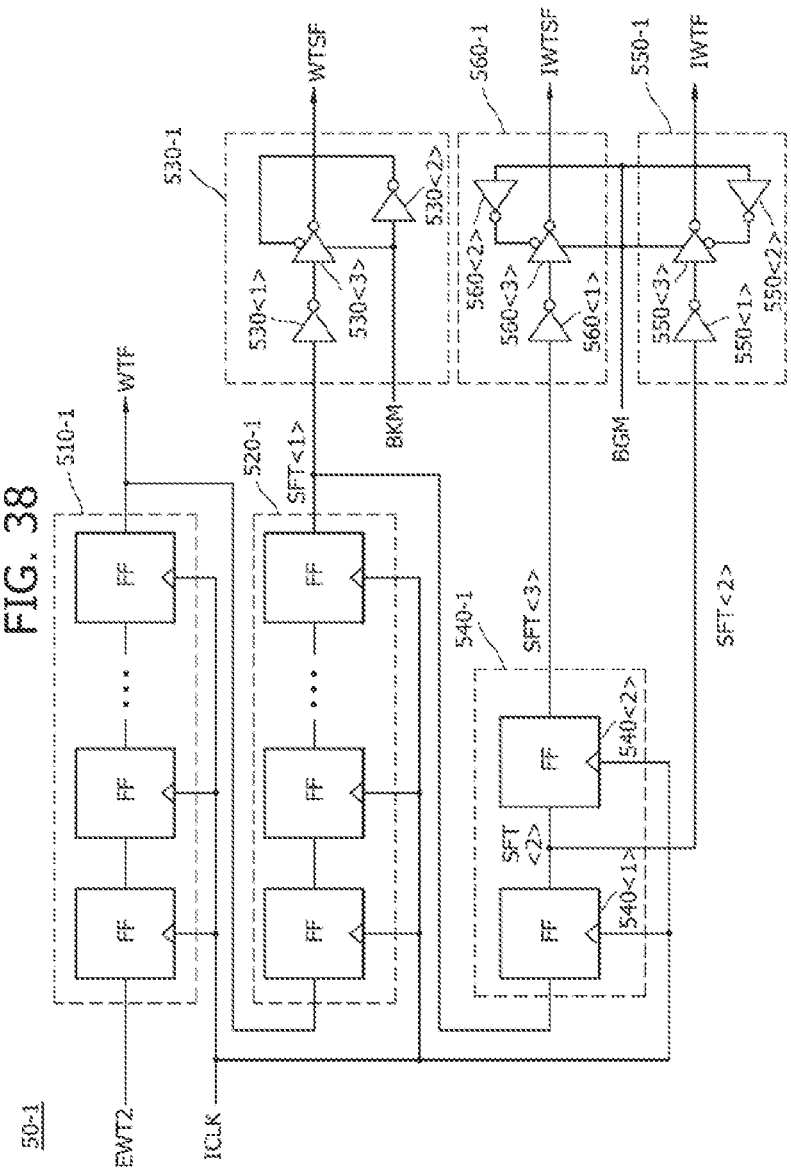
FIG. 38 is a circuit diagram illustrating a configuration of an embodiment of a flag generation circuit included in the semiconductor device illustrated in FIG. 36.

Referring to FIG. 38, the flag generation circuit 50-1 may include a first shifting circuit 510-1, a second shifting circuit 520-1, a first buffer circuit 530-1, a third shifting circuit 540-1, a second buffer circuit 550-1 and a third buffer circuit 560-1.

The first shifting circuit 510-1 may include a plurality of flip-flops FF which are coupled in series. The first shifting circuit 510-1 may generate the write flag WTF by shifting the second write command pulse EWT2 in synchronization with the internal clock ICLK. A shifting amount of the first shifting circuit 510-1 may be variously set depending on an embodiment.

The second shifting circuit 520-1 may include a plurality of flip-flops FF which are coupled in series. The second shifting circuit 520-1 may generate a first shifting signal SFT<1> by shifting the write flag WTF in synchronization with the internal clock ICLK. A shifting amount of the second shifting circuit 520-1 may be variously set depending on an embodiment.

The first buffer circuit 530-1 may be implemented by inverters 530<1>, 530<2> and 530<3>. The first buffer circuit 530-1 may generate the write shifting flag WTSF from the first shifting signal SFT<1> in response to the bank mode signal BKM. When the bank mode signal BKM is input at a logic high level, the first buffer circuit 530-1 may generate the write shifting flag WTSF by buffering the first shifting signal SFT<1>.

The third shifting circuit 540-1 may include flip-flops 540<1> and 540<2> which are coupled in series. The flip-flop 540<1> may generate a second shifting signal SFT<2> by shifting the first shifting signal SFT<1> in synchronization with the internal clock ICLK. The flip-flop 540<2> may generate a third shifting signal SFT<3> by shifting the second shifting signal SFT<2> in synchronization with the internal clock ICLK. The third shifting circuit 540-1 may generate the third shifting signal SFT<3> after generating the second shifting signal SFT<2> by shifting the first shifting signal SFT<1> in synchronization with the internal clock ICLK.

The second buffer circuit 550-1 may be implemented by inverters 550<1>, 550<2> and 550<3>. The second buffer circuit 550-1 may generate the internal write flag IWTF from the second shifting signal SFT<2> in response to the bank group mode signal BGM. When the bank group mode signal BGM is input at a logic high level, the second buffer circuit 550-1 may generate the internal write flag IWTF by buffering the second shifting signal SFT<2>.

The third buffer circuit 560-1 may be implemented by inverters 560<1>, 560<2> and 560<3>. The third buffer circuit 560-1 may generate the internal write shifting flag IWTSF from the third shifting signal SFT<3> in response to the bank group mode signal BGM. When the bank group mode signal BGM is input at a logic high level, the third buffer circuit 560-1 may generate the internal write shifting flag IWTSF by buffering the third shifting signal SFT<3>.

Figure 39:
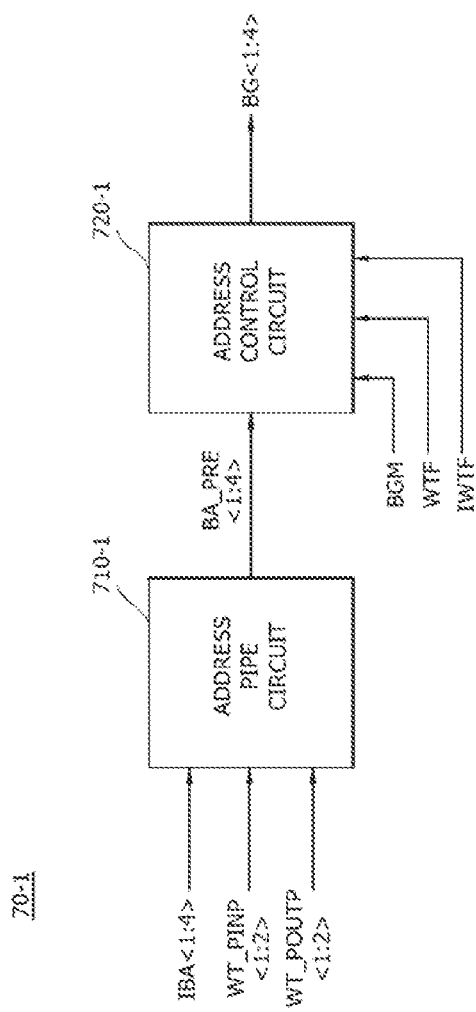
FIG. 39 is a block diagram illustrating a configuration of an embodiment of a bank group selection signal generation circuit included in the semiconductor device illustrated in FIG. 36.

Referring to FIG. 39, the bank group selection signal generation circuit 70-1 may include an address pipe circuit 710-1 and an address control circuit 720-1.

The address pipe circuit 710-1 may store the first to fourth bank addresses IBA<1:4> in response to the first and second input control pulses WT_PINP<1:2>. The address pipe circuit 710-1 may generate first to fourth pre-bank group selection signals BA_PRE<1:4> from the stored first to fourth bank addresses IBA<1:4> in response to the first and second output control pulses WT_POUTP<1:2>. The address pipe circuit 710-1 may be implemented by a pipe circuit including a plurality of pipes.

In the bank mode, the address control circuit 720-1 may generate the first to fourth bank group selection signals BG<1:4> from the first to fourth pre-bank group selection signals BA_PRE<1:4>. In the bank group mode, the address control circuit 720-1 may generate the first to fourth bank group selection signals BG<1:4> from the first to fourth pre-bank group selection signals BA_PRE<1:4> depending on logic levels of the bank group mode signal BGM, the write flag WTF and the internal write flag IWTF.

Figure 40:
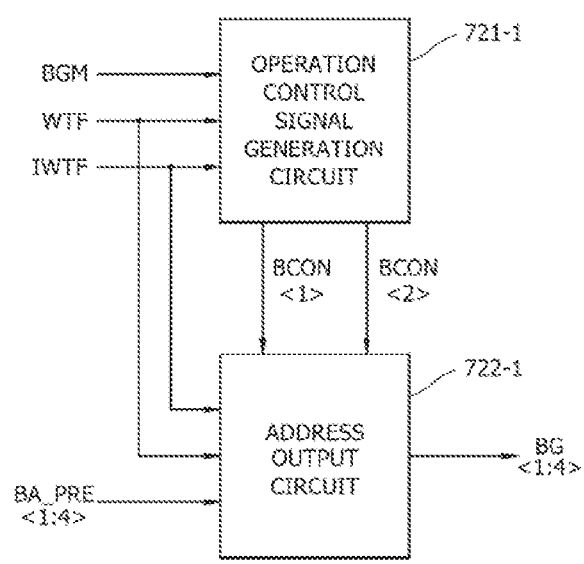
FIG. 40 is a block diagram illustrating a configuration of an embodiment of an address control circuit included in the bank group selection signal generation circuit illustrated in FIG. 39.

Referring to FIG. 40, the address control circuit 720-1 may include an operation control signal generation circuit 721-1 and an address output circuit 722-1.

In the bank group mode, the operation control signal generation circuit 721-1 may generate a first operation control signal BCON<1> and a second operation control signal BCON<2> depending on logic levels of the bank group mode signal BGM, the write flag WTF and the internal write flag IWTF. In the bank group mode, the operation control signal generation circuit 721-1 may generate the first operation control signal BCON<1> which is enabled when the bank group mode signal BGM and the write flag WTF are input. In the bank group mode, the operation control signal generation circuit 721-1 may generate the first operation control signal BCON<1> which is disabled when the internal write flag IWTF is input. In the bank group mode, the operation control signal generation circuit 721-1 may generate the second operation control signal BC0N<2> which is enabled when the bank group mode signal BGM and the first operation control signal BCON<1> are input. In the bank group mode, the operation control signal generation circuit 721-1 may generate the second operation control signal BCON<2> which is disabled when the internal write flag IWTF is input.

In the bank mode, the address output circuit 722-1 may generate the first to fourth bank group selection signals BG<1:4> from the first to fourth pre-bank group selection signals BA_PRE<1:4>. In the bank group mode, the address output circuit 722-1 may generate the first to fourth bank group selection signals BG<1:4> from the first to fourth pre-bank group selection signals BA_PRE<1:4> depending on logic levels of the first operation control signal BCON<1>, the second operation control signal BCON<2>, the write flag WTF and the internal write flag IWTF.

Figure 41:
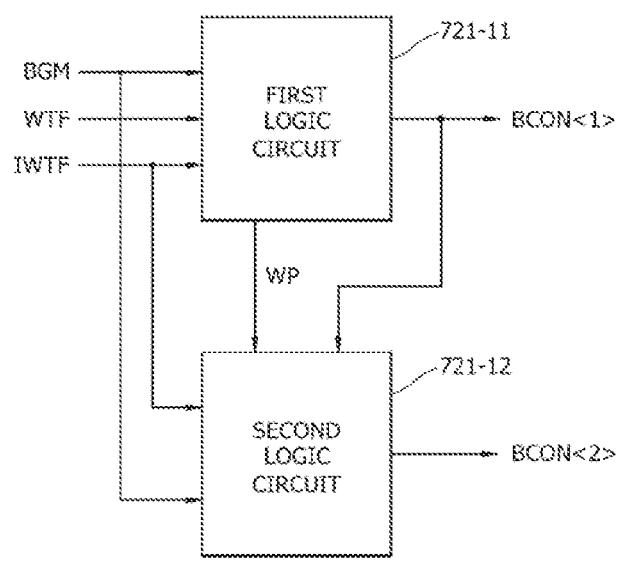
FIG. 41 is a block diagram illustrating a configuration of an embodiment of an operation control signal generation circuit included in the address control circuit illustrated in FIG. 40.

Referring to FIG. 41, the operation control signal generation circuit 721-1 may include a first logic circuit 721-11 and a second logic circuit 721-12.

The first logic circuit 721-11 may generate a write pulse WP which is enabled in response to the bank group mode signal BGM and the write flag WTF. The first logic circuit 721-11 may generate the first operation control signal BCON<1> which is enabled in response to the bank group mode signal BGM and the write flag WTF. The first logic circuit 721-11 may generate the first operation control signal BCON<1> which is disabled in response to the internal write flag IWTF.

The second logic circuit 721-12 may generate the second operation control signal BCON<2> which is enabled in response to the write pulse WP, the bank group mode signal BGM and the first operation control signal BCON<1>. The second logic circuit 721-12 may generate the second operation control signal BCON<2> which is disabled in response to the internal write flag IWTF after the first operation control signal BCON<1> is input.

Figure 42:
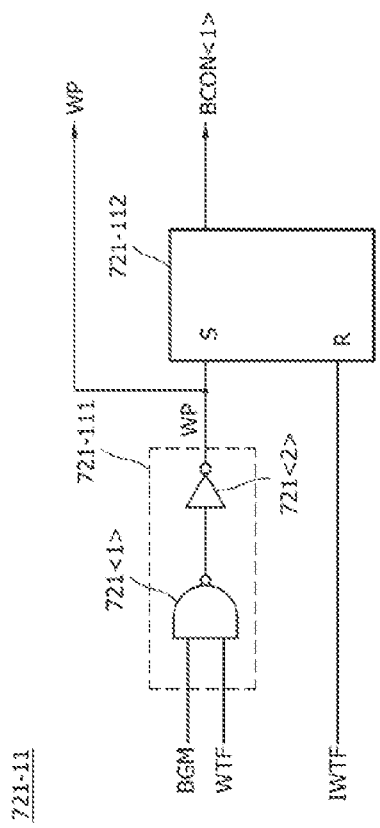
FIG. 42 is a circuit diagram illustrating a configuration of an embodiment of a first logic circuit included in the operation control signal generation circuit illustrated in FIG. 41.

Referring to FIG. 42, the first logic circuit 721-11 may include a write pulse generation circuit 721-111 and a first operation control signal generation circuit 721-112.

The write pulse generation circuits 721-111 may be implemented by a NAND gate 721<1> and an inverter 721<2>. The write pulse generation circuit 721-111 may generate the write pulse WP from the write flag WTF during a period in which the bank group mode signal BGM is enabled. The write pulse generation circuit 721-111 may generate the write pulse WP which is enabled to a logic high level when the write flag WTF is input at a logic high level during a period in which the bank group mode signal BGM is input at a logic high level. The write pulse generation circuit 721-111 may generate the write pulse WP by performing an AND operation on the bank group mode signal BGM and the write flag WTF.

The first operation control signal generation circuit 721-112 may be implemented by an SR latch. The first operation control signal generation circuit 721-112 may generate the first operation control signal BCON<1> which is enabled in response to the write pulse WP. The first operation control signal generation circuit 721-112 may generate the first operation control signal BCON<1> which is disabled in response to the internal write flag IWTF. The first operation control signal generation circuit 721-112 may generate the first operation control signal BCON<1> which is enabled to a logic high level when the write pulse WP is input at a logic high level. The first operation control signal generation circuit 721-112 may generate the first operation control signal BCON<1> which is disabled to a logic low level when the internal write flag IWTF is input at a logic low level.

Figure 43:
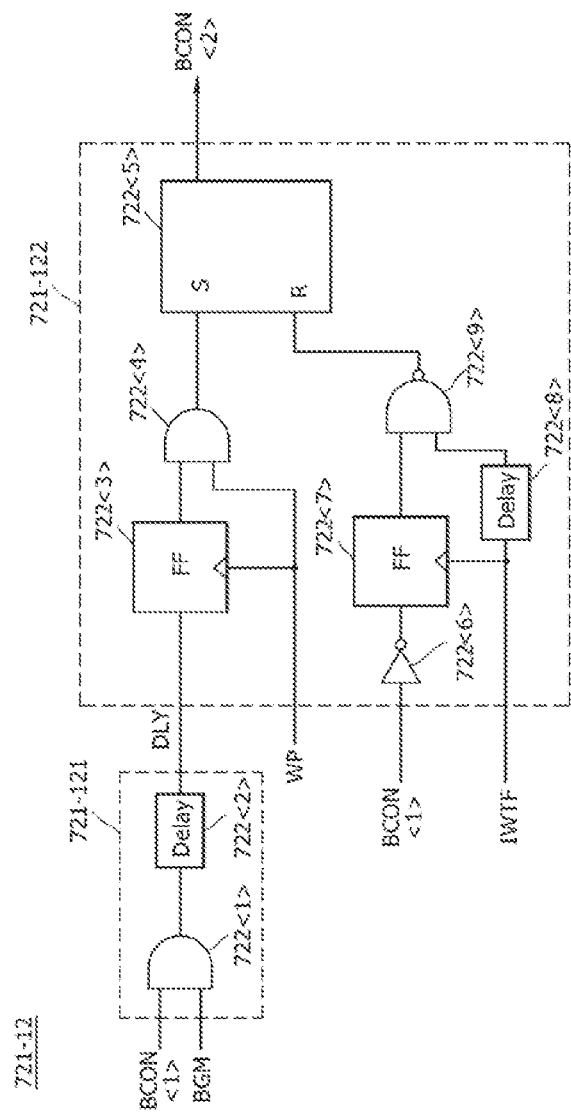
FIG. 43 is a circuit diagram illustrating a configuration of an embodiment of a second logic circuit included in the operation control signal generation circuit illustrated in FIG. 41.

Referring to FIG. 43, the second logic circuit 721-12 may include a delay signal generation circuit 721-121 and a second operation control signal generation circuit 721-122.

The delay signal generation circuit 721-121 may be implemented by an AND gate 722<1> and a delay circuit 722<2>. The delay signal generation circuit 721-121 may generate a delay signal DLY by delaying the first operation control signal BCON<1> during a period in which the bank group mode signal BGM is enabled to a logic high level.

The second operation control signal generation circuit 721-122 may be implemented by a flip-flop 722<3>, an AND gate 722<4>, an SR latch 722<5>, an inverter 722<6>, a flip-flop 722<7>, a delay circuit 722<8> and a NAND gate 722<9>. The second operation control signal generation circuit 721-122 may generate the second operation control signal BCON<2> which is enabled in response to the delay signal DLY in synchronization with the write pulse WP. The second operation control signal generation circuit 721-122 may generate the second operation control signal BCON<2> which is enabled to a logic high level when the delay signal DLY is input at a logic high level during a period in which the write pulse WP is input at a logic high level. The second operation control signal generation circuit 721-122 may generate the second operation control signal BCON<2> which is disabled to a logic low level after the first operation control signal BCON<1> and the internal write flag IWTF are input. The second operation control signal generation circuit 721-122 may generate the second operation control signal BCON<2> which is disabled to a logic low level after the first operation control signal BCON<1> is input at a logic low level and the internal write flag IWTF having a logic high level is delayed by the delay circuit 722<8>.

Figure 44:
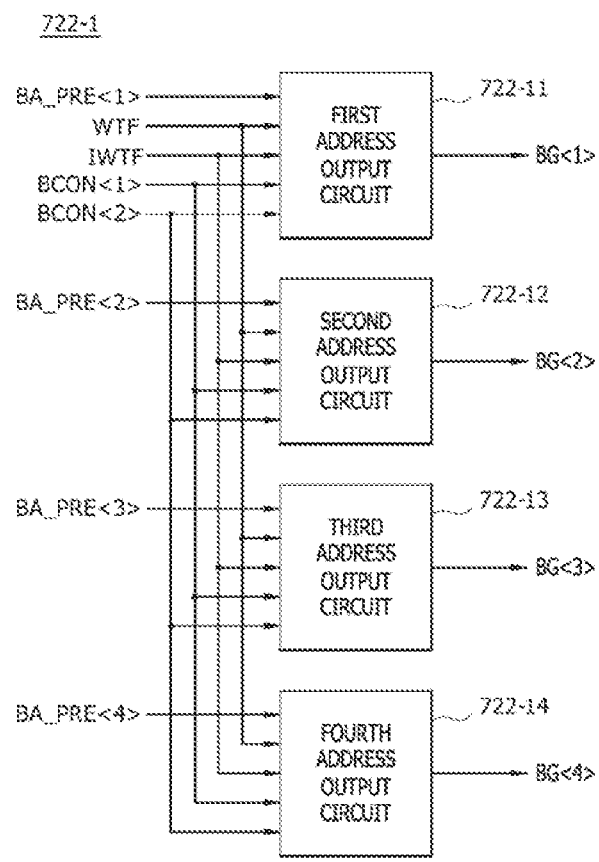
FIG. 44 is a block diagram illustrating a configuration of an embodiment of an address output circuit included in the address control circuit illustrated in FIG. 40.

Referring to FIG. 44, the address output circuit 722-1 may include a first address output circuit 722-11, a second address output circuit 722-12, a third address output circuit 722-13 and a fourth address output circuit 722-14.

In the bank mode, the first address output circuit 722-11 may generate the first bank group selection signal BG<1> from the first pre-bank group selection signal BA_PRE<1> in response to the write flag WTF. In the bank group mode, the first address output circuit 722-11 may generate the first bank group selection signal BG<1> from the first pre-bank group selection signal BA_PRE<1> depending on logic levels of the first operation control signal BCON<1>, the second operation control signal BCON<2>, the write flag WTF and the internal write flag IWTF.

In the bank mode, the second address output circuit 722-12 may generate the second bank group selection signal BG<2> from the second pre-bank group selection signal BA_PRE<2> in response to the write flag WTF. In the bank group mode, the second address output circuit 722-12 may generate the second bank group selection signal BG<2> from the second pre-bank group selection signal BA_PRE<2> depending on logic levels of the first operation control signal BCON<1>, the second operation control signal BCON<2>, the write flag WTF and the internal write flag IWTF.

In the bank mode, the third address output circuit 722-13 may generate the third bank group selection signal BG<3> from the third pre-bank group selection signal BA_PRE<3> in response to the write flag WTF. In the bank group mode, the third address output circuit 722-13 may generate the third bank group selection signal BG<3> from the third pre-bank group selection signal BA_PRE<3> depending on logic levels of the first operation control signal BCON<1>, the second operation control signal BCON<2>, the write flag WTF and the internal write flag IWTF.

In the bank mode, the fourth address output circuit 722-14 may generate the fourth bank group selection signal BG<4> from the fourth pre-bank group selection signal BA_PRE<4> in response to the write flag WTF. In the bank group mode, the fourth address output circuit 722-14 may generate the fourth bank group selection signal BG<4> from the fourth pre-bank group selection signal BA_PRE<4> depending on logic levels of the first operation control signal BCON<1>, the second operation control signal BCON<2>, the write flag WTF and the internal write flag IWTF.

Figure 45:
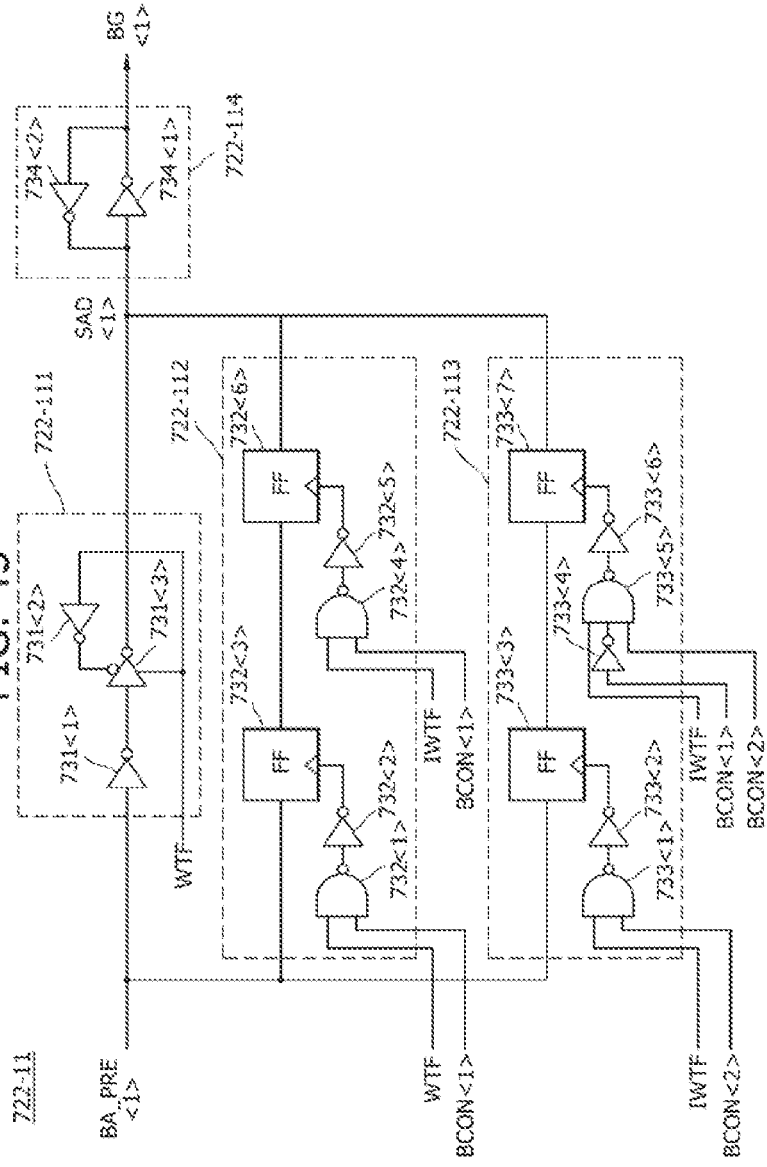
FIG. 45 is a circuit diagram illustrating a configuration of an embodiment of a first address output circuit included in the address output circuit illustrated in FIG. 44.

Referring to FIG. 45, the first address output circuit 722-11 may include a first address transfer circuit 722-111, a second address transfer circuit 722-112, a third address transfer circuit 722-113 and a latch circuit 722-114.

The first address transfer circuit 722-111 may be implemented by inverters 731<1>, 731<2> and 731<3>. When the write flag WTF is input at a logic high level, the first address transfer circuit 722-111 may generate a first storage address SAD<1> by buffering the first pre-bank group selection signal BA_PRE<1>.

The second address transfer circuit 722-112 may be implemented by a NAND gate 732<1>, an inverter 732<2>, a flip-flop 732<3>, a NAND gate 732<4>, an inverter 732<5> and a flip-flop 732<6>. The NAND gate 732<1>, the inverter 732<2> and the flip-flop 732<3> may receive and output the first pre-bank group selection signal BA_PRE<1> when the write flag WTF is input at a logic high level and the first operation control signal BCON<1> is input at a logic high level. The NAND gate 732<4>, the inverter 732<5> and the flip-flop 732<6> may output the first pre-bank group selection signal BA_PRE<1>, input through the flip-flop 732<3>, as the first storage address SAD<1> when the internal write flag IWTF is input at a logic high level and the first operation control signal BCON<1> is input at a logic high level.

The third address transfer circuit 722-113 may be implemented by a NAND gate 733<1>, an inverter 733<2>, a flip-flop 733<3>, an inverter 733<4>, a NAND gate 733<5>, an inverter 733<6> and a flip-flop 733<7>. The NAND gate 733<1>, the inverter 733<2> and the flip-flop 733<3> may receive and output the first pre-bank group selection signal BA_PRE<1> when the internal write flag IWTF is input at a logic high level and the second operation control signal BCON<2> is input at a logic high level. The inverter 733<4>, the NAND gate 733<5>, the inverter 733<6> and the flip-flop 733<7> may output the first pre-bank group selection signal BA_PRE<1>, input through the flip-flop 733<3>, as the first storage address SAD<1> when the internal write flag IWTF is input at a logic high level, the first operation control signal BCON<1> is input at a logic low level and the second operation control signal BCON<2> is input at a logic high level.

The latch circuit 722-114 may be implemented by inverters 734<1> and 734<2>. The latch circuit 722-114 may latch the first storage address SAD<1>. The latch circuit 722-114 may invert and buffer the latched first storage address SAD<1> and output the first bank group selection signal BG<1>.

Since each of the second address output circuit 722-12, the third address output circuit 722-13 and the fourth address output circuit 722-14 illustrated in FIG. 44 is implemented by the same circuit and performs the same operation as the first address output circuit 722-11 illustrated in FIG. 45 except that only input and output signals are different, detailed description thereof will be omitted herein.

Figure 46:
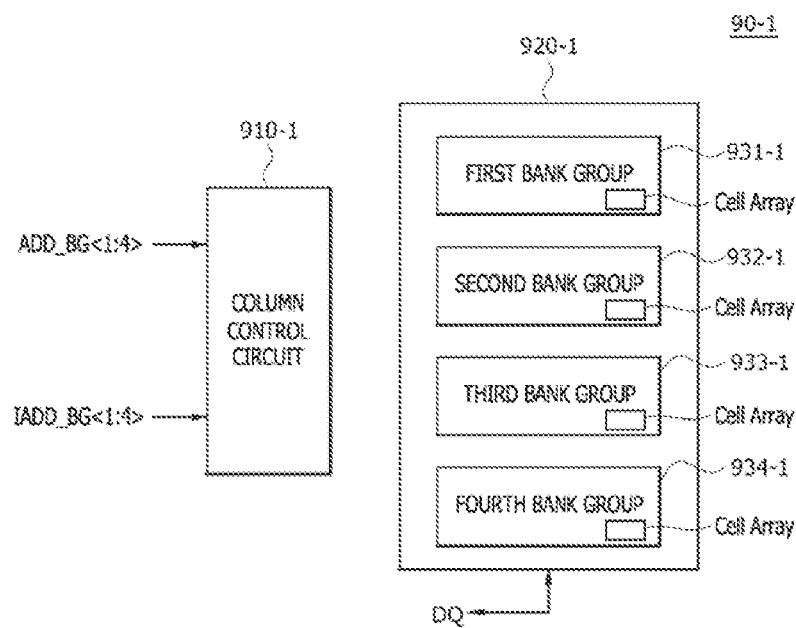
FIG. 46 is a block diagram illustrating a configuration of an embodiment of a core circuit included in the semiconductor device illustrated in FIG. 36.

Referring to FIG. 46, the core circuit 90-1 may include a column control circuit 910-1 and a memory cell 920-1.

The column control circuit 910-1 may control column operations on cell arrays included in a first bank group 931-1, a second bank group 932-1, a third bank group 933-1 and a fourth bank group 934-1 included in the memory cell 920-1, in response to the first to fourth bank group addresses ADD_BG<1:4> and the first to fourth internal bank group addresses IADD_BG<1:4>.

When the first bank group address ADD_BG<1> and the first internal bank group address IADD_BG<1> are sequentially enabled, the column control circuit 910-1 may control column operations on the cell array included in the first bank group 931-1 so that the column operations are sequentially performed. For example, the column control circuit 910-1 may perform a column operation on 16-bit data DQ of the cell array, included in the first bank group 931-1, by the first bank group address ADD_BG<1> which is enabled in a state in which a burst length is set to 32, and may perform a column operation on 16-bit data DQ of the cell array, included in the first bank group 931-1, by the first internal bank group address IADD_BG<1> which is enabled after a preset period elapses.

When the second bank group address ADD_BG<2> and the second internal bank group address IADD_BG<2> are sequentially enabled, the column control circuit 910-1 may control column operations on the cell array included in the second bank group 932-1 so that the column operations are sequentially performed. For example, the column control circuit 910-1 may perform a column operation on 16-bit data DQ of the cell array, included in the second bank group 932-1, by the second bank group address ADD_BG<2> which is enabled in a state in which a burst length is set to 32, and may perform a column operation on 16-bit data DQ of the cell array, included in the second bank group 932-1, by the second internal bank group address IADD_BG<2> which is enabled after a preset period elapses.

When the third bank group address ADD_BG<3> and the third internal bank group address IADD_BG<3> are sequentially enabled, the column control circuit 910-1 may control column operations on the cell array included in the third bank group 933-1 so that the column operations are sequentially performed. For example, the column control circuit 910-1 may perform a column operation on 16-bit data DQ of the cell array, included in the third bank group 933-1, by the third bank group address ADD_BG<3> which is enabled in a state in which a burst length is set to 32, and may perform a column operation on 16-bit data DQ of the cell array, included in the third bank group 933-1, by the third internal bank group address IADD_BG<3> which is enabled after a preset period elapses.

When the fourth bank group address ADD_BG<4> and the fourth internal bank group address IADD_BG<4> are sequentially enabled, the column control circuit 910-1 may control column operations on the cell array included in the fourth bank group 934-1 so that the column operations are sequentially performed. For example, the column control circuit 910-1 may perform a column operation on 16-bit data DQ of the cell array, included in the fourth bank group 934-1, by the fourth bank group address ADD_BG<4> which is enabled in a state in which a burst length is set to 32, and may perform a column operation on 16-bit data DQ of the cell array, included in the fourth bank group 934-1, by the fourth internal bank group address IADD_BG<4> which is enabled after a preset period elapses.

In order to control the column operations on the cell arrays, included in the first bank group 931-1, the second bank group 932-1, the third bank group 933-1 and the fourth bank group 934-1 included in the memory cell 920-1, in response to the first to fourth bank group addresses ADD_BG<1:4> and the first to fourth internal bank group addresses IADD_BG<1:4>, the column control circuit 910-1 may include various circuits. For example, a circuit for selecting each of the cell arrays included in the first bank group 931-1, the second bank group 932-1, the third bank group 933-1 and the fourth bank group 934-1 by the first to fourth bank group addresses ADD_BG<1:4> and the first to fourth internal bank group addresses IADD_BG<1:4>, a circuit for selecting and outputting, by 16 bits, the data DQ included in each cell array, a circuit for outputting the data DQ, output from each cell array, to a data pad through a data path, and so forth may be included. Since the circuit for selecting a cell array, the circuit which controls the output of the data DQ by bits determined by a burst length, the circuit which outputs the data DQ, output from each cell array, to the data pad through the data path, and so forth may be implemented by circuits known in the art, description of detailed circuits will be omitted herein.

Figure 47:
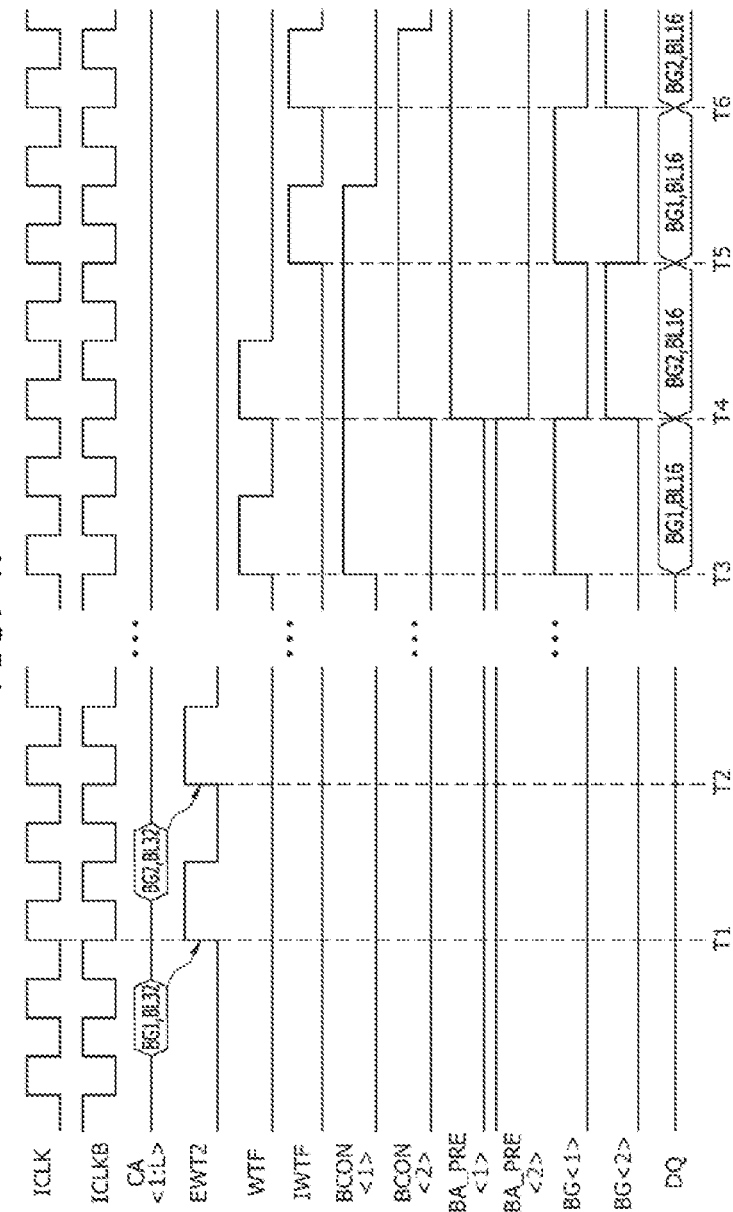
FIGS. 47, 48, and 49 are timing diagrams to assist in the explanation of the operation of the semiconductor device illustrated in FIG. 36.

A write operation of the semiconductor device 300 in accordance with the embodiment of the present disclosure will be described below with reference to FIG. 47, by taking an example in which, in the bank group mode, a column operation BG1,BL32 of a second burst length on a first bank group is performed and a column operation BG2,BL32 of the second burst length on a second bank group is performed.

At a time point T1, the read write control circuit 10-1 generates a first pulse of the second write command pulse EWT2 in order to perform a write operation, by decoding the first to L^th external control signals CA<1:L> in synchronization with the internal clock ICLK or the inverted internal clock ICLKB. The first to L^th external control signals CA<1:L> have a logic level combination for performing a column operation of a second burst length BL32 on a first bank group BG1 in the bank group mode.

The address generation circuit 20-1 generates the first to fourth bank addresses IBA<1:4> by decoding the first to L^th external control signals CA<1:L> in synchronization with the internal clock ICLK or the inverted internal clock ICLKB.

The input control pulse generation circuit 40-1 generates the first write input control pulse WT_PINP<1> in response to the first pulse of the second write command pulse EWT2.

The bank group selection signal generation circuit 70-1 stores the first to fourth bank addresses IBA<1:4> in response to the first write input control pulse WT_PINP<1>.

At a time point T2, the read write control circuit 10-1 generates a second pulse of the second write command pulse EWT2 in order to perform a write operation, by decoding the first to L^th external control signals CA<1:L> in synchronization with the internal clock ICLK or the inverted internal clock ICLKB. The first to L^th external control signals CA<1:L> have a logic level combination for performing a column operation of the second burst length BL32 on a second bank group BG2 in the bank group mode.

The address generation circuit 20-1 generates the first to fourth bank addresses IBA<1:4> by decoding the first to L^th external control signals CA<1:L> in synchronization with the internal clock ICLK or the inverted internal clock ICLKB.

The input control pulse generation circuit 40-1 generates the second write input control pulse WT_PINP<2> in response to the second pulse of the second write command pulse EWT2.

The bank group selection signal generation circuit 70-1 stores the first to fourth bank addresses IBA<1:4> in response to the second write input control pulse WT_PINP<2>.

At a time point T3, the flag generation circuit 50-1 generates a first pulse of the write flag WTF based on the first pulse of the second write command pulse EWT2, the bank mode signal BKM and the bank group mode signal BGM.

The output control pulse generation circuit 60-1 generates the first write output control pulse WT_POUTP<1> in response to the first pulse of the write flag WTF.

The operation control signal generation circuit 721-1 of the address control circuit 720-1 generates the first operation control signal BCON<1> which is enabled to a logic high level by the bank group mode signal BGM and the first pulse of the write flag WTF.

The address output circuit 722-1 of the address control circuit 720-1 generates the first bank group selection signal BG<1> having a logic high level and the second bank group selection signal BG<2> having a logic low level from the first and second pre-bank group selection signals BA_PRE<1:2> according to the write flag WTF having a logic high level. The first and second pre-bank group selection signals BA_PRE<1:2> are generated from the first and second bank addresses IBA<1:2> generated at the time point T1. The first pre-bank group selection signal BA_PRE<1> is generated at a logic low level, and the second pre-bank group selection signal BA_PRE<2> is generated at a logic high level.

The bank group address generation circuit 80-1 generates the first and second bank group addresses ADD_BG<1:2> in response to the first and second bank group selection signals BG<1:2>.

The first bank group 931-1 included in the core circuit 90-1 performs a column operation of a first burst length BL16 in response to the first bank group address ADD_BG<1>.

At a time point T4, the flag generation circuit 50-1 generates a second pulse of the write flag WTF based on the first pulse of the second write command pulse EWT2, the bank mode signal BKM and the bank group mode signal BGM.

The output control pulse generation circuit 60-1 generates the second write output control pulse WT_POUTP<2> in response to the second pulse of the write flag WTF.

The operation control signal generation circuit 721-1 of the address control circuit 720-1 generates the first operation control signal BCON<1> which is enabled to a logic high level by the bank group mode signal BGM and the second pulse of the write flag WTF. The operation control signal generation circuit 721-1 of the address control circuit 720-1 generates the second operation control signal BCON<2> having a logic high level by the first operation control signal BCON<1> generated at the time point T3.

The address output circuit 722-1 of the address control circuit 720-1 generates the first bank group selection signal BG<1> having a logic low level and the second bank group selection signal BG<2> having a logic high level from the first and second pre-bank group selection signals BA_PRE<1:2> according to the write flag WTF having a logic high level. The first and second pre-bank group selection signals BA_PRE<1:2> are generated from the first and second bank addresses IBA<1:2> generated at the time point T2. The first pre-bank group selection signal BA_PRE<1> is generated at a logic high level, and the second pre-bank group selection signal BA_PRE<2> is generated at a logic low level.

The bank group address generation circuit 80-1 generates the first and second bank group addresses ADD_BG<1:2> in response to the first and second bank group selection signals BG<1:2>.

The second bank group 932-1 included in the core circuit 90-1 performs a column operation of the first burst length BL16 in response to the second bank group address ADD_BG<2>.

At a time point T5, the flag generation circuit 50-1 generates a first pulse of the internal write flag IWTF by shifting the write flag WTF generated at the time point T3.

The address output circuit 722-1 of the address control circuit 720-1 generates the first bank group selection signal BG<1> having a logic high level and the second bank group selection signal BG<2> having a logic low level from the first and second pre-bank group selection signals BA_PRE<1:2>, input at the time point T3, according to the internal write flag IWTF having a logic high level.

The bank group address generation circuit 80-1 generates the first and second internal bank group addresses IADD_BG<1:2> in response to the first and second bank group selection signals BG<1:2>.

The first bank group 931-1 included in the core circuit 90-1 performs a column operation of the remaining first burst length BL16 in response to the first internal bank group address IADD_BG<1>. That is to say, by performing the column operation of the first burst length BL16 of the time point T3 and the column operation of the first burst length BL16 of the time point T5, the first bank group 931-1 performs a column operation of the second burst length BL32.

At a time point T6, the flag generation circuit 50-1 generates a second pulse of the internal write flag IWTF by shifting the write flag WTF generated at the time point T4.

The address output circuit 722-1 of the address control circuit 720-1 generates the first bank group selection signal BG<1> having a logic low level and the second bank group selection signal BG<2> having a logic high level from the first and second pre-bank group selection signals BA_PRE<1:2>, input at the time point T4, according to the internal write flag IWTF having a logic high level.

The bank group address generation circuit 80-1 generates the first and second internal bank group addresses IADD_BG<1:2> in response to the first and second bank group selection signals BG<1:2>.

The second bank group 932-1 included in the core circuit 90-1 performs a column operation of the remaining first burst length BL16 in response to the second internal bank group address IADD_BG<2>. That is to say, by performing the column operation of the first burst length BL16 of the time point T4 and the column operation of the first burst length BL16 of the time point T6, the second bank group 932-1 performs a column operation of the second burst length BL32.

Figure 48:
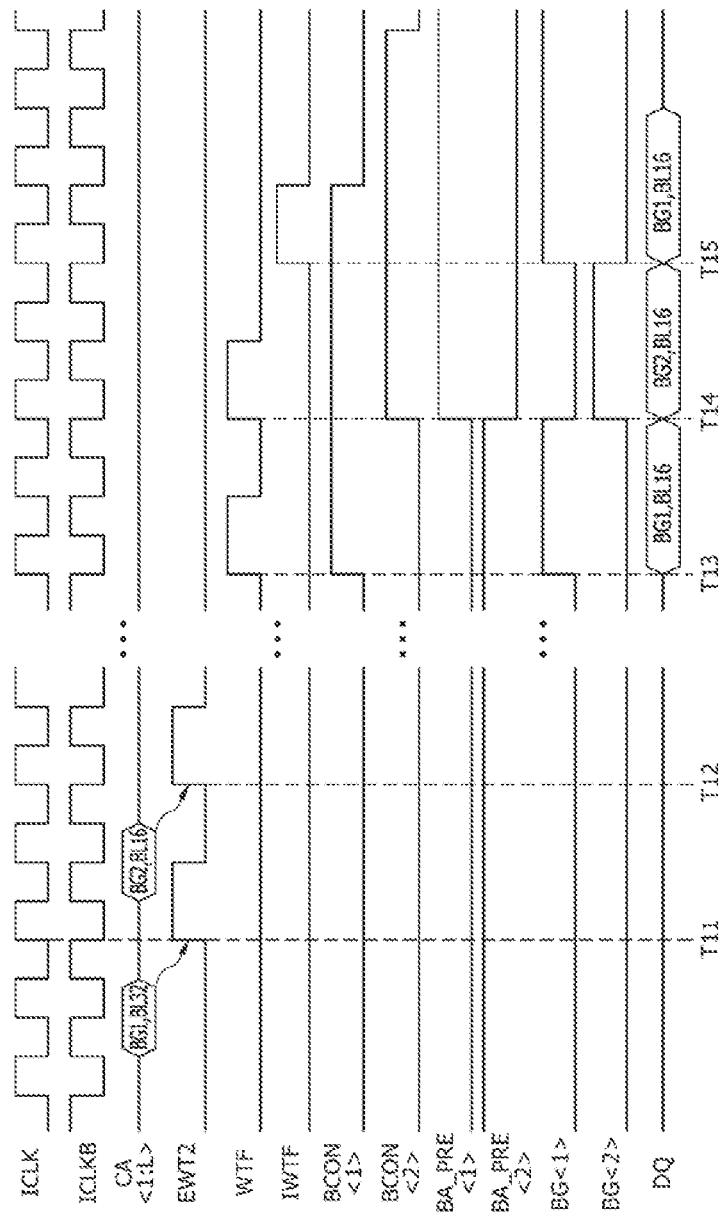

A write operation of the semiconductor device 300 in accordance with the embodiment of the present disclosure will be described below with reference to FIG. 48, by taking an example in which, in the bank group mode, a column operation BG1,BL32 of a second burst length on a first bank group is performed and a column operation BG2,BL16 of a first burst length on a second bank group is performed.

At a time point T11, the read write control circuit 10-1 generates a first pulse of the second write command pulse EWT2 in order to perform a write operation, by decoding the first to L^th external control signals CA<1:L> in synchronization with the internal clock ICLK or the inverted internal clock ICLKB. The first to L^th external control signals CA<1:L> have a logic level combination for performing a column operation of a second burst length BL32 on a first bank group BG1 in the bank group mode.

The address generation circuit 20-1 generates the first to fourth bank addresses IBA<1:4> by decoding the first to L^th external control signals CA<1:L> in synchronization with the internal clock ICLK or the inverted internal clock ICLKB.

The input control pulse generation circuit 40-1 generates the first write input control pulse WT_PINP<1> in response to the first pulse of the second write command pulse EWT2.

The bank group selection signal generation circuit 70-1 stores the first to fourth bank addresses IBA<1:4> in response to the first write input control pulse WT_PINP<1>.

At a time point T12, the read write control circuit 10-1 generates a second pulse of the second write command pulse EWT2 in order to perform a write operation, by decoding the first to L^th external control signals CA<1:L> in synchronization with the internal clock ICLK or the inverted internal clock ICLKB. The first to L^th external control signals CA<1:L> have a logic level combination for performing a column operation of a first burst length BL16 on a second bank group BG2 in the bank group mode.

The address generation circuit 20-1 generates the first to fourth bank addresses IBA<1:4> by decoding the first to L^th external control signals CA<1:L> in synchronization with the internal clock ICLK or the inverted internal clock ICLKB.

The input control pulse generation circuit 40-1 generates the second write input control pulse WT_PINP<2> in response to the second pulse of the second write command pulse EWT2.

The bank group selection signal generation circuit 70-1 stores the first to fourth bank addresses IBA<1:4> in response to the second write input control pulse WT_PINP<2>.

At a time point T13, the flag generation circuit 50-1 generates a first pulse of the write flag WTF based on the first pulse of the second write command pulse EWT2, the bank mode signal BKM and the bank group mode signal BGM.

The output control pulse generation circuit 60-1 generates the first write output control pulse WT_POUTP<1> in response to the first pulse of the write flag WTF.

The operation control signal generation circuit 721-1 of the address control circuit 720-1 generates the first operation control signal BCON<1> which is enabled to a logic high level by the bank group mode signal BGM and the first pulse of the write flag WTF.

The address output circuit 722-1 of the address control circuit 720-1 generates the first bank group selection signal BG<1> having a logic high level and the second bank group selection signal BG<2> having a logic low level from the first and second pre-bank group selection signals BA_PRE<1:2> according to the write flag WTF having a logic high level. The first and second pre-bank group selection signals BA_PRE<1:2> are generated from the first and second bank addresses IBA<1:2> generated at the time point T11. The first pre-bank group selection signal BA_PRE<1> is generated at a logic low level, and the second pre-bank group selection signal BA_PRE<2> is generated at a logic high level.

The bank group address generation circuit 80-1 generates the first and second bank group addresses ADD_BG<1:2> in response to the first and second bank group selection signals BG<1:2>.

The first bank group 9314 included in the core circuit 904 performs a column operation of the first burst length BL16 in response to the first bank group address ADD_BG<1>.

At a time point T14, the flag generation circuit 50-1 generates a second pulse of the write flag WTF based on the first pulse of the second write command pulse EWT2, the bank mode signal BKM and the bank group mode signal BGM.

The output control pulse generation circuit 60-1 generates the second write output control pulse WT_POUTP<2> in response to the second pulse of the write flag WTF.

The operation control signal generation circuit 721-1 of the address control circuit 720-1 generates the first operation control signal BCON<1> which is enabled to a logic high level by the bank group mode signal BGM and the second pulse of the write flag WTF. The operation control signal generation circuit 721-1 of the address control circuit 720-1 generates the second operation control signal BCON<2> having a logic high level by the first operation control signal BCON<1> generated at the time point T13.

The address output circuit 722-1 of the address control circuit 720-1 generates the first bank group selection signal BG<1> having a logic low level and the second bank group selection signal BG<2> having a logic high level from the first and second pre-bank group selection signals BA_PRE<1:2> according to the write flag WTF having a logic high level. The first and second pre-bank group selection signals BA_PRE<1:2> are generated from the first and second bank addresses IBA<1:2> generated at the time point T12. The first pre-bank group selection signal BA_PRE<1> is generated at a logic high level, and the second pre-bank group selection signal BA_PRE<2> is generated at a logic low level.

The bank group address generation circuit 80-1 generates the first and second bank group addresses ADD_BG<1:2> in response to the first and second bank group selection signals BG<1:2>.

The second bank group 932-1 included in the core circuit 90-1 performs a column operation of the first burst length BL16 in response to the second bank group address ADD_BG<2>.

At a time point T15, the flag generation circuit 50-1 generates a first pulse of the internal write flag IWTF by shifting the write flag WTF generated at the time point T13.

The address output circuit 722-1 of the address control circuit 720-1 generates the first bank group selection signal BG<1> having a logic high level and the second bank group selection signal BG<2> having a logic low level from the first and second pre-bank group selection signals BA_PRE<1:2>, input at the time point T13, according to the internal rite flag IWTF having a logic high level.

The bank group address generation circuit 80-1 generates the first and second internal bank group addresses IADD_BG<1:2> in response to the first and second bank group selection signals BG<1:2>.

The first bank group 931-1 included in the core circuit 90-1 performs a column operation of the remaining first burst length BL16 in response to the first internal bank group address IADD_BG<1>. That is to say, by performing the column operation of the first burst length BL16 of the time point T13 and the column operation of the first burst length BL16 of the time point T15, the first bank group 931-1 performs a column operation of the second burst length BL32.

Figure 49:
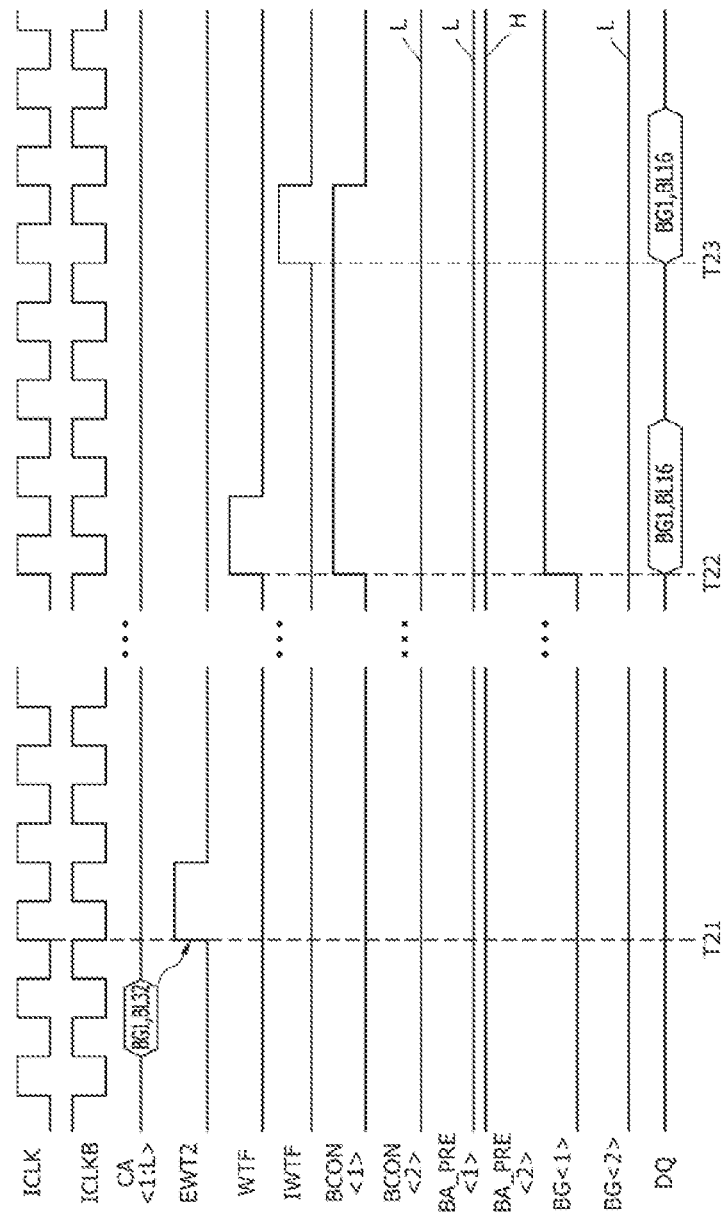

A write operation of the semiconductor device 300 in accordance with the embodiment of the present disclosure will be described below with reference to FIG. 49, by taking an example in which, in the bank group mode, a column operation BG1,BL32 of a second burst length on a first bank group is performed.

At a time point T21, the read write control circuit 10-1 generates a first pulse of the second write command pulse EWT2 in order to perform a write operation, by decoding the first to L^th external control signals CA<1:L> in synchronization with the internal clock ICLK or the inverted internal clock ICLKB. The first to L^th external control signals CA<1:L> have a logic level combination for performing a column operation of a second burst length BL32 on a first bank group BG1 in the bank group mode.

The address generation circuit 20-1 generates the first to fourth bank addresses IBA<1:4> by decoding the first to L^th external control signals CA<1:L> in synchronization with the internal clock ICLK or the inverted internal clock ICLKB.

The input control pulse generation circuit 40-1 generates the first write input control pulse WT_PINP<1> in response to the first pulse of the second write command pulse EWT2.

The bank group selection signal generation circuit 70-1 stores the first to fourth bank addresses IBA<1:4> in response to the first write input control pulse WT_PINP<1>.

At a time point T22, the flag generation circuit 50-1 generates a first pulse of the write flag WTF based on the first pulse of the second write command pulse EWT2, the bank mode signal BKM and the bank group mode signal BCM.

The output control pulse generation circuit 60-1 generates the first write output control pulse WT_POUTP<1> in response to the first pulse of the write flag WTF.

The operation control signal generation circuit 721-1 of the address control circuit 720-1 generates the first operation control signal BCON<1> which is enabled to a logic high level by the bank group mode signal BGM and the first pulse of the write flag WTF.

The address output circuit 722-1 of the address control circuit 720-1 generates the first bank group selection signal BG<1> having a logic high level and the second bank group selection signal BG<2> having a logic low level from the first and second pre-bank group selection signals BA_PRE<1:2> according to the write flag WTF having a logic high level. The first and second pre-bank group selection signals BA_PRE<1:2> are generated from the first and second bank addresses IBA<1:2> generated at the time point T21. The first pre-bank group selection signal BA PRE<1> is generated at a logic low level, and the second pre-bank group selection signal BA_PRE<2> is generated at a logic high level.

The bank group address generation circuit 80-1 generates the first and second bank group addresses ADD_BG<1:2> in response to the first and second bank group selection signals BG<1:2>.

The first bank group 931-1 included in the core circuit 90-1 performs a column operation of a first burst length BL16 in response to the first bank group address ADD_BG<1>.

At a time point T23, the flag generation circuit 50-1 generates a first pulse of the internal write flag IWTF by shifting the write flag WTF generated at the time point T22.

The address output circuit 722-1 of the address control circuit 720-1 generates the first bank group selection signal BG<1> having a logic high level and the second bank group selection signal BG<2> having a logic low level from the first and second pre-bank group selection signals BA_PRE<1:2>, input at the time point T22, according to the internal write flag IWTF having a logic high level.

The bank group address generation circuit 80-1 generates the first and second internal bank group addresses IADD_BG<1:2> in response to the first and second bank group selection signals BG<1:2>.

The first bank group 931-1 included in the core circuit 90-1 performs a column operation of the remaining first burst length BL16 in response to the first internal bank group address IADD_BG<1>. That is to say, by performing the column operation of the first burst length BL16 of the time point T22 and the column operation of the first burst length BL16 of the time point T23, the first bank group 931-1 performs a column operation of the second burst length BL32.

As is apparent from the above description, the semiconductor device 300 in accordance with an embodiment of the present disclosure may store, in one pipe circuit, an address for performing a column operation in a bank group mode, and sequentially generate bank group addresses for performing the bank group mode, from the address stored in the one pipe circuit. As a consequence, it may be possible to reduce the number of pipe circuits for storing addresses. By storing, in one pipe circuit, an address for performing a column operation in a bank group mode, it may be possible to reduce the area of the semiconductor device 300.

Figure 50:
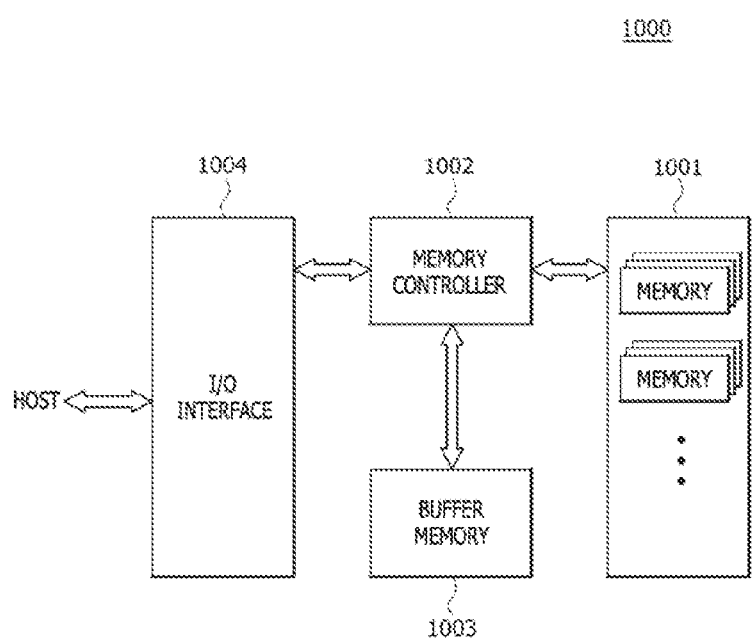
FIG. 50 is a diagram illustrating a configuration of an electronic system in accordance with an embodiment of the present disclosure, to which the semiconductor device illustrated in FIG. 1, 16, or 36 is applied.

At least one of the semiconductor devices described with reference to FIGS. 1 to 49 may be applied to an electronic system that include a memory system, a graphic system, a computing system, a mobile system, or the like. For example, as illustrated in FIG. 50, an electronic system 1000 according an embodiment may include a data storage circuit 1001, a memory controller 1002, a buffer memory 1003, and an input/output (I/O) interface 1004.

The data storage circuit 1001 may store data which are output from the memory controller 1002 or may read and output the stored data to the memory controller 1002, according to a control signal output from the memory controller 1002. The data storage circuit 1001 may include at least one of the semiconductor devices illustrated in FIGS. 1, 16 and 36. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command output from an external device (e.g., a host device) through the I/O interface 1004 and may decode the command output from the host device to control an operation for inputting data into the data storage circuit 1001 or the buffer memory 1003 or for outputting the data stored in the data storage circuit 1001 or the buffer memory 1003. Although FIG. 50 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data which are processed by the memory controller 1002. That is, the buffer memory 1003 may temporarily store the data which are output from or to be input to the data storage circuit 1001. The buffer memory 1003 may store the data, which are output from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data output from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (DATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a read write control circuit configured to generate first and second write command pulses from an external control signal for performing a write operation;
a flag generation circuit configured to generate a write flag, a write shifting flag, an internal write flag and an internal write shifting flag based on the second write command pulse, a bank mode signal and a bank group mode signal; and
a bank group selection signal generation circuit configured to store a bank address based on a write input control pulse generated from the second write command pulse in a bank mode, and output the stored bank address as a bank group selection signal based on a write output control pulse generated from the write flag.

2. The semiconductor device according to claim 1, wherein
the bank mode signal is a signal for performing the bank mode in which column operations on two banks included in different bank groups are sequentially performed, and
the bank group mode signal is a signal for performing a bank group mode in which a column operation on one bank included in a bank group is performed.

3. The semiconductor device according to claim 1, wherein the flag generation circuit comprises:
a first shifting circuit configured to generate the write flag by shifting the second write command pulse in synchronization with an internal clock signal;
a second shifting circuit configured to generate a first shifting signal by shifting the write flag in synchronization with the internal clock signal;
a first buffer circuit configured to generate the write shifting flag from the first shifting signal based on the bank mode signal;
a third shifting circuit configured to generate a second shifting signal by shifting the first shifting signal in synchronization with the internal clock signal and then generate a third shifting signal;
a second buffer circuit configured to generate the internal write flag from the second shifting signal based on the bank group mode signal; and
a third buffer circuit configured to generate the internal write shifting flag from the third shifting signal based on the bank group mode signal.

4. The semiconductor device according to claim 1, wherein the bank group selection signal generation circuit stores the bank address based on the write input control pulse in the bank group mode, and outputs the stored bank address as the bank group selection signal based on the write flag, the internal write flag and the write output control pulse.

5. The semiconductor device according to claim 4, wherein the bank group selection signal generation circuit comprises:
an address pipe circuit configured to store the bank address based on the write input control pulse, and generate a pre-bank group selection signal from the stored bank address based on the write output control pulse; and
an address control circuit configured to generate the bank group selection signal from the pre-bank group selection signal depending on logic levels of the bank group mode signal, the write flag and the internal write flag.

6. The semiconductor device according to claim 5, wherein the address control circuit comprises:
an operation control signal generation circuit configured to generate a first operation control signal and a second operation control signal depending on logic levels of the bank group mode signal, the write flag and the internal write flag in the bank group mode; and
an address output circuit configured to generate the bank group selection signal from the pre-bank group selection signal depending on logic levels of the first operation control signal, the second operation control signal, the write flag and the internal write flag.

7. The semiconductor device according to claim 6, wherein the operation control signal generation circuit comprises:
a first logic circuit configured to generate a write pulse which is enabled based on the bank group mode signal and the write flag, and generate the first operation control signal which is enabled based on the bank group mode signal and the write flag and is disabled based on the internal write flag; and
a second logic circuit configured to generate the second operation control signal which is enabled based on the write pulse, the bank group mode signal and the first operation control signal and is disabled based on the internal write flag after the first operation control signal is input.

8. The semiconductor device according to claim 7, wherein the first logic circuit comprises:
a write pulse generation circuit configured to generate the write pulse from the write flag during a period in which the bank group mode signal is enabled; and
a first operation control signal generation circuit configured to generate the first operation control signal which is enabled based on the write pulse and is disabled based on the internal write flag.

9. The semiconductor device according to claim 7, wherein the second logic circuit comprises:
a delay signal generation circuit configured to generate a delay signal by delaying the first operation control signal during a period in which the bank group mode signal is enabled; and
a second operation control signal generation circuit configured to generate the second operation control signal which is enabled based on the delay signal in synchronization with the write pulse and is disabled after the first operation control signal and the internal write flag are input.

10. The semiconductor device according to claim 1, further comprising:
a column control pulse generation circuit configured to generate a write column control pulse and an internal write column control pulse which are sequentially enabled based on the first write command pulse; and
a bank group address generation circuit configured to generate a bank group address and an internal bank group address for performing a column operation, from the bank group selection signal based on the write column control pulse and the internal write column control pulse, and generate the bank group address and the internal bank group address for performing a column operation from the bank group selection signal based on the write shifting flag and the internal write shifting flag.

11. A semiconductor device comprising:
a column control pulse generation circuit configured to generate a write column control pulse and an internal write column control pulse which are sequentially enabled based on a first write command pulse;
a bank group selection signal generation circuit configured to store a bank address based on a write input control pulse generated from a second write command pulse, and output the stored bank address as a bank group selection signal based on a write output control pulse generated from the second write command pulse, a write flag and an internal write flag; and
a bank group address generation circuit configured to generate a bank group address and an internal bank group address for performing a column operation on a cell array included in a bank group selected based on the bank group selection signal.

12. The semiconductor device according to claim 11, wherein the first write command pulse and the second write command pulse are signals which are generated from an external control signal input from an outside to perform a write operation.

13. The semiconductor device according to claim 11, wherein
the first write command pulse is a signal which is enabled to perform a first burst length operation and a second burst length operation, and
the second write command pulse is a signal which is enabled to perform the second burst length operation.

14. The semiconductor device according to claim 11, wherein the bank group selection signal generation circuit comprises:
an address pipe circuit configured to store the bank address based on the write input control pulse, and generate a pre-bank group selection signal from the stored bank address based on the write output control pulse; and
an address control circuit configured to generate the bank group selection signal from the pre-bank group selection signal depending on logic levels of a bank group mode signal, the write flag and the internal write flag.

15. The semiconductor device according to claim 14, wherein the address control circuit comprises:
an operation control signal generation circuit configured to generate a first operation control signal and a second operation control signal depending on logic levels of the bank group mode signal, the write flag and the internal write flag in a bank group mode; and
an address output circuit configured to generate the bank group selection signal from the pre-bank group selection signal depending on logic levels of the first operation control signal, the second operation control signal, the write flag and the internal write flag.

16. The semiconductor device according to claim 15, wherein the operation control signal generation circuit comprises:
    a first logic circuit configured to generate a write pulse which is enabled based on the bank group mode signal and the write flag, and generate the first operation control signal which is enabled based on the bank group mode signal and the write flag and is disabled based on the internal write flag; and
    a second logic circuit configured to generate the second operation control signal which is enabled based on the write pulse, the bank group mode signal and the first operation control signal and is disabled based on the internal write flag after the first operation control signal is input.

17. The semiconductor device according to claim 16, wherein the first logic circuit comprises:
    a write pulse generation circuit configured to generate the write pulse from the write flag during a period in which the bank group mode signal is enabled; and
    a first operation control signal generation circuit configured to generate the first operation control signal which is enabled based on the write pulse and is disabled based on the internal write flag.

18. The semiconductor device according to claim 16, wherein the second logic circuit comprises:
    a delay signal generation circuit configured to generate a delay signal by delaying the first operation control signal during a period in which the bank group mode signal is enabled; and
    a second operation control signal generation circuit configured to generate the second operation control signal which is enabled based on the delay signal in synchronization with the write pulse and is disabled after the first operation control signal and the internal write flag are input.

19. The semiconductor device according to claim 11, further comprising:
    an input control pulse generation circuit configured to generate, based on the second write command pulse, the write input control pulse which is enabled to control an operation in which the bank address is input;
    a flag generation circuit configured to generate the write flag, a write shifting flag, the internal write flag and an internal write shifting flag based on the second write command pulse, a bank mode signal and the bank group mode signal; and
    an output control pulse generation circuit configured to generate the write output control pulse which is enabled based on the write flag.

20. The semiconductor device according to claim 19, wherein the flag generation circuit comprises:
    a first shifting circuit configured to generate the write flag by shifting the second write command pulse in synchronization with an internal clock signal;
    a second shifting circuit configured to generate a first shifting signal by shifting the write flag in synchronization with the internal clock signal;
    a first buffer circuit configured to generate the write shifting flag from the first shifting signal based on the bank mode signal;
    a third shifting circuit configured to generate a second shifting signal by shifting the first shifting signal in synchronization with the internal clock signal and then generate a third shifting signal;
    a second buffer circuit configured to generate the internal write flag from the second shifting signal based on the bank group mode signal; and
    a third buffer circuit configured to generate the internal write shifting flag from the third shifting signal based on the bank group mode signal.

* * * * *